(12) United States Patent
Nakashima et al.

(10) Patent No.: US 7,892,657 B2
(45) Date of Patent: Feb. 22, 2011

(54) LIGHT EMITTING ELEMENT, LIGHT EMITTING DEVICE, AND ELECTRONIC DEVICE

(75) Inventors: Harue Nakashima, Atsugi (JP); Ryoji Nomura, Yamato (JP); Hiroko Abe, Setagaya (JP); Satoshi Seo, Kawasaki (JP); Junichiro Sakata, Atsugi (JP); Daisuke Kumaki, Tokamachi (JP); Hisao Ikeda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1227 days.

(21) Appl. No.: 10/588,993

(22) PCT Filed: Nov. 28, 2005

(86) PCT No.: PCT/JP2005/022226
§ 371 (c)(1), (2), (4) Date: Aug. 10, 2006

(87) PCT Pub. No.: WO2006/059736
PCT Pub. Date: Jun. 8, 2006

(65) Prior Publication Data
US 2007/0172699 A1 Jul. 26, 2007

(30) Foreign Application Priority Data
Nov. 30, 2004 (JP) .............................. 2004-347903

(51) Int. Cl.
*H01J 1/62* (2006.01)
*C09K 11/06* (2006.01)
(52) U.S. Cl. ..................... 428/690; 313/504; 313/506; 428/917
(58) Field of Classification Search ................. 313/504, 313/506; 428/690, 917
See application file for complete search history.

(56) References Cited

U.S. PATENT DOCUMENTS 6,172,459 B1    1/2001    Hung et al.

(Continued)

FOREIGN PATENT DOCUMENTS

EP    0 948 063    10/1999

(Continued)

OTHER PUBLICATIONS

Zhang et al, "Carbazole-based hole-transporting materials for electroluminescent devices," Synthetic Metals, vol. 137, pp. 1111-1112, Jan. 1, 2003.

(Continued)

*Primary Examiner*—David Wu
*Assistant Examiner*—Vu A Nguyen
(74) *Attorney, Agent, or Firm*—Eric J. Robinson; Robinson Intellectual Property Law Office, P.C.

(57) ABSTRACT

An object of the present invention is to provide a light emitting element which has low driving voltage and can increase lifetime longer than a conventional light emitting element. One feature is to include a plurality of layers which includes a layer containing a light emitting substance between first and second electrodes, in which at least one layer of the plurality of layers contains a carbazole derivative represented by General Formula (1) and a substance having an electron accepting property with respect to the carbazole derivative represented by General Formula (1). By employing this structure, the above object can be achieved.

11 Claims, 30 Drawing Sheets

U.S. PATENT DOCUMENTS

| | | |
|---|---|---|
| 6,423,429 B2 | 7/2002 | Kido et al. |
| 7,158,161 B2 | 1/2007 | Gyoutoku et al. |
| 2002/0037427 A1 | 3/2002 | Taguchi |
| 2003/0189401 A1 | 10/2003 | Kido et al. |
| 2005/0084712 A1* | 4/2005 | Kido et al. ............. 428/690 |
| 2005/0098207 A1 | 5/2005 | Matsumoto et al. |
| 2005/0116633 A1* | 6/2005 | Yamazaki et al. ......... 313/506 |
| 2005/0170208 A1 | 8/2005 | Yatsunami et al. |
| 2007/0182317 A1 | 8/2007 | Kido et al. |

FOREIGN PATENT DOCUMENTS

| | | |
|---|---|---|
| EP | 1 351 558 | 10/2003 |
| JP | 09-063771 | 3/1997 |
| JP | 11-251067 | 9/1999 |
| JP | 11-307259 | 11/1999 |
| JP | 2001-279237 | 10/2001 |
| JP | 2002-047271 | 2/2002 |
| JP | 2002-124389 | 4/2002 |
| JP | 2003-272860 | 9/2003 |
| JP | 2004-018787 | 1/2004 |
| JP | 2005-154421 | 6/2005 |
| WO | WO 01/15244 | 3/2001 |
| WO | WO 2005/040117 | 5/2005 |

OTHER PUBLICATIONS

Imes et al, "Multi Photon Emission Organic EL Devices using Charge Transfer Complex as Charge Generation Layer," Proceedings of Lecture Meeting of Applied Physics-Related Association, The 63$^{rd}$ Autumn Meeting, vol. 27a-ZL-12, pp. 1165, Sep. 24, 2002.

Grigalevicius, "3,6(2,7),9-Substituted carbazoles as electroactive amorphous materials for optoelectronics," Synthetic Metals, vol. 156, pp. 1-12, 2006.

International Search Report No. PCT/JP2005/022226 dated Jan. 17, 2006.

Written Opinion of the International Searching Authority No. PCT/JP2005/022226 dated Jan. 17, 2006.

Nakada et al, "27a-ZL-12 Multi Photon Emission Organic EL Devices Using Charge Transfer Complex as Charge Generation Layer," The 63$^{rd}$ Applied Physics-Related Combined Seminar Seminar Proceedings, Autumn Meeting, Sep. 24, 2002, p. 1165.

* cited by examiner

LIGHT EMITTING ELEMENT, LIGHT EMITTING DEVICE, AND ELECTRONIC DEVICE

TECHNICAL FIELD

The present invention relates to a light emitting element having a structure in which a plurality of layers is interposed between a pair of electrodes, and especially relates to a structure of a layer which can be used as at least one layer of the plurality of layers.

BACKGROUND ART

A light emitting device utilizing light emission from an electroluminescent element (light emitting element) attracts attention as a device for displaying or lighting.

As the light emitting element used in the light emitting device, a light emitting element having a structure in which a layer containing a luminescent compound is interposed between a pair of electrodes is well known.

In such a light emitting element, one electrode functions as an anode, and the other electrode functions as a cathode. Holes injected from the anode side and electrons injected from the cathode side recombine to form excited state molecules, and when the molecules return to a ground state, they emit light.

By the way, the reduction of power consumption is highly required especially in a display device incorporated in various information-processing devices which has been rapidly developed these days. In order to achieve the requirement, the reduction of driving voltage of the light emitting element is being attempted. In consideration of commercialization, the increase of the lifetime of the light emitting element is important as well as the reduction of the driving voltage, and in order to achieve this, the light emitting element is being developed.

For example, in Reference 1 (Japanese Patent Laid-Open No. H9-63771), a technique of reducing driving voltage of a light emitting element by using metal oxide having a high work function such as molybdenum oxide as an anode is disclosed. Further, with the technique disclosed in Reference 1, an effect of increasing lifetime can be obtained.

However, since molybdenum oxide is easy to be crystallized, the number of malfunctions of the light emitting element due to the crystallization cannot be reduced sufficiently. In other words, since molybdenum oxide is crystallized to form a projection portion and loses flatness, a short circuit easily occurs and there is a problem of easily causing malfunctions of the light emitting element.

DISCLOSURE OF INVENTION

It is an object of the present invention to provide a light emitting element which can reduce malfunctions due to oxidation or crystallization of a compound. Further, it is an object of the present invention to provide a light emitting element which has a low driving voltage and which can increase lifetime longer than a conventional light emitting element.

One feature of the light emitting element of the present invention is to include a plurality of layers which includes a layer containing a light emitting substance between first and second electrodes, in which at least one layer of the above plurality of layers contains a compound having a carbazole skeleton represented by following General Formula (1) (carbazole derivative) and a substance having an electron accepting property with respect to the carbazole derivative represented by following General Formula (1).

[Chemical Formula 1]

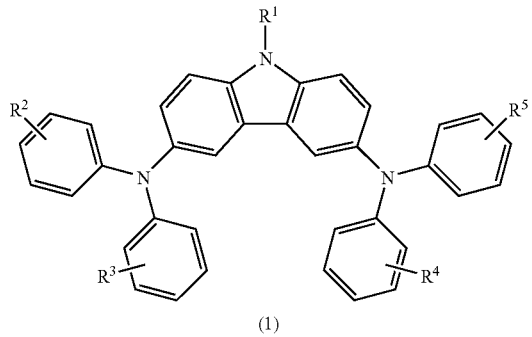

(1)

(in the formula, $R^1$ refers to hydrogen, halogen, a cyano group, an alkyl group having a carbon number of 1 to 20, a haloalkyl group having a carbon number of 1 to 20, an alkoxyl group having a carbon number of 1 to 20, a substituted or unsubstituted aryl group, or a substituted or unsubstituted heterocycle residue, and $R^2$ to $R^5$ may be the same or different material and refer to hydrogen, halogen, a cyano group, an alkyl group having a carbon number of 1 to 20, an alkoxyl group having a carbon number of 1 to 20, an acyl group having a carbon number of 1 to 20, a haloalkyl group having a carbon number of 1 to 20, a dialkylamino group having a carbon number of 1 to 20, a diarylamino group having a carbon number of 1 to 20, a substituted or unsubstituted heterocycle residue, or a carbazolyl group.)

By employing the above structure, that is the coexistence of the carbazole derivative represented by General Formula (1) and the substance having an electron accepting property with respect to the carbazole derivative represented by General Formula (1) in one layer, electrons in the carbazole derivative represented by General Formula (1) are caught by the substance having an electron accepting property with respect to the carbazole derivative represented by General Formula (1). In other words, the carbazole derivative represented by General Formula (1) is oxidized and generates holes.

Therefore, "the layer containing the carbazole derivative represented by General Formula (1) and the substance having an electron accepting property with respect to the carbazole derivative represented by General Formula (1)" has a function of generating holes.

One feature of the light emitting element of the present invention is to include a plurality of layers between first and second electrodes, in which the plurality of layers includes a layer containing a light emitting substance and at least one layer having a function of generating holes, and the layer having a function of generating holes contains the carbazole derivative represented by General Formula (1) and the substance having an electron accepting property with respect to the carbazole derivative represented by General Formula (1).

Since holes can be generated in "the layer containing the carbazole derivative represented by General Formula (1) and the substance having an electron accepting property with respect to the carbazole derivative represented by General Formula (1)" by providing "the layer containing the carbazole derivative represented by General Formula (1) and the substance having an electron accepting property with respect to the carbazole derivative represented by General Formula (1)", either a conductive film having a high work function or a conductive film having a low work function can be used as a material contained in the first or second electrode.

In other words, in a conventional light emitting element, the conductive film having a high work function was used as an anode in order to inject holes into a layer containing a light emitting substance from the anode. However, in the present invention, since there exists the layer having a function of generating holes, the conductive film having a high work function does not need to be used as the anode.

Since "the layer containing the carbazole derivative represented by General Formula (1) and the substance having an electron accepting property with respect to the carbazole derivative represented by General Formula (1)" has a function of generating holes, carrier density is increased. Since conductivity- is improved as the result, there are few changes in driving voltage depending on a thickness of "the layer containing the carbazole derivative represented by General Formula (1) and the substance having an electron accepting property with respect to the carbazole derivative represented by General Formula (1)". Therefore, by changing the thickness of "the layer containing the carbazole derivative represented by General Formula (1) and the substance having an electron accepting property with respect to the carbazole derivative represented by General Formula (1)", a distance between the layer containing a light emitting substance and the first or second electrode can be easily adjusted.

In other words, a length of light path through which emitted light passes (light path length) can be easily adjusted in order to be a length capable of efficiently extracting light outward or improving color purity of light extracted outward. In addition, by thickening "the layer containing the carbazole derivative represented by General Formula (1) and the substance having an electron accepting property with respect to the carbazole derivative represented by General Formula (1)", an asperity on a surface of the first electrode can be reduced, and a short circuit between the electrodes can be easily prevented.

Further, since "the layer containing the carbazole derivative represented by General Formula (1) and the substance having an electron accepting property with respect to the carbazole derivative represented by General Formula (1)" has a favorable conductivity, it has a fine function of transporting holes as well.

Therefore, one feature of the light emitting element of the present invention is to include a plurality of layers between first and second electrodes, in which the plurality of layers includes a layer containing a light emitting substance and at least one layer having a function of transporting holes, and the layer having a function of transporting holes contains the carbazole derivative represented by General Formula (1) and the substance having an electron accepting property with respect to the carbazole derivative represented by General Formula (1).

In addition, one feature of the light emitting element of the present invention in the above plurality of structures is to have the layer containing the carbazole derivative represented by General Formula (1) and the substance having an electron accepting property with respect to the carbazole derivative represented by General Formula (1) between the layer containing a light emitting substance and the first electrode, and to have an element structure in which light emission is performed when voltage is applied so that potential of the first electrode is higher than that of the second electrode.

In addition, one feature of the light emitting element of the present invention in the above plurality of structures is to have the layer containing the carbazole derivative represented by General Formula (1) and the substance having an electron accepting property with respect to the carbazole derivative represented by General Formula (1) between the layer containing a light emitting substance and the second electrode, and to have an element structure in which light emission is performed when voltage is applied so that potential of the first electrode is higher than that of the second electrode.

In addition, one feature of the light emitting element of the present invention in the above plurality of structures is to have the layer containing the carbazole derivative represented by General Formula (1) and the substance having an electron accepting property with respect to the carbazole derivative represented by General Formula (1) between the layer containing a light emitting substance and the first electrode and between the layer containing a light emitting substance and the second electrode, and to have an element structure in which light emission is performed when voltage is applied so that potential of the first electrode is higher than that of the second electrode.

As the substance having an electron accepting property with respect to the carbazole derivative represented by General Formula (1), metal oxide can be given.

It is preferable that oxide of any transition metal of Group 4 to Group 12 in the periodic table among the metal oxide is used as the substance having an electron accepting property with respect to the carbazole derivative represented by above General Formula (1).

The carbazole derivative represented by above General Formula (1) has two triphenylamine skeletons. And it is known that oxide of any transition metal of Group 4 to Group 8 in the periodic table, such as molybdenum oxide ($MoO_x$), vanadium oxide ($VO_x$), ruthenium oxide ($RuO_x$), tungsten oxide ($WO_x$), rhenium oxide ($ReO_x$), titanium oxide ($TiO_x$), chromium oxide ($CrO_x$), zirconium oxide ($ZrO_x$), hafnium oxide ($HfO_x$), or tantalum oxide ($TaO_x$), especially has an electron accepting property with respect to this triphenylamine skeleton.

As the substance having an electron accepting property with respect to the carbazole derivative represented by above General Formula (1), it is preferable to use oxide of a transition metal of Group 4 to Group 8 in the periodic table, for example, such as molybdenum oxide ($MoO_x$), vanadium oxide ($VO_x$), ruthenium oxide ($RuO_x$), tungsten oxide ($WO_x$), rhenium oxide ($ReO_x$), titanium oxide ($TiO_x$), chromium oxide ($CrO_x$), zirconium oxide ($ZrO_x$), hafnium oxide ($HfO_x$), or tantalum oxide ($TaO_x$).

As the substance having an electron accepting property with respect to the carbazole derivative represented by General Formula (1), for example, 7,7,8,8-tetracyano-2,3,5,6-tetrafluoroquinodimethane (F4-TCNQ), chloranil, or the like, which is an organic compound, or $FeCl_3$ (iron (III) chloride), $AlCl_3$ (aluminum chloride), or the like, which is an inorganic compound, can be given in addition to the metal oxide.

In "the layer containing the carbazole derivative represented by General Formula (1) and the substance having an electron accepting property with respect to the carbazole derivative represented by General Formula (1)", a suitable molar ratio of the substance having an electron accepting property to the carbazole derivative (=the substance having an electron accepting property/the carbazole derivative) is 0.1 to 10, more preferably 0.5 to 2.

The above plurality of layers is formed by combining a layer containing a substance having a high carrier injecting property, a layer containing a substance having a high carrier transporting property, and the like. It is acceptable if the structure of the plurality of layers is a structure in which a light emitting region is formed in the layer containing a light emitting substance, in other words, a structure in which carriers are recombined in the layer containing a light emitting substance. The structure of the plurality of layers can be properly selected depending on the purpose.

The layer containing a light emitting substance may be a single layer or a multilayer. In the case of the multilayer, it is acceptable when at least one layer contains a light emitting substance.

The light emitting element of the present invention may have a structure in which light generated by the recombination of carriers in the layer containing a light emitting substance is emitted outward from only one side of the first or second electrode, or in which the light is emitted outward from both the first and second electrodes.

In the case of emitting light from the first electrode, the first electrode is formed from a translucent material, and in the case of emitting light from the second electrode, the second electrode is formed from a translucent material. In the case of emitting light from both the first and second electrodes, the first and second electrodes are both formed from a translucent material.

In addition, the light emitting element of the present invention is preferably formed over a substrate, and there is no specific limitation of the substrate. The substrate used in a conventional light emitting element, for example, such as a substrate made from glass, quartz, transparent plastic, or the like, can be used.

A light emitting device of the present invention uses any of the light emitting elements described above as a pixel or a light source.

An electronic device of the present invention uses the light emitting device, which uses any of the light emitting elements described above as the pixel, for a display portion.

The electronic device of the present invention uses the light emitting device, which uses any of the light emitting elements described above as the light source, for a display portion.

In the light emitting element of the present invention, by forming at least one layer of the plurality of layers between the first and second electrodes using the layer containing the carbazole derivative represented by General Formula (1) and the substance having an electron accepting property with respect to the carbazole derivative represented by General Formula (1), a problem of causing malfunctions of the light emitting element due to crystallization, which is generated when an anode is made from metal oxide, can be solved and driving voltage can be reduced.

In the light emitting element of the present invention, since electron transfer is performed even before the application of voltage to "the layer containing the carbazole derivative represented by General Formula (1) and the substance having an electron accepting property with respect to the carbazole derivative represented by General Formula (1)", "the layer containing the carbazole derivative represented by General Formula (1) and the substance having an electron accepting property with respect to the carbazole derivative represented by General Formula (1)" becomes a film having an extremely high conductivity. Therefore, it is possible to provide an electroluminescent element with low driving voltage and low power consumption.

Further, there are few cases of increasing driving voltage depending on the thickening of "the layer containing the carbazole derivative represented by General Formula (1) and the substance having an electron accepting property with respect to the carbazole derivative represented by General Formula (1)".

Therefore, "the layer containing the carbazole derivative represented by General Formula (1) and the substance having an electron accepting property with respect to the carbazole derivative represented by General Formula (1)" can be prevented from short circuits because the layer can be thickened without increasing voltage, and optical design can be optimized. Accordingly, a highly reliable electroluminescent element with high light emitting efficiency can be provided.

Further, since "the layer containing the carbazole derivative represented by General Formula (1) and the substance having an electron accepting property with respect to the carbazole derivative represented by General Formula (1)" is difficult to be crystallized, an electroluminescent element with few malfunctions due to the crystallization of the layer can be obtained.

BEST MODE FOR CARRYING OUT THE INVENTION

Hereinafter, modes of the present invention are described. Note that it is easily understood by those skilled in the art that the present invention can be applied to various modes and various changes may be made in forms and details without departing from the spirit and the scope of the invention. Therefore, the invention should not be limited by the following descriptions of the embodiment modes.

Embodiment Mode 1

A mode of a light emitting element of the present invention is described with reference to FIG. 1.

Figure 1:
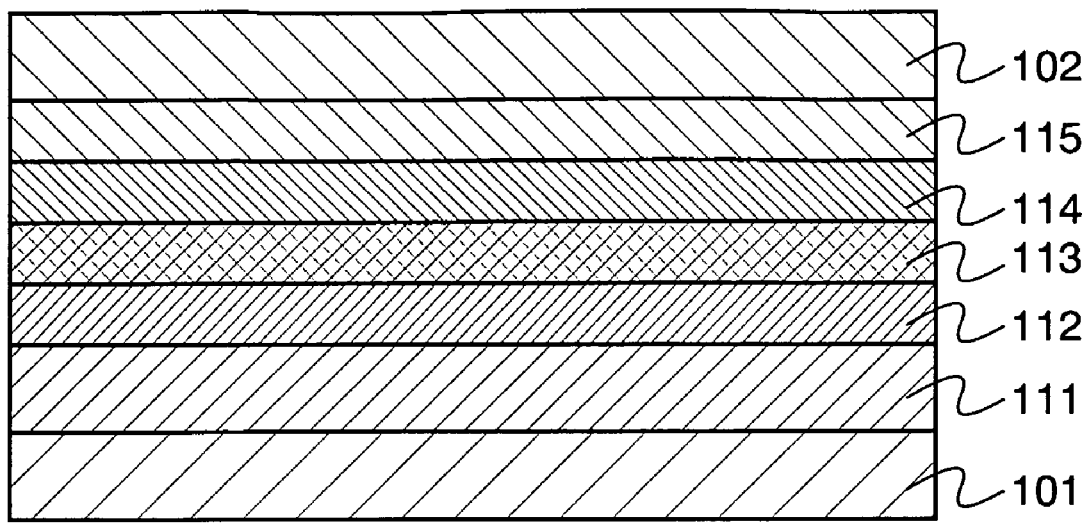
FIG. 1 shows a mode of a light emitting element of the present invention.

FIG. 1 shows the light emitting element in which a first layer 111, a second layer 112, a third layer 113, a fourth layer 114, and a fifth layer 115 are interposed between a first electrode 101 and a second electrode 102.

This first layer is a layer formed to mix the carbazole derivative represented by General Formula (1) with the substance having an electron accepting property with respect to the carbazole derivative represented by General Formula (1). Since this first layer has a function of generating holes, the fist layer is hereinafter called a hole generating layer. The second layer 112 is a hole transporting layer, the third layer 113 is a light emitting layer, and the fourth layer 114 is an electron transporting layer. The fifth layer 115 is a layer having a function of generating electrons, hereinafter called an electron generating layer.

When voltage is applied to the first electrode 101 and the second electrode 102 so that potential of the first electrode 101 is higher than that of the second electrode 102, holes are injected to the light emitting layer 113 from the first electrode 101 side, and electrons are injected to the light emitting layer 113 from the second electrode 102 side. Then, the holes and electrons injected to the light emitting layer 113 are recombined. The light emitting layer 113 contains a light emitting substance, and this light emitting substance is brought into an excited state by excited energy generated through the recombination. The light emitting substance in the excited state emits light when returning to a ground state.

In addition, in the hole generating layer 111, a value of a molar ratio of the substance having an electron accepting property with respect to the carbazole derivative represented by General Formula (1) to the carbazole derivative represented by General Formula (1) is preferably 0.1 to 10, more preferably 0.5 to 2 (=the substance having an electron accepting property/the carbazole derivative).

Metal oxide can be given as the substance having an electron accepting property with respect to the carbazole derivative represented by General Formula (1). In the metal oxide, oxide of a transition metal of Group 4 to Group 12 in the periodic table is preferable, and it is more preferable to use oxide of a transition metal of Group 4 to Group 8 in the periodic table, such as molybdenum oxide ($MoO_x$), vanadium oxide ($VO_x$), ruthenium oxide ($RuO_x$), tungsten oxide ($WO_x$), rhenium oxide ($ReO_x$), titanium oxide ($TiO_x$), chromium oxide ($CrO_x$), zirconium oxide ($ZrO_x$), hafnium oxide ($HfO_x$), or tantalum oxide ($TaO_x$).

Further, as the substance having an electron accepting property with respect to the carbazole derivative represented by General Formula (1), for example, 7,7,8,8-tetracyano-2,3,5,6-tetrafluoroquinodimethane (F4-TCNQ), chloranil, or the like, which is an organic compound, or $FeCl_3$ (iron (III) chloride), $AlCl_3$ (aluminum chloride), or the like, which is an inorganic compound, can be given as well as the metal oxide.

Further, one or more kinds of substances having electron accepting properties with respect to the carbazole derivative represented by General Formula (1) may be used.

By containing the substance having an electron accepting property with respect to the carbazole derivative represented by General Formula (1) and the carbozole derivative represented by General Formula (1) in the hole generating layer 111, crystallization of the hole generating layer 111 can be suppressed and the number of malfunctions of an element due to the crystallization can be reduced.

In the hole generating layer 111 having such a structure, electrons in the carbazole derivative represented by General Formula (1) are caught by the substance having an electron accepting property. In other words, the carbazole derivative represented by General Formula (1) is oxidized and generates holes.

The light emitting layer 113 contains a light emitting substance. The light emitting substance mentioned above indicates a substance exhibiting light emission of a predetermined wavelength with a favorable light emitting efficiency. The light emitting layer 113 may be made from only a light emitting substance. However, in the case that concentration quenching occurs, the light emitting layer is preferably a mixed layer in which light emitting substances are dispersed into a layer formed of a substance having a larger energy gap than that of the light emitting substance. By containing the light emitting substances in the light emitting layer 113 by dispersing, the quenching of light emission due to the concentration can be prevented. Here, the energy gap indicates an energy gap between the LUMO level and the HOMO level.

The light emitting substance is not particularly limited, and any substance may be used as long as it has favorable light emitting efficiency and exhibits light emission of a predetermined wavelength.

In order to obtain red light emission, for example, the following substance exhibiting an emission spectrum with a peak at 600 nm to 680 nm can be employed as the light emitting substance:

4-dicyanomethylene-2-isopropyl-6-[2-(1,1,7,7-tetramethyl-julolidine-9-yl)ethenyl]-4H-pyran (DCJTI);

4-dicyanomethylene-2-methyl-6-[2-(1,1,7,7-tetramethylju-lolidine-9-yl)ethenyl]-4H-pyran (DCJT);

4-dicyanomethylene-2-tert-butyl-6-[2-(1,1,7,7-tetramethyl-julolidine-9-yl)ethenyl]-4H-pyran (DCJT); periflanthene;

2,5-dicyano-1,4-bis[2-(10-methoxy-1,1,7,7-tetramethyljulo-lidine-9-yl)ethenyl]benzene;

or the like.

In order to obtain green light emission, a substance exhibiting an emission spectrum with a peak at 500 nm to 550 nm such as N,N'-dimethylquinacridon (DMQd), coumarin 6, coumarin 545T, or tris(8-quinolinolato)aluminum ($Alq_3$) can be employed as the light emitting substance.

In order to obtain blue light emission, the following substance exhibiting an emission spectrum with a peak at 420 nm to 500 nm can be employed as the light emitting substance: 9,10-di(2-naphthyl)-2-tert-butylanthracene (t-BuDNA); 9,9'-bianthryl; 9,10-diphenylanthracene (DPA); 9,10-bis(2-naphthyl)anthracene (DNA); bis(2-methyl-8-quinolinolato)-4-phenylphenolato-gallium (BGaq); bis(2-methyl-8-quinolinolato)-4-phenylphenolato-aluminum (BAlq); or the like.

In addition to the above substances emitting fluorescence, a substance emitting phosphorescence such as bis[2-(3',5'-bis(trifluoromethyl)phenyl)pyridinato-N,C2']iridium(III)picolinate ($Ir(CF_3ppy)_2(pic)$), bis[2-(4',6'-difluorophenyl)pyridinato-N,C$^{2'}$]iridium(III)acetylacetonate (FIr(acac)), bis[2-(4',6'-difluorophenyl)pyridinato-N,C$^{2'}$]iridium(III) picolinate (FIr(pic)), or tris(2-phenylpyridinato-N,C$^{2'}$) iridium ($Ir(ppy)_3$) can also be used as the light emitting substance.

The substance, which is included in the light emitting layer 113 as well as the light emitting substances and used to make the light emitting substances in a dispersed state, is not particularly limited, and it is properly selected in consideration of energy gap or the like of the substance used as the light emitting substances.

For example, a metal complex such as bis[2-(2-hydroxyphenyl)pyridinato]zinc ($Znpp_2$) or bis[2-(2-hydroxyphenyl)benzoxazolato]zinc (ZnBOX) or the like can be used with the light emitting substance, as well as an anthracene derivative such as 9,10-di(2-naphthyl)-2-tert-butylanthracene (t-BuDNA), a carbazole derivative such as 4,4'-bis(N-carbazolyl)biphenyl (CBP), or a quinoxaline derivative such as 2,3-bis(4-diphenylaminophenyl)quinoxaline (TPAQn) or 2,3-bis{4-[N-(1-naphtyl)-N-phenylamino]phenyl}dibenzo[f,h]quinoxaline (NPADiBzQn).

The hole transporting layer 112 is a layer having a function of transporting holes, and in the light emitting element of this embodiment mode, it has a function of transporting holes from the hole generating layer 111 to the light emitting layer 113. By providing the hole transporting layer 112, a distance between the hole generating layer 111 and the light emitting layer 113 can be increased; therefore, quenching of light emission due to metal included in the hole generating layer 111 can be prevented.

The hole transporting layer is preferably formed by using a substance having a high hole transporting property, and in more detail, is preferably formed by using a substance having a hole mobility with $1 \times 10^{-6}$ cm$^2$/Vs or more. Note that the substance having a high hole transporting property indicates a substance in which holes have higher mobility than that of electrons and a value of a mobility ratio of the holes to the electrons (=hole mobility/electron mobility) is more than 100.

As specific examples of a substance capable of being used to form the hole transporting layer 112, 4,4'-bis[N-(1-naphtyl)-N-phenylamino]biphenyl (NPB), 4,4'-bis[N-(3-methylphenyl)-N-phenylamino]biphenyl (TPD), 4,4',4"-tris(N,N-diphenylamino)triphenylamine (TDATA), 4,4',4"-tris[N-(3-methylphenyl)-N-phenylamino]triphenylamine (MTDATA), 4,4'-bis{N-[4-(N,N-di-m-tolylamino)phenyl]-N-phenylamino}biphenyl (DN TPD), 1,3,5-tris[N,N-di(m-tolyl)amino]benzene (m-MTDAB), 4,4',4"-tris(N-carbazolyl)triphenylamine (TCTA), phthalocyanine ($H_2Pc$), copper phthalocyanine (CuPc), vanadyl phthalocyanine (VOPc), and the like can be given.

The electron transporting layer 114 is a layer having a function of transporting electrons, and in the light emitting element of this embodiment mode, it has a function of transporting electrons from the electron generating layer 115 to the light emitting layer 113. By providing the electron transporting layer 114, a distance between the second electrode 102 and the light emitting layer 113 can be increased; therefore, quenching of light emission due to metal included in the second electrode 102 can be prevented.

The electron transporting layer is preferably formed by using a substance having a high electron transporting property, and in more detail, is preferably formed by using a substance having an electron mobility with $1 \times 10^{-6}$ cm$^2$/Vs or more. Note that the substance having a high electron transporting property indicates a substance in which electrons have higher mobility than that of holes and a value of a mobility ratio of the electrons to the holes (=electron mobility/hole mobility) is more than 100.

As specific examples of the substance capable of being used to form the electron transporting layer 114, 2-(4-biphenylyl)-5-(4-tert-butylphenyl)-1,3,4-oxadiazole (PBD), 1,3-bis[5-(p-tert-butylphenyl)-1,3,4-oxadiazole-2-yl]benzene (OXD-7), 3-(4-tert-butylphenyl)-4-phenyl-5-(4-biphenylyl)-1,2,4-triazole (TAZ), 3-(4-tert-butylphenyl)-4-(4-ethylphenyl)-5-(4-biphenylyl)-1,2,4-triazole (p-EtTAZ), bathophenanthroline (BPhen), bathocuproin (BCP), 4,4-bis(5-methylbenzoxazol-2-yl)stilbene (BzOs), and the like can be given, as well as metal complexes such as tris(8-quinolinolato)aluminum ($Alq_3$), tris(4-methyl-8-quinolinolato)aluminum ($Almq_3$), bis(10-hydroxybenzo[h]quinolinato)beryllium ($BeBq_2$), bis(2-methyl-8-quinolinolato)-4-phenylphenolato-aluminum (BAlq), bis[2-(2-hydroxyphenyl)benzoxazolato]zinc ($Zn(BOX)_2$), and bis[2-(2-hydroxyphenyl)benzothiazolato]zinc ($Zn(BTZ)_2$).

The hole transporting layer 112 and the electron transporting layer 114 may each be formed by using a bipolar substance as well as by using the above mentioned substance. The bipolar substance indicates a substance, when comparing carrier mobilities of electrons and holes to each other, in which a value of a carrier mobility ratio of the electrons to the holes or the holes to the electrons is preferably 100 or less, more preferably 10 or less.

As the bipolar substance, for example, 2,3-bis(4-diphenylaminophenyl)quinoxaline (TPAQn), 2,3-bis{4-[N-(1-naphtyl)-N-phenylamino]phenyl}-dibenzo[f,h]quinoxaline (TPADiBzQn), or the like can be given. Among the bipolar substances, it is especially preferable to use a substance having a hole or electron mobility of $1 \times 10^{-6}$ cm$^2$/Vs or more. In addition, the same bipolar substance can be used to form the hole transporting layer 112 and the electron transporting layer 114.

The electron generating layer 115 is a layer for generating electrons, and can be formed to mix at least one substance, selected from the substance having a high electron transporting property and the bipolar substance, with a substance having a high electron donating property with respect to the substances. Here, among the substance having a high electron transporting property and the bipolar substance, it is especially preferable to use a substance having an electron mobility of $1 \times 10^{-6}$ cm$^2$/Vs or more.

As the substance having a high electron transporting property or the bipolar substance, the above mentioned substances can each be used. Further, as the substance having an electron donating property, a substance selected from alkali metal and alkaline earth metal, in more detail, lithium (Li), calcium (Ca), sodium (Na), potassium (K), magnesium (Mg), or the like can be used. In addition, at least one substance selected from oxide of alkali metal or alkaline earth metal, nitride of alkali metal or alkaline earth metal, fluoride of alkali metal or alkaline earth metal, and the like, in more detail, lithium oxide ($Li_2O$), calcium oxide (CaO), sodium oxide ($Na_2O$), potassium oxide ($K_2O$), magnesium oxide (MgO), lithium fluoride (LiF), cesium fluoride (CsF), calcium fluoride ($CaF_2$) and the like, can be used as the substance having an electron donating property.

The first electrode 101 may be formed by using a substance having a high work function such as gold (Au), platinum (Pt), nickel (Ni), tungsten (W), chromium (Cr), molybdenum (Mo), iron (Fe), cobalt (Co), copper (Cu), palladium (Pd), or tantalum nitride or a substance having a low work function such as aluminum or magnesium, as well as indium tin oxide, indium tin oxide containing silicon oxide, or indium oxide containing zinc oxide of 2 to 20 atomic %.

As described above, in the light emitting element of the present embodiment mode, the first electrode 101 can be formed independent of work function of a substance. This is because the hole generating layer 111 is provided between the first electrode 101 and the light emitting layer 113.

The second electrode 102 may be formed by using a substance having a high work function such as gold (Au), platinum (Pt), nickel (Ni), tungsten (W), chromium (Cr), molybdenum (Mo), iron (Fe), cobalt (Co), copper (Cu), palladium (Pd), or tantalum nitride or a substance having a low work function such as aluminum or magnesium, as well as indium tin oxide, indium tin oxide containing silicon oxide, or indium oxide containing zinc oxide of 2 to 20 atomic %.

As described above, in the light emitting element of the embodiment mode, the second electrode 102 can be formed independent of work function of a substance. This is because the electron generating layer 115 is provided between the second electrode 102 and the light emitting layer 113.

Note that, although the light emitting element including the hole transporting layer 112, the electron transporting layer 114, and the like, in addition to the hole generating layer 111 and the light emitting layer 113 is described in this embodiment mode, a mode of the light emitting element is not necessarily limited thereto.

Figure 3:
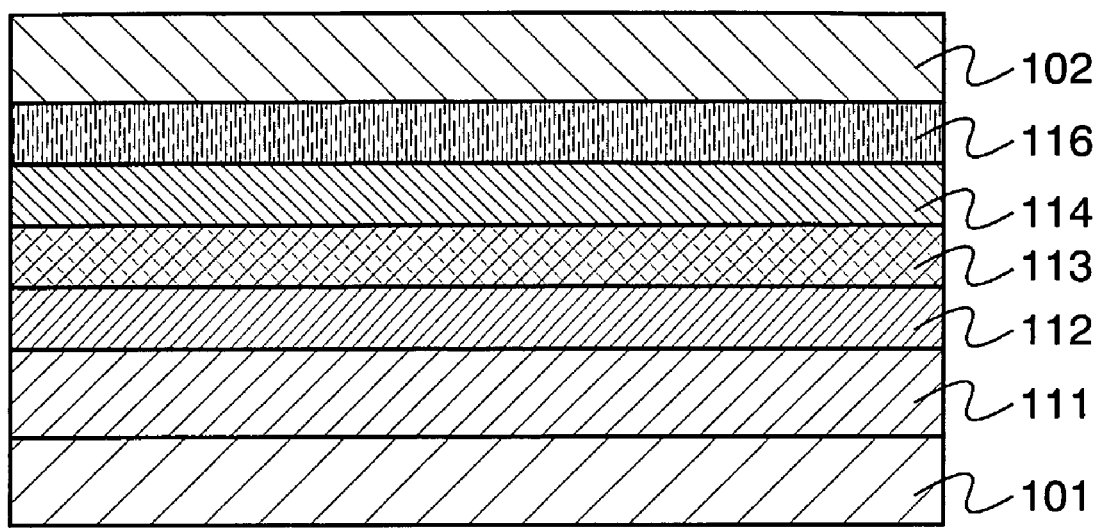
FIG. 3 shows a mode of a light emitting element of the present invention.

For example, a light emitting element including an electron injecting layer 116 instead of the electron generating layer 115 as shown in FIG. 3 may be used. The electron injecting layer 116 is a layer having a function of supporting the injection of electrons from the second electrode 102 to the electron transporting layer 114.

By providing the electron injecting layer 116, a gap of electron affinity between the second electrode 102 and the electron transporting layer 114 is reduced, and electrons become easy to be injected. The electron injecting layer 116 is preferably formed of a substance having electron affinity larger than that of the substance forming the electron transporting layer 114 and smaller than that of the substance forming the second electrode 102, or a substance which bends an energy band when provided as a thin film with a thickness of 1 to 2 nm between the electron transporting layer 114 and the second electrode 102.

As a specific example of the substance capable of being used to form the electron injecting layer 116, an inorganic substance such as alkali metal, alkaline earth metal, fluoride of alkali metal or alkaline earth metal, or oxide of alkali metal or alkaline earth metal can be given. These substances are favorable because they bend the energy band when provided as a thin film.

In addition, as well as the inorganic substance, a substance used to form the electron transporting layer 114 such as BPhen, BCP, p-EtTAZ, or TAZ can be used as a substance to form the electron injecting layer 116 by selecting a substance having larger electron affinity than that of the substance used to form the electron transporting layer 114 from the above substances.

In other words, it is preferable to form the electron injecting layer 116 so that electron affinity of the electron injecting layer 116 is relatively larger than that of the electron transporting layer 114. Note that, in a case of providing the electron injecting layer 116, the second electrode 102 is preferably formed of a substance having a low work function such as aluminum.

Figure 4:
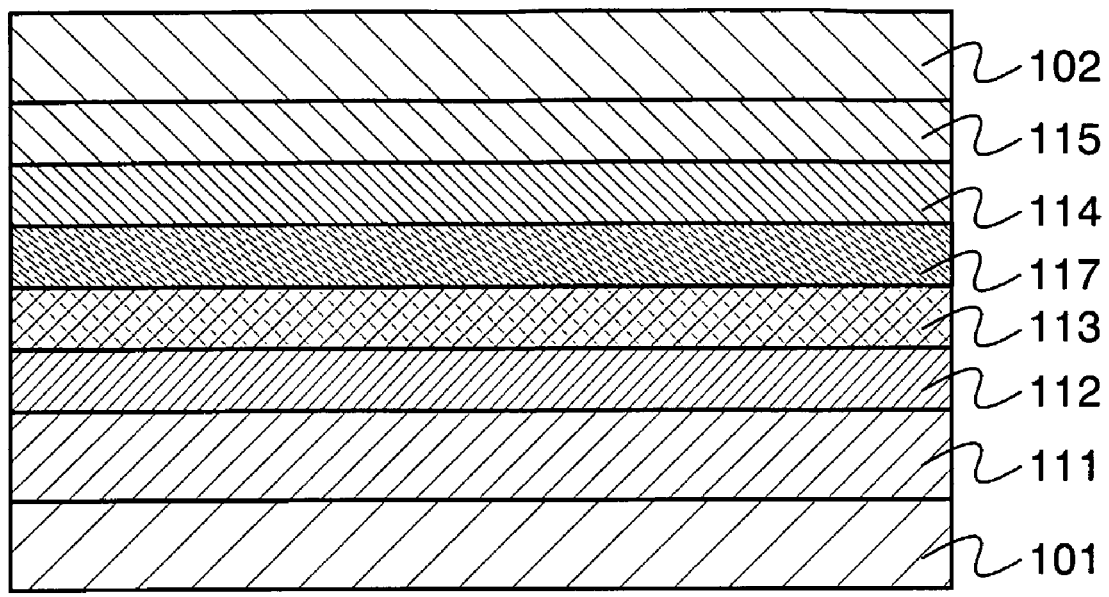
FIG. 4 shows a mode of a light emitting element of the present invention.

As shown in FIG. 4, a hole blocking layer 117 may be provided between the light emitting layer 113 and the electron transporting layer 114. The hole blocking layer 117 can prevent holes from flowing through the light emitting layer 113 toward the second electrode 102 and increase recombination efficiency of carriers. Further, the hole blocking layer 117 can prevent the excited energy generated in the light emitting layer 113 from moving to another layer such as the electron transporting layer 114.

The hole blocking layer 117 can be formed of a substance having larger ionization potential or excited energy than that of the substance used to form the light emitting layer 113, which is selected from substances capable of being used to form the electron transporting layer 114 such as BAlq, OXD-7, TAZ, and BPhen.

In other words, the hole blocking layer 117 can be formed as long as the ionization potential of the hole blocking layer 117 is relatively larger than that of the electron transporting layer 114.

Similarly, a layer for blocking electrons to flow toward the first electrode 101 through the light emitting layer 113 may be formed between the light emitting layer 113 and the hole transporting layer 112.

A practitioner of the invention can properly decide whether the hole transporting layer 112, the electron transporting layer 114, or the like is provided. These layers are not necessarily provided, for example, in the case that a defect such as quenching due to metal is not caused even when the hole transporting layer 112 or the electron transporting layer 114 is not provided.

The light emitting element of the present embodiment mode as described above causes few changes in driving voltage depending on a thickness of the hole generating layer 111. Therefore, by changing the thickness of the hole generating layer 111, a distance between the light emitting layer 113 and the first electrode 101 can be easily adjusted.

In other words, a length of light path through which emitted light passes (light path length) can be easily adjusted in order to be a length capable of efficiently extracting light to outward or improving color purity of light extracted outward. In addition, by thickening the hole generating layer 111, an asperity on a surface of the first electrode 101 can be reduced, and a short circuit between the electrodes can be easily prevented.

In addition, the light emitting element of the present embodiment mode causes few changes in driving voltage depending on a thickness of the electron generating layer 115. Therefore, a length of light path through which emitted light passes (light path length) can be easily adjusted by changing the thickness of the electron generating layer 115. Further, by thickening the electron generating layer 115, an asperity on a surface of the second electrode 102 can be reduced and a short circuit between the electrodes can be easily prevented.

Embodiment Mode 2

A mode of a light emitting element of the present invention is described with reference to FIG. 2.

Figure 2:
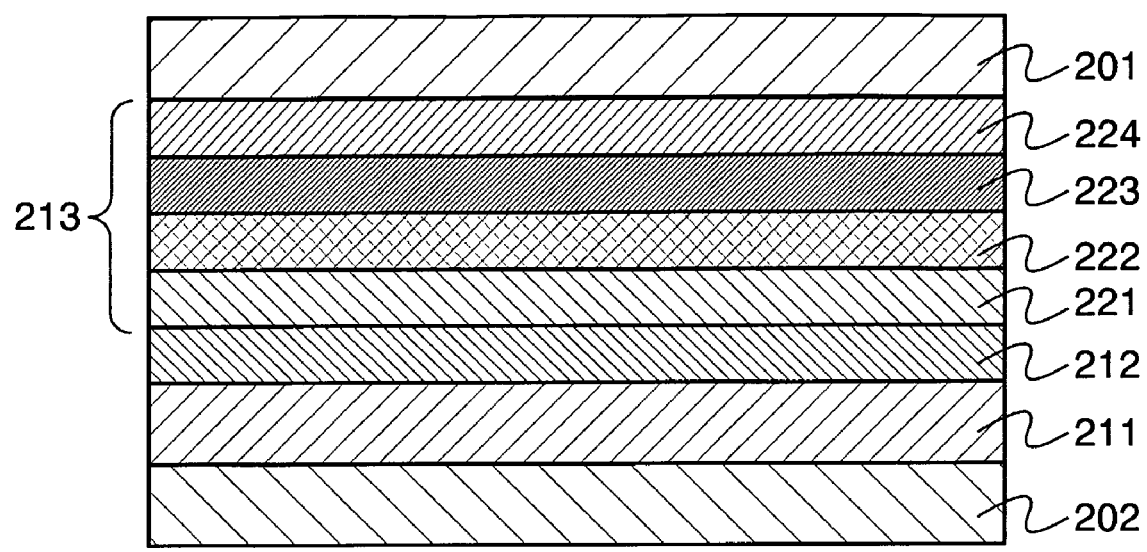
FIG. 2 shows a mode of a light emitting element of the present invention.

In FIG. 2, a light emitting element in which a first layer 213, a second layer 212, and a third layer 211 are interposed between a first electrode 201 and a second electrode 202 is shown. The first layer 213 is formed by sequentially laminating an electron transporting layer 221, a light emitting layer 222, a hole transporting layer 223, and a hole generating layer 224. The second layer 212 generates electrons, and the third layer 211 generates holes.

Here, the hole generating layer 224 is provided closer to the first electrode 201 than the light emitting layer 222, and the electron transporting layer 221 is provided closer to the second electrode 202 than the light emitting layer 222. When voltage is applied to the first electrode 201 and the second electrode 202 so that potential of the first electrode 201 is higher than that of the second electrode 202, holes are injected to the second electrode 202 from the third layer 211. Electrons are injected to the first layer 213 from the second layer 212, and holes are injected to the first layer 213 from the first electrode 201. Then, the holes and electrons injected to the first layer 213 are recombined in the light emitting layer 222. The light emitting layer 222 contains a light emitting substance, and this light emitting substance is brought into an excited state by excited energy generated through the recombination. The light emitting substance in the excited state emits light when returning to a ground state.

The third layer 211 and the hole generating layer 224 are mixed layers of the carbazole derivative represented by General Formula (1) and the substance having an electron accepting property with respect to the carbazole derivative represented by General Formula (1). In the third layer 211 and the hole generating layer 224, electrons of the carbazole derivative represented by General Formula (1) are caught by the substance having an electron accepting property with respect to the carbazole derivative represented by General Formula (1). In other words, the carbazole derivative represented by General Formula (1) is oxidized and generates holes.

Each of the third layer 211 and the hole generating layer 224 is preferably formed by using the carbazole derivative having a hole mobility of $1\times10^{-6}$ cm$^2$/Vs or more of the carbazole derivative represented by General Formula (1). In addition, in each of the third layer 211 and the hole generating layer 224, a value of a molar ratio of "the substance having an electron accepting property with respect to the carbazole derivative represented by General Formula (1)" to "the carbazole derivative represented by General Formula (1)" is preferably 0.1 to 10, more preferably 0.5 to 2 (=the substance having an electron accepting property/the carbazole derivative). In addition, although the substance having an electron accepting property is not particularly limited, metal oxide such as molybdenum oxide, vanadium oxide, ruthenium oxide, or rhenium oxide is preferably used. By containing the metal oxide and the carbazole derivative, crystallization of the third layer 211 and the hole generating layer 224 can be suppressed and the number of malfunctions of an element due to the crystallization can be decreased.

The second layer 212 is a layer for generating electrons, and can be formed to mix at least one substance selected from the substance having a high electron transporting property and the bipolar substance with a substance having an electron donating property with respect to the above selected substance.

Here, it is especially preferable to use a substance having an electron mobility of $1\times10^{-6}$ cm$^2$/Vs or more of the substance having a high electron transporting property and the bipolar substance. As the substance having a high electron transporting property and the bipolar substance, each of the above-mentioned substances can be used.

Further, as the substance having an electron donating property, a substance selected from alkali metal and alkaline earth metal, in more detail, lithium (Li), calcium (Ca), sodium (Na), potassium (K), magnesium (Mg), or the like can be used. In addition, oxide of alkali metal or alkaline earth metal, nitride of alkali metal or alkaline earth metal, fluoride of alkali metal or alkaline earth metal, or the like, in more detail, lithium oxide (Li$_2$O), calcium oxide (CaO), sodium oxide (Na$_2$O), potassium oxide (K$_2$O), magnesium oxide (MgO), lithium fluoride (LiF), cesium fluoride (CsF), calcium fluoride (CaF$_2$), or the like can be used as the substance having an electron donating property.

The electron transporting layer 221 is a layer having a function of transporting electrons, and in the light emitting element of this embodiment mode, it has a function of transporting electrons from the second layer 212 to the light emitting layer 222. By providing the electron transporting layer 221, a distance between the second layer 212 and the light emitting layer 222 can be increased; therefore, quenching of light emission due to metal included in the second layer 212 can be prevented. The electron transporting layer is preferably formed by using a substance having a high electron transporting property, and in more detail, is preferably formed by using a substance having an electron mobility of $1\times10^{-6}$ cm$^2$/Vs or more. The specific examples of the substance capable of being used to form the electron transporting layer 114 described in Embodiment Mode 1 is applied correspondingly to specific examples of the substance capable of being used to form the electron transporting layer 221.

The light emitting layer 222 contains a light emitting substance. The light emitting layer 222 may be made from only a light emitting substance, however, in the case that concentration quenching occurs, the light emitting layer 222 is preferably a mixed layer in which light emitting substances are dispersed into a layer formed of a substance having a larger energy gap than that of the light emitting substance. By containing the light emitting substances in the light emitting layer 222 by dispersing, the quenching of light emission due to the concentration is prevented. Note that the light emitting substance described in Embodiment Mode 1 is applied correspondingly to the light emitting substances. The substance which is included in the light emitting layer 113 as well as the light emitting substances and is used to make the light emitting substances in a dispersed state described in Embodiment Mode 1 is applied correspondingly to the substance which is included in the light emitting layer 222 as well as the light emitting substances and is used to make the light emitting substances in a dispersed state.

The hole transporting layer 223 is a layer having a function of transporting holes, and in the light emitting element of this embodiment mode, it has a function of transporting holes from the hole generating layer 224 to the light emitting layer 222. By providing the hole transporting layer 223, a distance between the hole generating layer 224 and the light emitting layer 222 can be increased; therefore, quenching of light emission due to metal included in the hole generating layer 224 can be prevented. The hole transporting layer 223 is preferably formed by using a substance having a high hole transporting property, and in more detail, is preferably formed by using a substance having a hole mobility of $1\times10^{-6}$ cm$^2$/Vs or more. The specific examples of the substance capable of being used to form the hole transporting layer 112 described in Embodiment Mode 1 is applied correspondingly to specific examples of the substance capable of being used to form the hole transporting layer 223.

The first electrode 201 may be formed by using a substance having a high work function such as gold (Au), platinum (Pt), nickel (Ni), tungsten (W), chromium (Cr), molybdenum (Mo), iron (Fe), cobalt (Co), copper (Cu), palladium (Pd), or tantalum nitride or a substance having a low work function such as aluminum or magnesium, as well as indium tin oxide, indium tin oxide containing silicon oxide, or indium oxide containing zinc oxide of 2 to 20 atomic %. As described above, in the light emitting element of the embodiment mode, the first electrode 201 can be formed independent of work function of a substance. This is because the hole generating layer 224 is provided between the first electrode 201 and the light emitting layer 222.

In addition, the second electrode 202 may be formed by using a substance having a high work function such as gold (Au), platinum (Pt), nickel (Ni), tungsten (W), chromium (Cr), molybdenum (Mo), iron (Fe), cobalt (Co), copper (Cu), palladium (Pd), or tantalum nitride or a substance having a low work function such as aluminum or magnesium, as well as indium tin oxide, indium tin oxide containing silicon ioxide, indium oxide containing zinc oxide of 2 to 20 atomic %. As described above, in the light emitting element of the embodiment mode, the second electrode 202 can be formed independent of work function of a substance. This is because the third layer 211 and the second layer 212 are provided between the second electrode 202 and the light emitting layer 222.

Note that, in this embodiment mode, the light emitting element in which the first layer 213 containing the light emitting substance includes a plurality of layers including the electron transporting layer 221, the light emitting layer 222, the hole transporting layer 223, and the hole generating layer 224 is described. However, the mode of the light emitting element is not limited thereto.

Figure 5:
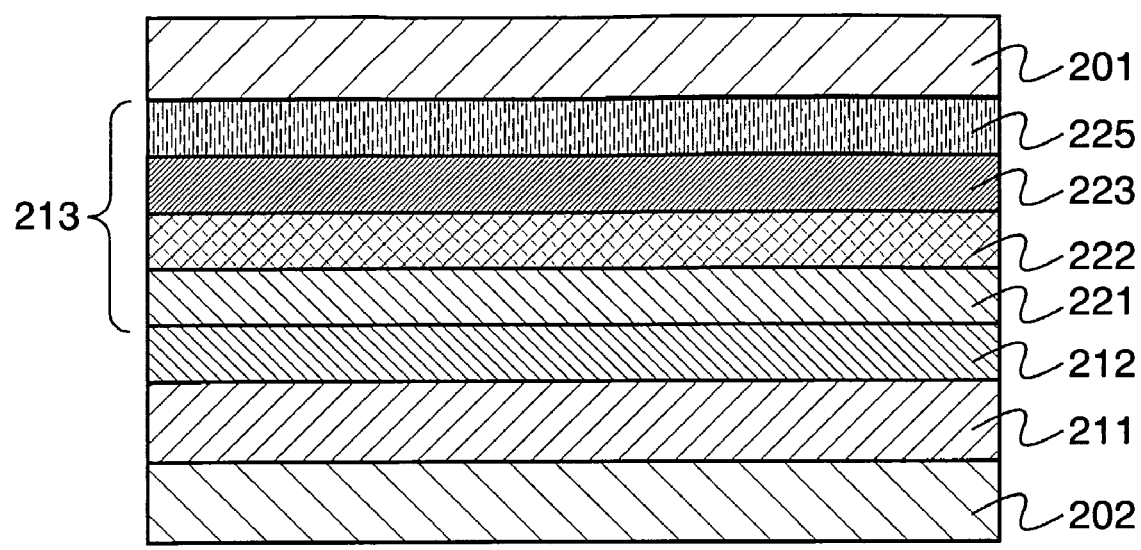
FIG. 5 shows a mode of a light emitting element of the present invention.

For example, a light emitting element including a hole injecting layer 225 rather than the hole generating layer 224, as shown in FIG. 5, may be used. The hole injecting layer 225 is a layer having a function of supporting the injection of holes from the first electrode 201 to the hole transporting layer 223. By providing the hole injecting layer 225, a gap of ionization potential between the first electrode 201 and the hole transporting layer 223 is reduced, and holes become easy to be injected. The hole injecting layer 225 is preferably formed of a substance having ionization potential larger than that of the substance forming the first electrode 201 and smaller than that of the substance forming the hole transporting layer 223, or a substance which bends an energy band when provided as a thin film with a thickness of 1 to 2 nm between the hole transporting layer 223 and the second electrode 202. As specific examples of the substance capable of being used to form the hole injecting layer 225, phthalocyanine-based compound such as phthalocyanine ($H_2Pc$) or copper phthalocyanine (CuPc), a high molecular weight material such as a poly(ethylene dioxythiophene)/poly(styrenesulfonic acid) aqueous solution (PEDOT/PSS), and the like can be given. It is preferable to form the hole injecting layer 225 so that ionization potential of the hole injecting layer 225 is relatively larger than that of the hole transporting layer 223. Note that, in the case of providing the hole injecting layer 225, the first electrode 201 is preferably formed of a substance having a high work function such as indium tin oxide.

Figure 6:
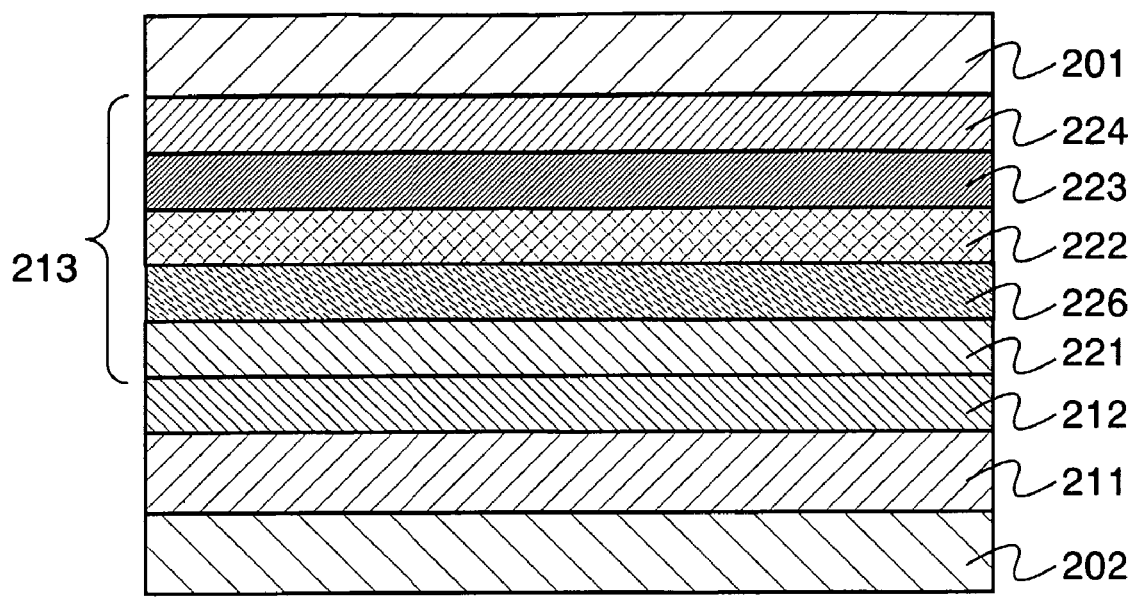
FIG. 6 shows a mode of a light emitting element of the present invention.

As shown in FIG. 6, a hole blocking layer 226 may be provided between the light emitting layer 222 and the electron transporting layer 221. The hole blocking layer 226 can prevent holes from flowing through the light emitting layer 222 toward the second electrode 202 and increase recombination efficiency of carriers. Further, the hole blocking layer 226 can prevent the excited energy generated in the light emitting layer 222 from moving to another layer such as the electron transporting layer 221.

The hole blocking layer 226 can be formed of a substance having larger ionization potential or excited energy than the substance used to form the light emitting layer 222, which is selected from substances capable of being used to form the electron transporting layer 221 such as BAlq, OXD-7, TAZ, and BPhen. In other words, the blocking layer 117 can be formed as long as the ionization potential of the hole blocking layer 226 is relatively larger than that of the electron transporting layer 221. Similarly, a layer for blocking electrons to flow toward the first electrode 201 through the light emitting layer 222 may be formed between the light emitting layer 222 and the hole transporting layer 223.

A practitioner of the invention can properly decide whether the hole transporting layer 223, the electron transporting layer 221, or the like is provided. These layers are not necessarily provided, for example, in the case that a defect such as quenching due to metal is not caused even when the hole transporting layer 223 or the electron transporting layer 221 is not provided.

In the above-described light emitting element, the difference in electron affinity between the substance having a high electron transporting property included in the second layer 212 and a substance included in a layer of the first layer 213, which has contact with the second layer 212, is preferably 2 eV or less, more preferably, 1.5 eV or less. In more detail, when the second layer 212 comes in contact with the electron transporting layer 221 as the light emitting element shown in FIG. 2, the difference in electron affinity between the substance having an electron transporting property included in the second layer 212 and the substance having an electron transporting property included in the electron transporting layer 221 is preferably 2 eV or less, more preferably, 1.5 eV or less. By connecting the second layer 212 to the first layer 213, electrons can be efficiently injected to the first layer 213 from the second layer 212.

The light emitting element of the present invention as described above causes few changes in driving voltage depending on a thickness of the third layer 211 or the hole generating layer 224. Therefore, by changing the thickness of the third layer 211 or the hole generating layer 224, a distance between the light emitting layer 222 and the first electrode 201 or between the light emitting layer 222 and the second electrode 202 can be easily adjusted. In other words, a length of light path through which emitted light passes (light path length) can be easily adjusted in order to be a length capable of efficiently extracting light outward or improving color purity of light extracted outward. In addition, an asperity on surfaces of the first electrode 201 or the second electrode 202 can be reduced by thickening the third layer 211 or the hole generating layer 224, respectively, and a short circuit between the electrodes can be easily prevented.

Embodiment Mode 3

In the light emitting element of the present invention, the number of malfunctions due to oxidation or crystallization of a compound can be decreased. By thickening a hole generating layer, a short circuit between electrodes can be prevented. In addition, by changing the thickness of the hole generating layer, light path length can be adjusted, light extraction efficiency can be increased, and light emission with good color purity can be obtained. Accordingly, by using the light emitting element of the present invention as a pixel, a favorable light emitting device, which has few display faults due to the malfunctions of the light emitting element, and which can provide image with favorable display color, can be obtained. In addition, by using the light emitting element of the present invention as a light source, a light emitting device which can favorably perform lighting with few faults due to the malfunctions of the light emitting element can be obtained.

The present embodiment mode will describe a circuit configuration of a light emitting device having a display function and a driving method thereof with reference to FIGS. 7 to 11C.

Figure 7:
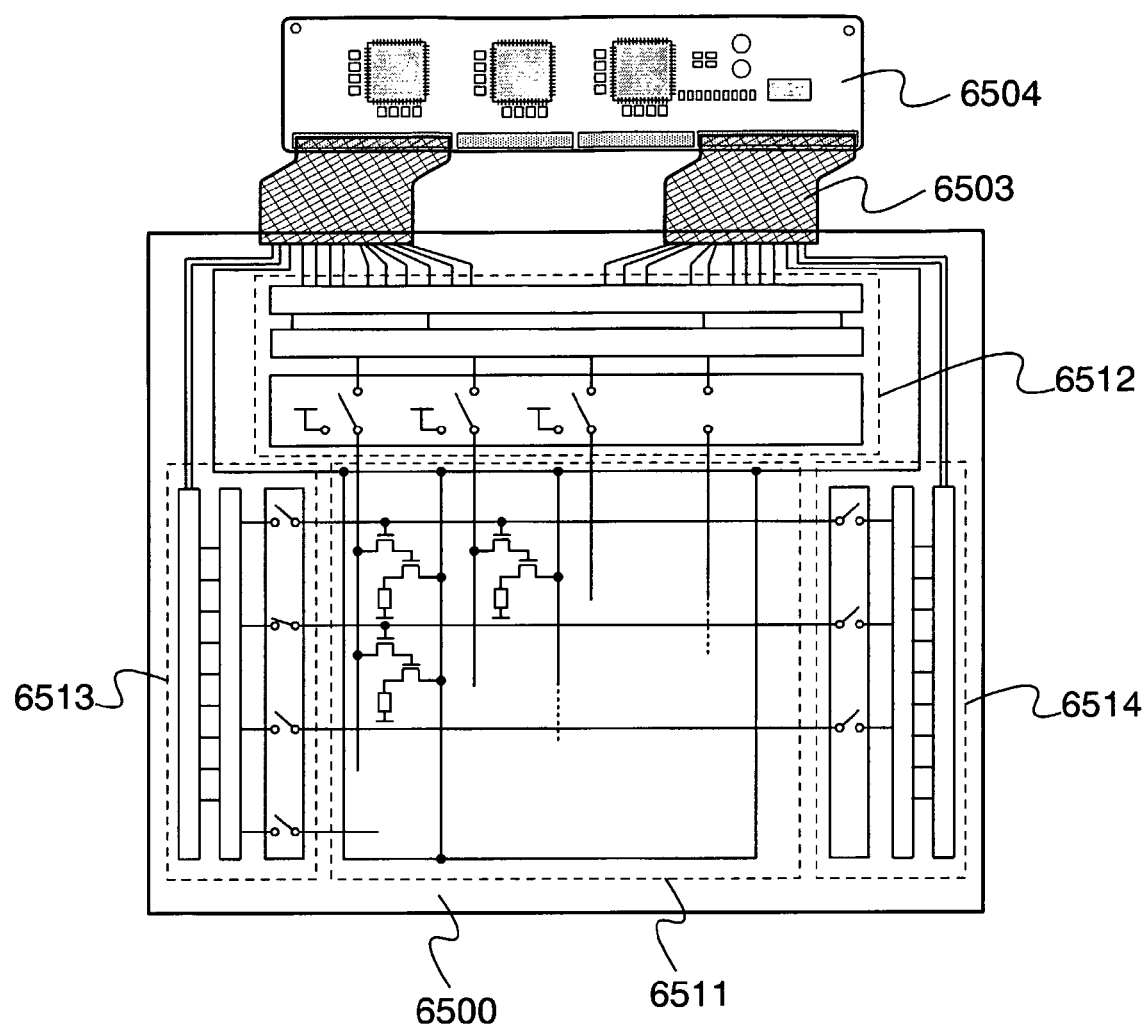
FIG. 7 is a top view showing a mode of a light emitting device of the present invention.

FIG. 7 is a schematic view seen from above the light emitting device using the invention. In FIG. 7, a pixel portion 6511, a source signal line driver circuit 6512, a writing gate signal line driver circuit 6513, and an erasing gate signal line driver circuit 6514 are provided over a substrate 6500. The source signal line driver circuit 6512, the writing gate signal line driver circuit 6513, and the erasing gate signal line driver circuit 6514 are each connected to an FPC (flexible printed circuit) 6503, which is external input terminal, through wiring groups. The source signal line driver circuit 6512, the writing gate signal line driver circuit 6513, and the erasing gate signal line driver circuit 6514 each receive video signals, clock signals, start signals, reset signals, or the like from the FPCs 6503. A printed wiring board (PWB) 6504 is attached to the FPCs 6503. Note that a driver circuit portion is not necessarily provided over the same substrate as the pixel portion 6511 as described above. For example, the driver circuit portion may be provided outside the substrate by utilizing an FPC with a wiring pattern over which an IC chip is mounted (TCP), or the like.

In the pixel portion 6511, a plurality of source signal lines extending in columns is aligned in rows. Current supply lines are also aligned in rows. A plurality of gate signal lines extending in rows is aligned in columns in the pixel portion 6511. Additionally, a plurality of circuits including light emitting elements is aligned in the pixel portion 6511.

Figure 8:
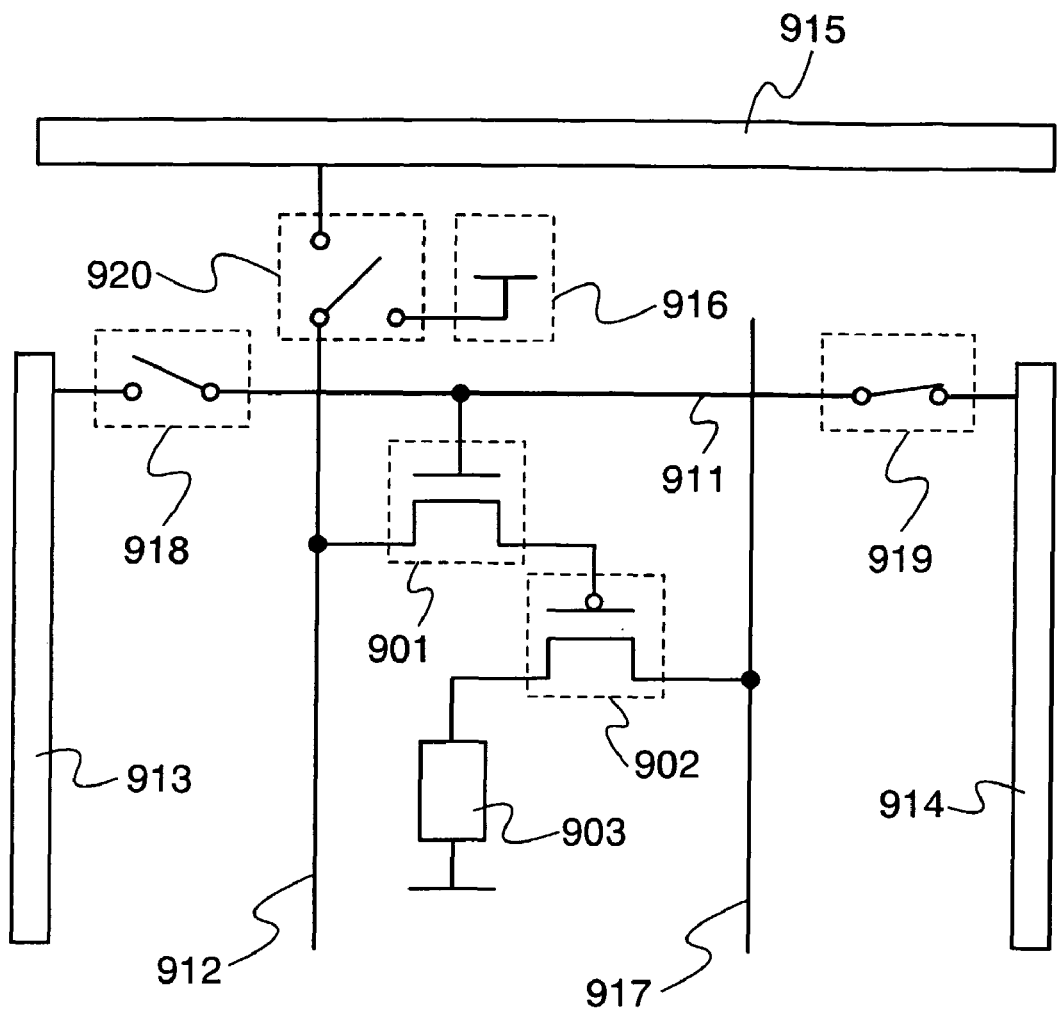
FIG. 8 shows a mode of a circuit for driving a pixel provided in a light emitting device of the present invention.

FIG. 8 is a diagram showing a circuit for operating one pixel. The circuit shown in FIG. 8 includes a first transistor 901, a second transistor 902, and a light emitting element 903.

Each of the first and second transistors 901 and 902 is a three-terminal element including a gate electrode, a drain region, and a source region, and includes a channel region between the drain region and the source region. The region serving as the source region and the region serving as the drain region are changed depending on the configuration of the transistor, an operation condition, and the like; therefore, it is difficult to determine which region serves as the source region or the drain region. Accordingly, in this embodiment mode, the regions serving as the source or the drain are denoted as a first electrode or a second electrode.

A gate signal line 911 and a writing gate signal line driver circuit 913 are provided to be electrically connected to or disconnected from each other by a switch 918. The gate signal line 911 and an erasing gate signal line driver circuit 914 are provided to be electrically connected to or disconnected from each other by a switch 919. A source signal line 912 is provided to be electrically connected to either a source signal line driver circuit 915 or a power source 916 by a switch 920. A gate of the first transistor 901 is electrically connected to the gate signal line 911. A first electrode of the first transistor is electrically connected to the source signal line 912, while a second electrode thereof is electrically connected to a gate electrode of the second transistor 902. A first electrode of the second transistor 902 is electrically connected to a current supply line 917, while the second electrode thereof is electrically connected to one electrode included in the light emitting element 903. Further, the switch 918 may be included in the writing gate signal line driver circuit 913. The switch 919 may also be included in the erasing gate signal line driver circuit 914. In addition, the switch 920 may be included in the source signal line driver circuit 915.

Figure 9:
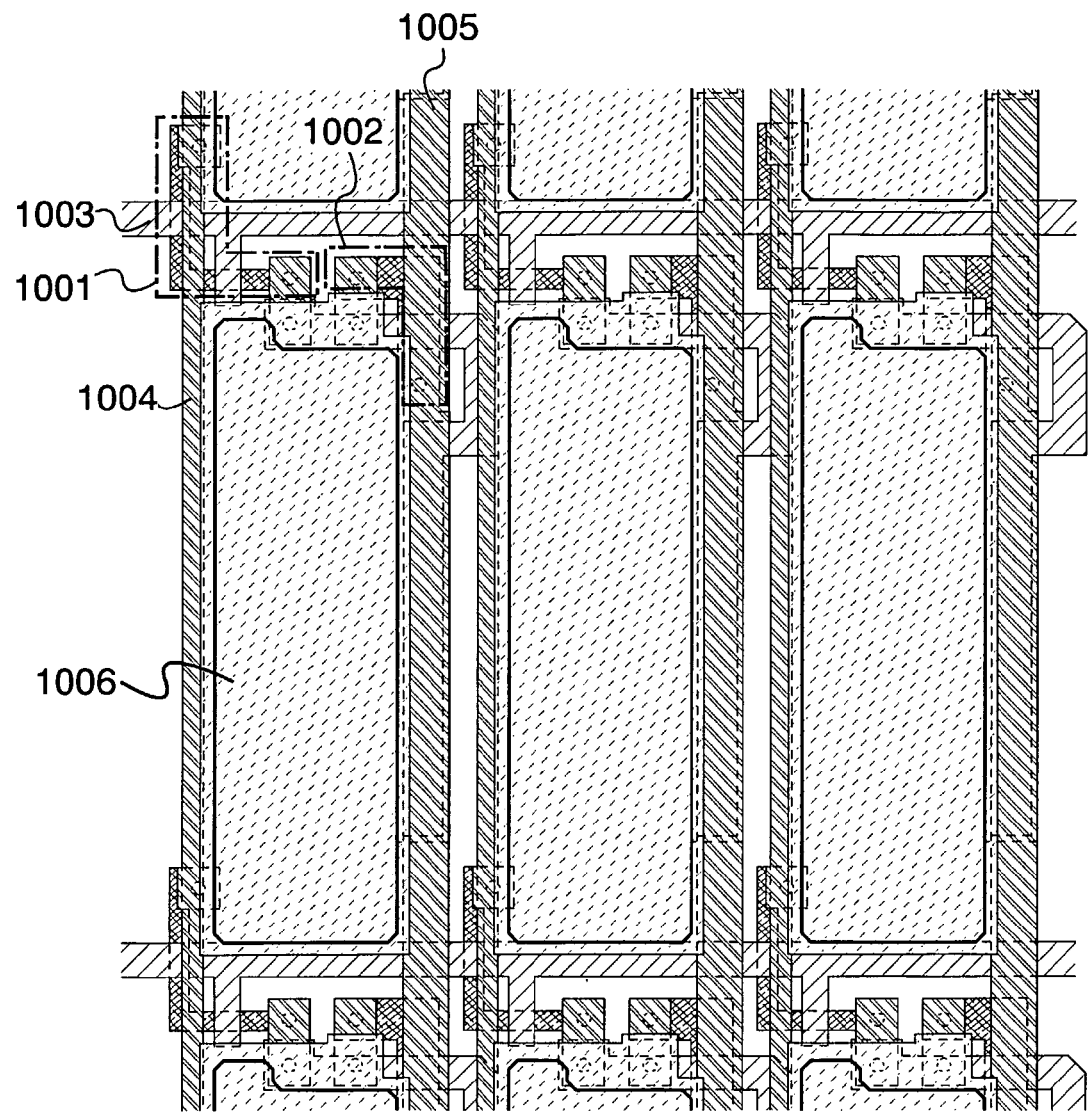
FIG. 9 shows a mode of a pixel portion included in a light emitting device of the present invention.

The arrangement of the transistors, the light emitting element, and the like in the pixel portion is not particularly limited. For example, the arrangement as shown in a top view of FIG. 9 can be employed. In FIG. 9, a first electrode of a first transistor 1001 is connected to a source signal line 1004, while a second electrode of the first transistor 1001 is connected to a gate electrode of a second transistor 1002. A first electrode of the second transistor is connected to a current supply line 1005, and a second electrode of the second transistor 1002 is connected to an electrode 1006 of a light emitting element. A part of a gate signal line 1003 functions as a gate electrode of the first transistor 1001.

Figure 10:
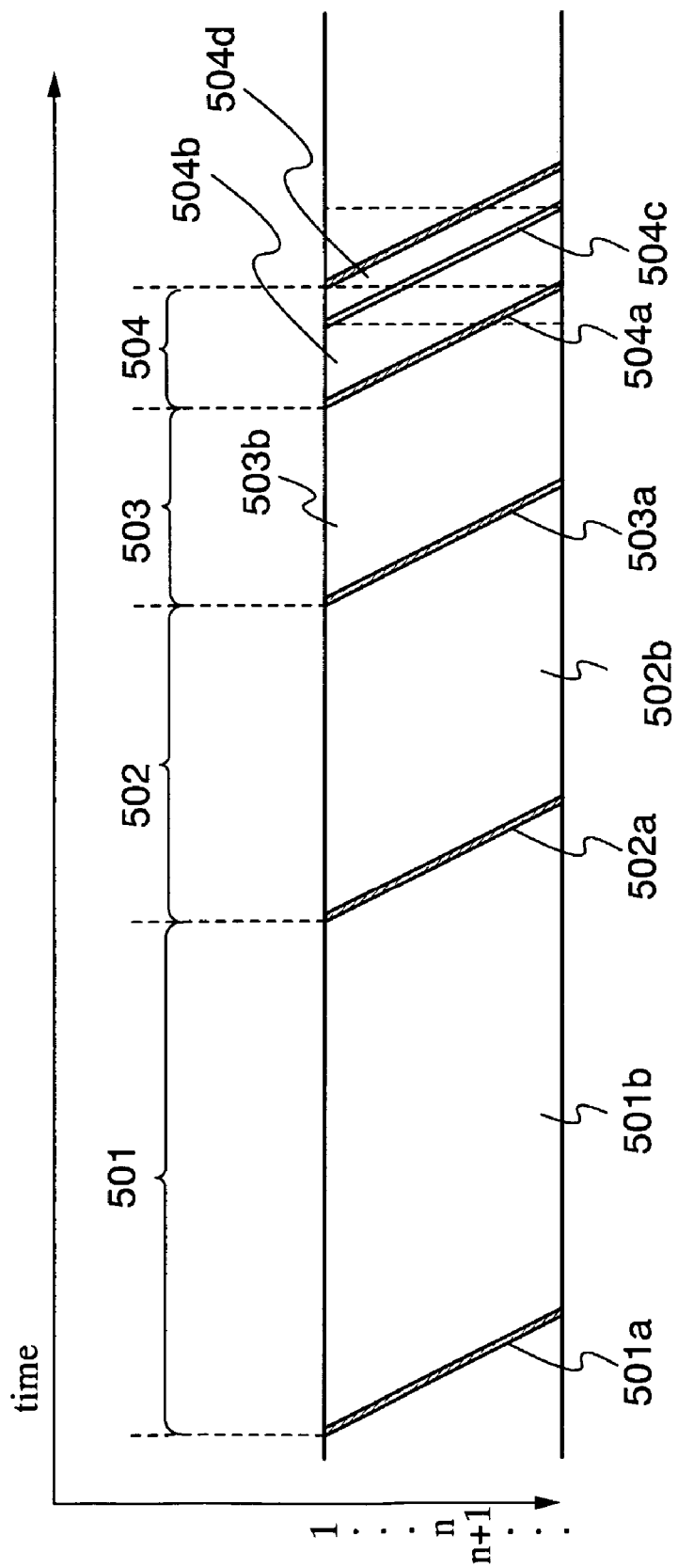
FIG. 10 is a diagram of a flame showing a method for driving a pixel included in a light emitting device of the present invention.

Next, the method for driving the light emitting device will be described. FIG. 10 is a diagram showing the operation of a frame with time passage. In FIG. 10, a lateral direction indicates time passage, while a longitudinal direction indicates the number of scanning stages of a gate signal line.

When an image is displayed on a light emitting device of the invention, rewriting operations and displaying operations are carried out repeatedly in the display period. The number of rewriting operations is not particularly limited; however, the rewriting operation is preferably performed about 60 times or more in a second so that a person who watches a displayed image does not sense flicker in the image. Here, a period of the rewriting and displaying operations for one image (one frame) is referred to as one frame period.

As shown in FIG. 10, one frame is divided into four sub-frames 501, 502, 503, and 504 including writing periods 501a, 502a, 503a, and 504a and holding periods 501b, 502b, 503b, and 504b. The light emitting element applied with a signal for light emission is in a light emitting state during the holding periods. The length ratio of the holding periods of the first sub-frame 501, the second sub-frame 502, the third sub-frame 503, to the fourth sub-frame 504 satisfies $2^3:2^2:2^1:2^0=8:4:2:1$. This allows the light emitting device to display 4-bit gray scale. Further, the number of bits and the gray scales are not limited to those shown in this embodiment mode. For instance, one frame may include eight sub-frames so as to display 8-bit gray scale.

The operation of one frame will be described. First, in the sub-frame 501, the writing operation is performed on a first row to a last row, sequentially. Therefore, the starting time of the writing period is varied depending on each row. The holding period 501b sequentially starts in the rows in which the writing period 501a has been terminated. In the holding period 501b, the light emitting element applied with a signal for light emission remains in a light emitting state. The sub-frame 501 is changed to the next sub-frame 502 sequentially in the rows in which the holding period 501b has been terminated. In the sub-frame 502, a writing operation is sequentially performed on the first row to the last row in the same manner as the sub-frame 501. The above-mentioned operations are carried out repeatedly up to the holding period 504b of the sub-frame 504, and then are terminated. After terminating the operation of the sub-frame 504, an operation in the next frame is started. Accordingly, the sum of the light-emitting time in each sub-frame corresponds to the light emitting time of each light emitting element in one frame. By varying the light emitting time for each light emitting element and combining the light emitting elements variously within one pixel, various display colors with different brightness and different chromaticity can be formed.

When the holding period is intended to be forcibly terminated in the row in which the writing operation has already been terminated and the holding period has started prior to terminating the writing operation up to the last row as in the sub-frame 504, an erasing period 504c is preferably provided after the holding period 504b so as to stop light emission forcibly. The row where light emission is forcibly stopped does not emit light for a certain period (this period is referred to as a non-light emitting period 504d). Right after terminating the writing period in the last row, a writing period of a next sub-frame (or a next frame) starts sequentially from the first row. This can prevent the writing period in the sub-frame 504 from overlapping with the writing period in the next sub-frame.

Although the sub-frames 501 to 504 are arranged in decreasing order of the length of the holding period in this embodiment mode, they are not necessary to be arranged in this order. For example, the sub-frames may be arranged in increasing order of the length of the holding period. Alternatively, the sub-frames may be arranged in random order regardless of the length of the holding period. In addition, these sub-frames may further be divided into a plurality of frames. In other words, scanning of gate signal lines may be performed several times during a period of supplying the same video signals.

The operations in the wiring period and the erasing period of the circuits shown in FIG. 8 will be described.

First, the operation in the writing period will be described. In the writing period, the gate signal line 911 in the n-th row (n is a natural number) is electrically connected to the writing gate signal line driver circuit 913 via the switch 918, and is not connected to the erasing gate signal line driver circuit 914. The source signal line 912 is electrically connected to the source signal line driver circuit 915 via the switch 920. In this case, a signal is input in the gate of the first transistor 901 connected to the gate signal line 911 in the n-th row (n is a natural number), thereby turning the first transistor 901 on. At this moment, video signals are simultaneously input in the source signal lines in the first to last columns. Further, the video signals input from each source signal line 912 are independent in columns each other. The video signals input from the source signal line 912 are input in the gate electrode of the second transistor 902 via the first transistor 901 connected to each source signal line. At this moment, a value of current applied from the current supply line 917 to the light emitting element 903 is determined depending on the signals input in the second transistor 902. In addition, depending on the current value, it is determined whether the light emitting element 903 emits light or not. For instance, when the second transistor 902 is a p-channel type, the light emitting element 903 emits light by inputting a low level signal in the gate electrode of the second transistor 902. On the other hand, when the second transistor 902 is an n-channel type, the light emitting element 903 emits light by inputting a high level signal in the gate electrode of the second transistor 902.

Next, the operation in the erasing period will be described. In the erasing period, the gate signal line 911 in the n-th row (n is a natural number) is electrically connected to the erasing gate signal line driver circuit 914 via the switch 919, and is not connected to the writing gate signal line driver circuit 913. The source signal line 912 is electrically connected to the power source 916 via the switch 920. In this case, by inputting a signal in the gate of the first transistor 901 connected to the gate signal line 911 in the n-th row, the first transistor 901 is turned on. At this moment, erasing signals are simultaneously input in the source signal lines in the first to last columns. The erasing signals input from the source signal line 912 are input in the gate electrode of the second transistor 902 via the first transistor 901 connected to each source signal line. At this time, the supply of current flowing from the current supply line 917 to the light emitting element 903 is forcibly stopped by the signals input in the second transistor 902. This forcibly makes the light emitting element 903 emit no light. For example, when the second transistor 902 is a p-channel type, the light emitting element 903 emits no light by inputting a high level signal in the gate electrode of the second transistor 902. On the other hand, when the second transistor 902 is an n-channel type, the light emitting element 903 emits no light by inputting a low level signal in the gate electrode of the second transistor 902.

Further, in the erasing period, a signal for erasing is input in the n-th row (n is a natural number) by the above-mentioned operation. However, as mentioned above, the n-th row sometimes remains in the erasing period while another row (referred to as an m-th row (m is a natural number)) is in the writing period. In this case, since a signal for erasing is necessary to be input in the n-th row and a signal for writing is necessary to be input in the m-th row by utilizing the source signal line in the same column, the operation mentioned as following is preferably carried out.

Right after the light emitting element 903 in the n-th row stops emitting light by the above-described operation in the erasing period, the gate signal line 911 and the erasing gate signal line driver circuit 914 are immediately disconnected from each other, while the source signal line 912 is connected to the source signal line driver circuit 915 by switching the switch 920. While the source signal line 912 and the source signal line driver circuit 915 are connected to each other, the gate signal line 911 and the writing gate signal line driver circuit 913 are connected to each other. A signal is selectively input in the signal line in the m-th row from the writing gate signal line driver circuit 913, and the first transistor is turned on. Meanwhile, signals for writing are input in the source signal lines 912 in the first to last columns from the source signal line driver circuit 915. The light emitting element in the m-th row emits light or no light depending on these signals.

After terminating the writing period in the m-th row as mentioned above, the erasing period immediately starts in the m+1-th row. Therefore, the gate signal line and the writing gate signal line driver circuit 913 are disconnected from each other, and the source signal line 912 is connected to the power source 916 by switching the switch 920. In addition, the gate signal line 911 and the writing gate signal line driver circuit 913 are disconnected from each other, while the gate signal line is connected to the erasing gate signal line driver circuit 914. A signal is selectively input in the gate signal line in the n+1-th row from the erasing gate signal line driver circuit 914 to turn on the first transistor, while an erasing signal is input from the power source 916. After terminating the erasing period in the n+1-th row in this manner, the writing period immediately starts in the m-th row. Similarly, an erasing period and a writing period may be repeated alternately up to the erasing period of the last row.

Although the writing period of the m-th row is provided between the erasing period of the n-th row and the erasing period of the n+1-th row in this embodiment mode, the present invention is not limited thereto. The writing period of the m-th row may be provided between the erasing period in the n−1-th row and the erasing period in the n-th row.

In this embodiment mode, when the non-light emitting period 504d is provided as in the sub-frame 504, the operations of disconnecting the erasing gate signal line driver circuit 914 from one gate signal line and connecting the writing gate signal line driver circuit 913 to another gate signal line are carried out repeatedly. These operations may be performed in a frame in which a non-light emitting period is not particularly provided.

Embodiment Mode 4

A mode of a light emitting device including a light emitting element of the present invention will be described with reference to cross-sectional views of FIGS. 11A to 11C.

Figure 11A:
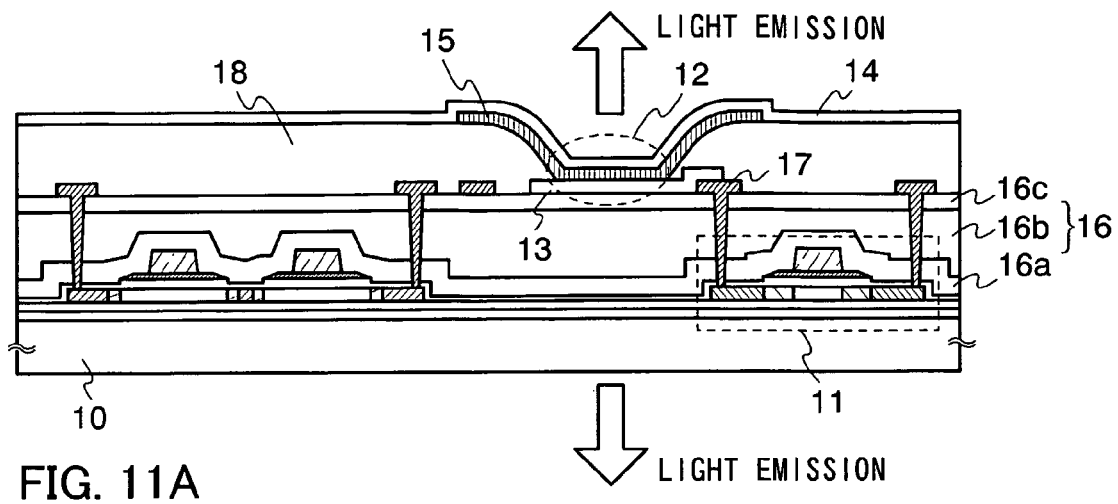
FIGS. 11A to 11C show modes of cross-sections of light emitting devices of the present invention.
Figure 11B:
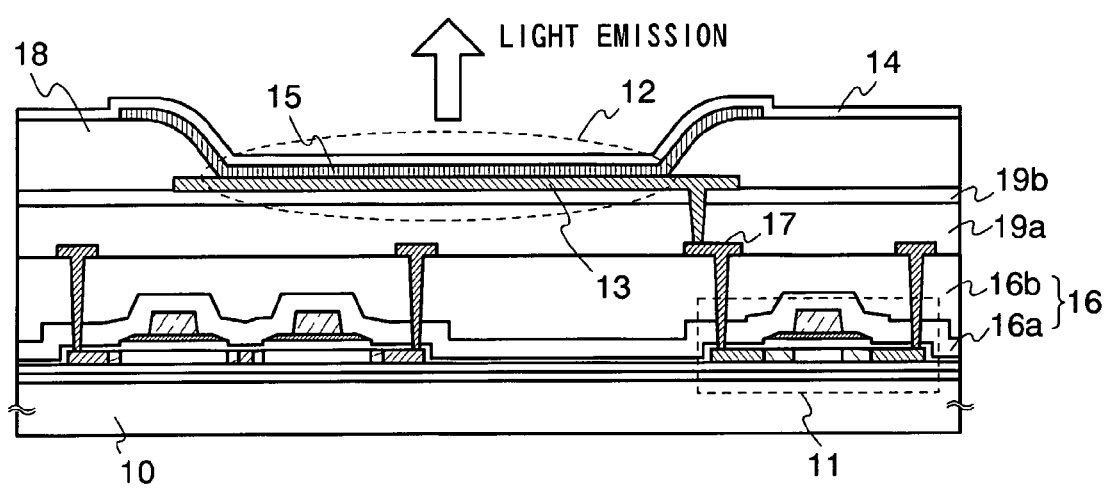
Figure 11C:
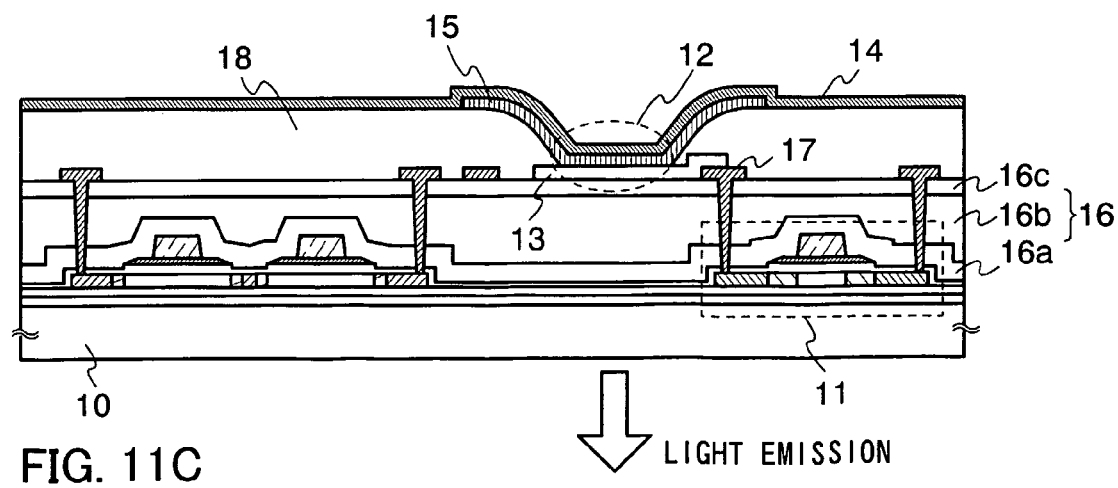

In each of FIGS. 11A to 11C, a region surrounded by a dashed line represents a transistor 11 that is provided for driving a light emitting element 12 of the invention. The light emitting element 12 of the invention includes a layer 15, in which a hole generating layer, an electron generating layer, and a layer containing a light emitting substance are laminated, between a first electrode 13 and a second electrode 14. A drain of the transistor 11 and the first electrode 13 are electrically connected to each other by a wiring 17 penetrating a first interlayer insulating film 16 (a first layer 16a, a second layer 16b and a third layer 16c in FIGS. 11A and 11C, and a first layer 16a and a second layer 16b in FIG. 11B). The light emitting element 12 is isolated from another light emitting element provided adjacent to the light emitting element 12 by a partition wall layer 18. The light emitting device of the invention having this structure is provided over a substrate 10 in this embodiment mode.

The transistor 11 shown in each FIGS. 11A to 11C is a top-gate type transistor in which a gate electrode is provided on a side of a semiconductor layer opposite to the substrate. Further, the structure of the transistor 11 is not particularly limited, for example, a bottom-gate type transistor may be employed. In the case of using the bottom-gate type transistor, either a transistor in which a protective film is formed over a semiconductor layer forming a channel (a channel protective type) or a transistor in which a part of a semiconductor layer forming a channel has a depression shape (a channel etched type) may be used. Note that reference numeral 21 denotes a gate electrode; 22, a gate insulating film; 23, a semiconductor layer; 24, an n-type semiconductor layer; 25, an electrode; and 26, a protective film.

The semiconductor layer included in the transistor 11 may be formed of any one of a crystalline semiconductor, an amorphous semiconductor, a semiamorphous semiconductor, or the like.

The semiamorphous semiconductor is a material as described below. The semiamorphous semiconductor has an intermediate structure between an amorphous structure and a crystalline structure (including single crystalline and polycrystalline structures), and has a third state that is stable in terms of free energy. The semiamorphous semiconductor further includes a crystalline region having a short-range order and lattice distortion. A crystal grain with a size of 0.5 to 20 nm is included in at least a part of the semiamorphous semiconductor film. Raman spectrum is shifted to lower wavenumber than 520 cm$^{-1}$. The diffraction peaks of (111) and (220), which are considered to be derived from silicon crystal lattice, are observed in the semiamorphous semiconductor by the X-ray diffraction. The semiamorphous semiconductor contains hydrogen or halogen of at least 1 atomic % or more for terminating dangling bonds. The semiamorphous semiconductor is also referred to as a microcrystalline semiconductor The semiamorphous semiconductor is formed by glow discharge decomposition with a silicon source gas (plasma CVD). As for the silicon source gas, $SiH_4$, $Si_2H_6$, $SiH_2Cl_2$, $SiHCl_3$, $SiCl_4$, $SiF_4$, or the like can be used. The silicon gas may also be diluted with $H_2$, or a mixture of $H_2$ and one or more of rare gas elements selected from He, Ar, Kr, and Ne. The dilution ratio is set in the range of 1:2 to 1:1,000. The pressure is set approximately in the range of 0.1 Pa to 133 Pa. The power frequency is set to be 1 MHz to 120 MHz, preferably, 13 MHz to 60 MHz. The substrate heating temperature may be set at 300° C. or less, more preferably, 100° C. to 250° C. As an impurity element contained in the film, concentration of the impurity in an atmospheric constituent such as oxygen, nitrogen, or carbon is preferably set $1\times10^{20}/cm^3$ or less. In particular, the oxygen concentration is set to be $5\times10^{19}/cm^3$ or less, preferably, $1\times10^{19}/cm^3$ or less. Further, the mobility of a TFT (thin film transistor) using the semiamorphous semiconductor is set to be about 1 m$^2$/Vsec to 10 m$^2$/Vsec.

As a specific example of a crystalline semiconductor layer, a semiconductor layer made from single crystal silicon, polycrystalline silicon, silicon germanium, or the like can be given. These materials may be formed by laser crystallization. For example, these materials may be formed by crystallization with use of a solid phase growth method using nickel or the like.

When a semiconductor layer is formed from an amorphous substance, for example, amorphous silicon, it is preferable to make a light emitting device with circuits including only n-channel transistors as the transistor 11 and other transistors (transistors included in a circuit for driving a light emitting element). Except the case of forming the semiconductor layer from an amorphous substance, a light emitting device may have circuits including either or both n-channel transistors and p-channel transistors.

The first interlayer insulating film 16 may include a single layer or a plurality of layers as shown in FIGS. 11A and 11C. In the case when the first interlayer insulating film 16 includes the plurality of layers, the first layer 16a is made from an inorganic material such as silicon oxide or silicon nitride. The second layer 16b is made from acrylic, siloxane (which is a substance that has a skeletal structure formed from a silicon (Si)-oxygen (O) bond and includes, as its substituent, an organic group containing at least hydrogen (e.g., an alkyl group or aromatic hydrocarbon), a fluoro group, or both an organic group containing at least hydrogen, and a fluoro group), or a substance with a self-planarizing property such as silicon oxide that can be applied to form a film. The third layer 16c is made from a silicon nitride film containing argon (Ar). The substances included in each layer are not particularly limited thereto, and substances other than the above-mentioned substances may be employed. Alternatively, a layer with the substance other than the above-mentioned substances may be further added. Accordingly, the first interlayer insulating film 16 may be formed by using either or both of an inorganic material and an organic material.

The edge portion of the partition wall layer 18 preferably has a shape in which the curvature radius is continuously changed. This partition wall layer 18 is formed by using acrylic, siloxane, resist, silicon oxide, or the like. Further, the partition wall layer 18 may be made from either or both of an inorganic film and an organic film.

FIGS. 11A and 11C each show the structure in which only the first interlayer insulating film 16 is interposed between the transistor 11 and the light emitting element 12. Alternatively, as shown in FIG. 11B, the first interlayer insulating film 16 (16a and 16b) and a second interlayer insulting film 19 (19a and 19b) may be provided between the transistor 11 and the light emitting element 12. In the light emitting device as shown in FIG. 11B, the first electrode 13 penetrates the second interlayer insulating film 19 to be electrically connected to the wiring 17.

The second interlayer insulating film 19 may include either a plurality of layers or a single layer, as with the first interlayer insulating film 16. The interlayer insulating film 19a is made from acrylic, siloxane (which is a substance that has a skeletal structure formed from a silicon (Si)-oxygen (O) bond and includes at least hydrogen as its substituent), or a substance with a self-planarizing property such as silicon oxide that can be applied to form a film. The interlayer insulating film 19b is made from a silicon nitride film containing argon (Ar). The substances included in each layer of the second interlayer insulating layer 19 are not particularly limited thereto, and substances other than the above-mentioned substances may be employed. Alternatively, a layer with a substance other than the above-mentioned substances may be further added. Accordingly, the second interlayer insulating film 19 may be formed by using either or both of an inorganic material and an organic material.

When the first electrode and the second electrode are both formed by using a substance with a light-transmitting property in the light emitting element 12, light can be emitted through both the first electrode 13 and the second electrode 14 as shown in the open arrows in FIG. 11A. When only the second electrode 14 is made from a substance with a light-transmitting property, light can be emitted only through the second electrode 14 as shown in the open arrow of FIG. 11B. In this case, the first electrode 13 is preferably made from a material with high reflectivity, or a film (reflective film) made from a material with high reflectivity is preferably provided under the first electrode 13. When only the first electrode 13 is made from a substance with a light-transmitting property, light can be emitted only through the first electrode 13 as shown in the open arrow of FIG. 11C. In this case, the second electrode 14 is preferably made from a material with high reflectivity, or a reflective film is preferably provided over the second electrode 14.

Moreover, the light emitting element 12 may have a structure in which the layer 15 is provided in a manner in which the light emitting element 12 operates when voltage is applied so that potential of the second electrode 14 is higher than that of the first electrode 13, or a structure in which the layer 15 is provided in a manner in which the light emitting element 12 operates when voltage is applied so that potential of the second electrode 14 is lower than that of the first electrode 13. In the former case, the transistor 11 is an n-channel transistor. In the latter case, the transistor 11 is a p-channel transistor.

Figure 12:
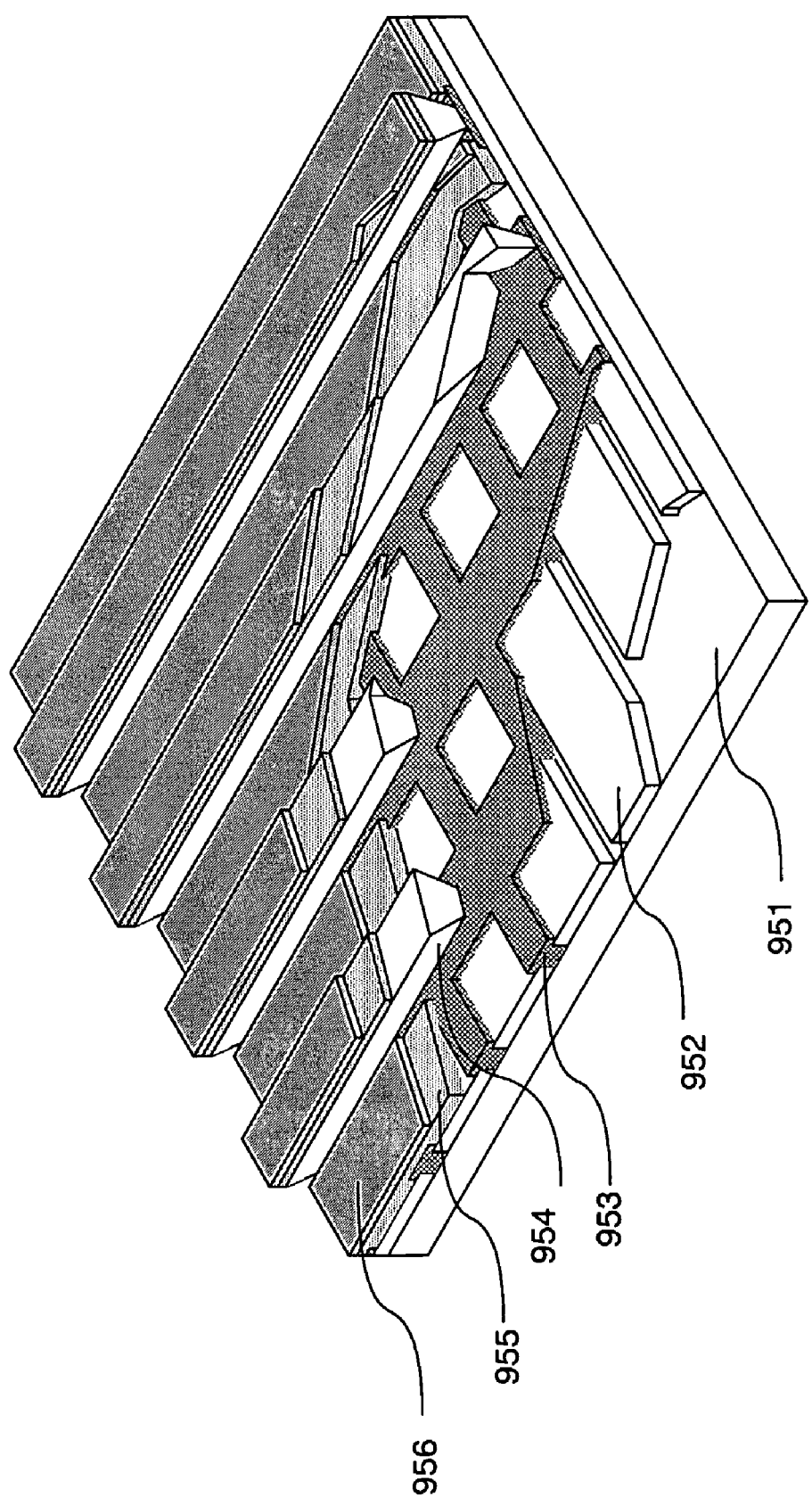
FIG. 12 shows a mode of a light emitting device of the present invention.

As described above, an active light emitting device controlling driving of a light emitting element with a transistor is described in this embodiment mode. Alternatively, a passive light emitting device driving a light emitting element without providing an element for driving such as a transistor may be used. FIG. 12 is a perspective view of an example of the passive light emitting device manufactured using the present invention. In FIG. 12, a layer 955, in which a layer containing a light emitting substance, an electron generating layer, and a hole generating layer are sequentially laminated, is provided between an electrode 952 and an electrode 956 over a substrate 951. An end portion of the electrode 952 is covered by an insulating layer 953. Over the insulating layer 953, a partition wall layer 954 is provided. The partition wall layer 954 has a slope shape such that the distance between one sidewall and other side of the partition wall layer 954 is reduced toward a surface of the substrate. In other words, a cross section of the partition wall 954 in a narrow side direction shows a trapezoid shape having a shorter base (a side parallel to a surface of the insulating layer 953 and contacting with the insulating layer 953) than an upper side (a side parallel to a surface of the insulating layer 953 and not contacting with the insulating layer 953). By providing the partition wall layer 954, a fault of a light emitting element due to static electricity or the like can be prevented. Note that the structure shown in FIG. 12 is an example of a passive light emitting device, and the invention is not limited to the structure. A passive light emitting device can be also driven with small power consumption by including a light emitting element of the present invention which operates with low driving voltage.

Embodiment Mode 5

The light emitting device using the light emitting element of the present invention as a pixel favorably operates displaying with few display defects due to a malfunction of the light emitting element. Therefore, by applying such a light emitting device to a display portion, an electronic device can be obtained with few display image errors or the like due to the display faults. Further, the light emitting device using the light emitting element as a light source can perform lighting with few faults due to the malfunction of the light emitting element. Therefore, by using the light emitting device as a lighting portion such as a backlight and mounting the light emitting device of the invention in this manner, the number of the malfunctions in which a dark part is locally formed due to a defect of the light emitting element is decreased, and the light emitting device can perform display favorably.

Figure 13A:
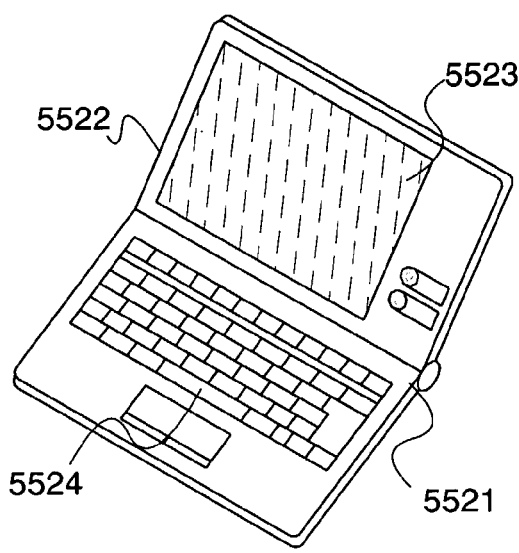
FIGS. 13A to 13C show modes of electronic devices using the present invention.
Figure 13B:
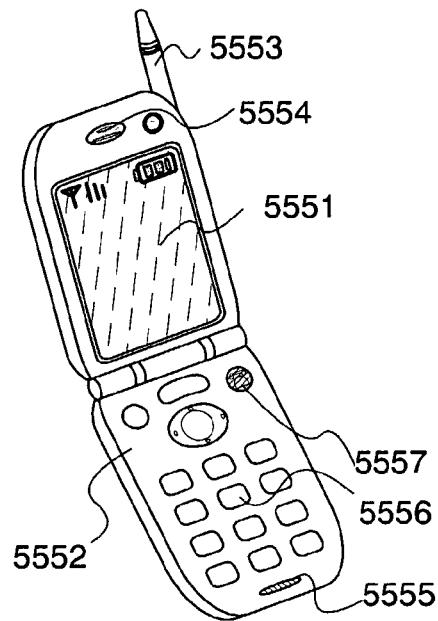
Figure 13C:
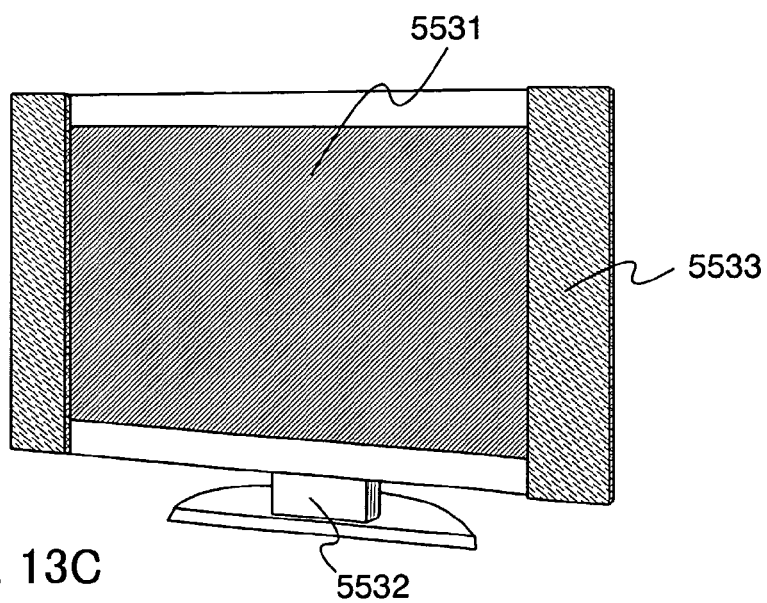

FIGS. 13A to 13C show examples of the electronic devices on each of which a light emitting device using the present invention is mounted.

FIG. 13A shows a personal computer manufactured by using the invention, including a main body 5521, a chassis 5522, a display portion 5523, a keyboard 5524, and the like. The personal computer can be completed by incorporating the light emitting device as shown in FIG. 7, which uses the light emitting element of the invention as a pixel, on a display portion. Alternatively, the personal computer can be completed by incorporating the light emitting device as a backlight, which uses the light emitting element of the invention as a light source.

Figure 14:
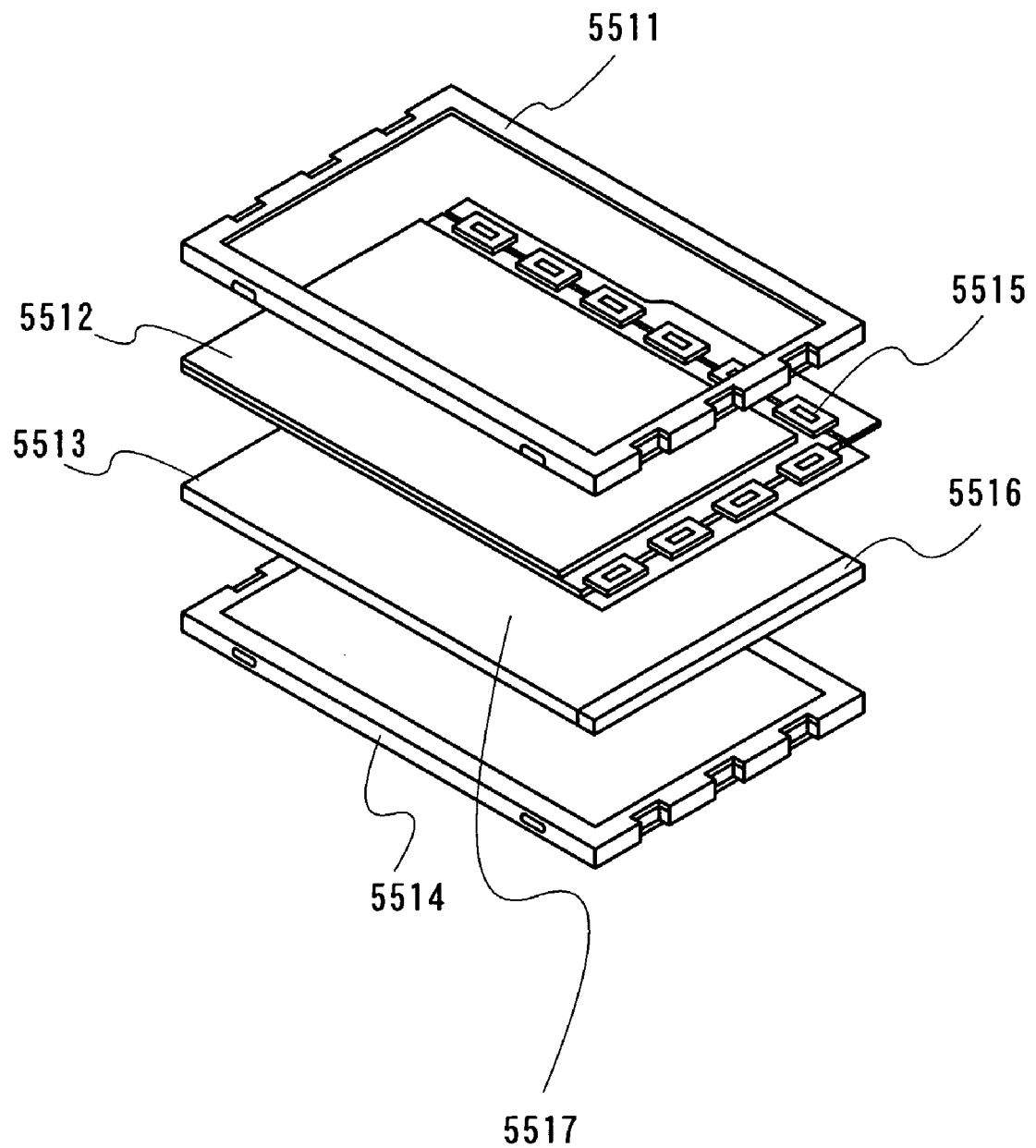
FIG. 14 shows a lighting device using the present invention.

Specifically, as shown in FIG. 14, a lighting device in which a liquid crystal device 5512 and a light emitting device 5513 are interposed between a chassis 5511 and a chassis 5514 may be incorporated as a display portion. In FIG. 14, an external input terminal 5515 is attached in the liquid crystal device 5512, and the light emitting device 5513 includes a light emitting element array 5516 using the light emitting element of the invention, and a light guide plate 5517. The light emitting element array 5516 includes one or more lines of the light emitting element of the invention. By the light guide plate 5517, light emitted from the light emitting element array 5516 is emitted from an entire surface of the light guide plate 5517, which is on a side facing the liquid crystal device 5512, toward the liquid crystal device 5512.

The light emitting device 5513 shown in FIG. 14 includes the light emitting element array and the light guide plate; however, the invention is not limited to this structure. For example, without providing the light guide plate, the light emitting element of the invention may be formed over a larger area and light emitted from the light emitting element may be emitted directly toward the liquid crystal device 5512 without using the light guide plate.

FIG. 13B shows a telephone manufactured by using the present invention including a main body 5552 having a display portion 5551, a voice output portion 5554, a voice input portion 5555, operation switches 5556 and 5557, an antenna 5553, and the like. The telephone can be completed by incorporating the light emitting device, including the light emitting element of the invention, as a display portion.

FIG. 13C shows a television set manufactured by using the present invention, including a display portion 5531, a chassis 5532, a speaker 5533, and the like. By incorporating the light emitting device, including the light emitting element of the invention, as a display portion, the television set can be completed.

As described above, the light emitting device of the invention is very suitable for display portions of various electronic devices. Note that the electronic device is not limited to the device described above, and may be a navigation system or other electronic devices.

Among the electronic devices, only the personal computer is described as an example of the light emitting device using the light emitting element of the invention as a light source, incorporated as a backlight; however, it is not limited to a personal computer, and all electronic devices can use the light emitting element of the invention as a light source as long as the backlight is used in the electronic devices.

Embodiment 1

A carbazole derivative used in the light emitting element of the present invention has the structure represented by above mentioned General Formula (1). Reference character $R^1$ specifically refers to hydrogen; a halogen element such as fluorine or chlorine; a cyano group; an alkyl group such as a methyl group, an ethyl group, an isopropyl group, a cyclohexyl group; a haloalkyl group such as a trifluoromethyl group; an alkoxyl group such as a methoxy group, an ethoxy group, an isopropoxy group, a cyclohexyloxy group; an aryl group such as a phenyl group, a naphthyl group, an anthryl group; a heterocycle residue such as an imidazolyl group, an oxathiolyl group, a thiazolyl group; or the like. Reference characters $R^2$ to $R^5$ may refer to the same or different material, and specifically refers to hydrogen; a halogen element such as fluorine or chlorine; a cyano group; an alkyl group such as a methyl group, an ethyl group, an isopropyl group, a cyclohexyl group; an alkoxyl group such as a methoxy group, an ethoxy group, an isopropoxy group, a cyclohexyloxy group; an acyl group such as an acetyl group, an acroyl group, a malonyl group, a benzoyl group, or a naphthoyl group; a haloalkyl group such as a trifluoromethyl group; a dialkylamino group such as a dimethylamino group, a diethylamino group, a diisopropylamino group; a diarylamino group such as a diphenylamino group or a carbazolyl group; a heterocycle residue such as an imidazolyl group, an oxathiolyl group, a thiazolyl group; or the like. Though the specific examples of $R^1$ to $R^5$ are given, $R^1$ to $R^5$ are not limited to these materials.

As specific examples of the carbazole derivative used in the present invention, by changing the structure of $R^1$ to $R^5$ of General Formula (1), for example, carbazole derivatives or the like shown in the following structural formulas (2) to (76) may be used. However, the carbazole derivative used in the present invention is not limited to these structures.

[Chemical Formula 2]

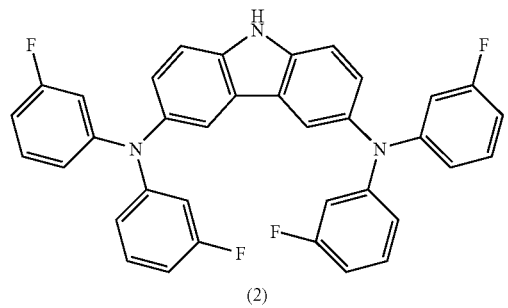

(2)

[Chemical Formula 3]

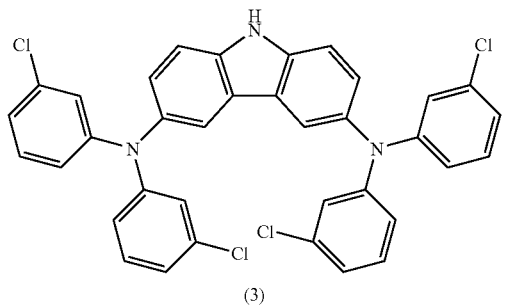

(3)

[Chemical Formula 4]

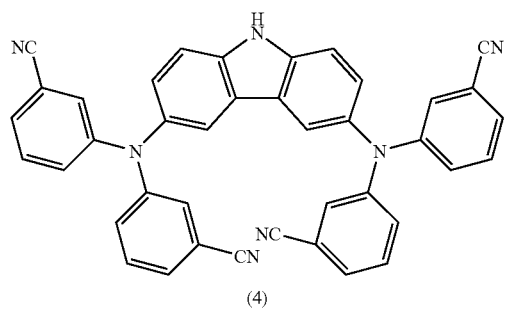

(4)

[Chemical Formula 5]

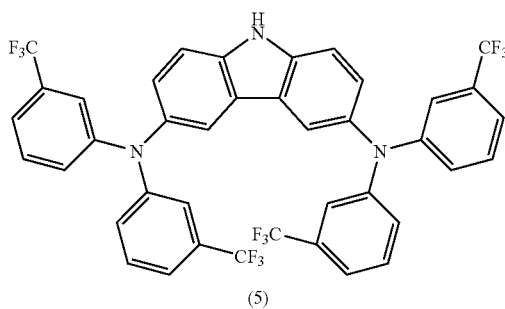

(5)

-continued
[Chemical Formula 6]
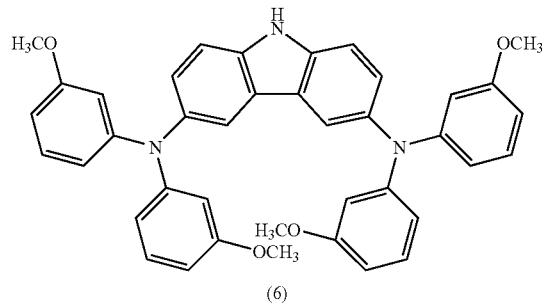
(6)
[Chemical Formula 7]
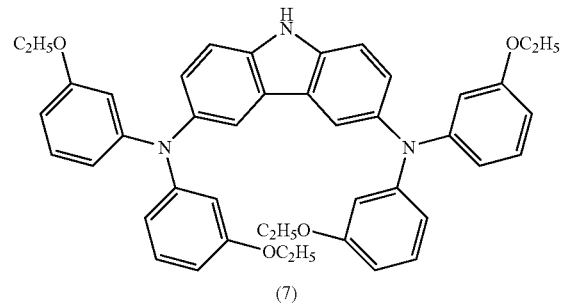
(7)
[Chemical Formula 8]
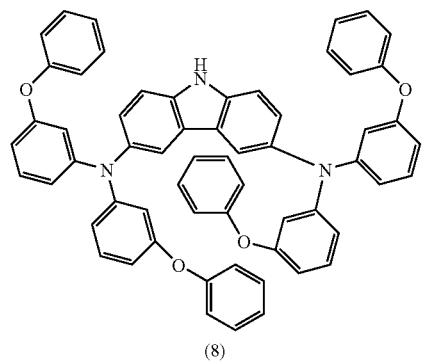
(8)
[Chemical Formula 9]
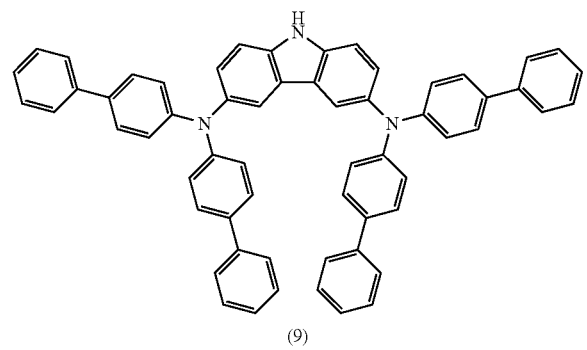
(9)
[Chemical Formula 10]
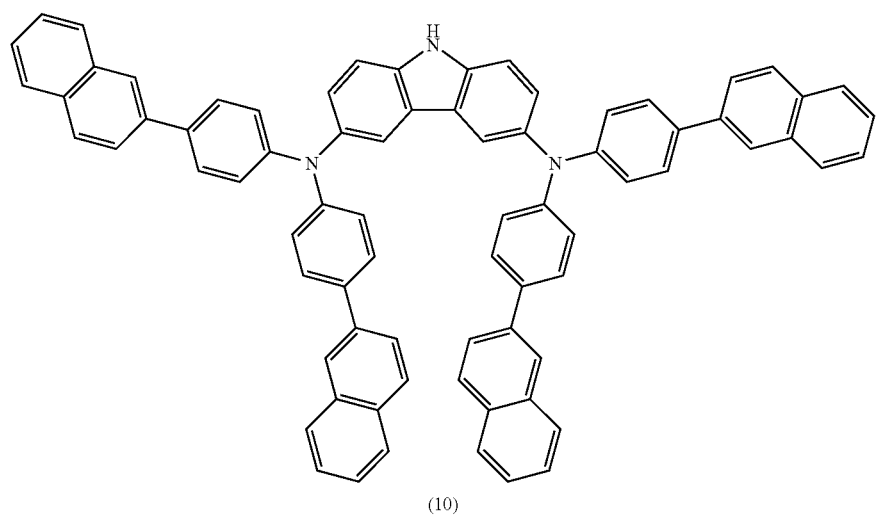
(10)

-continued
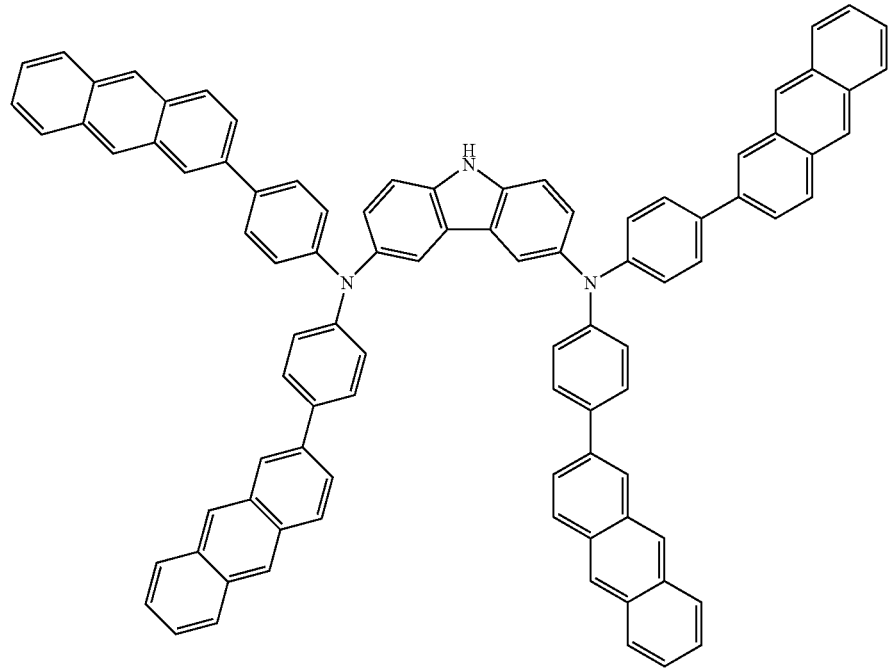
[Chemical Formula 11]
(11)
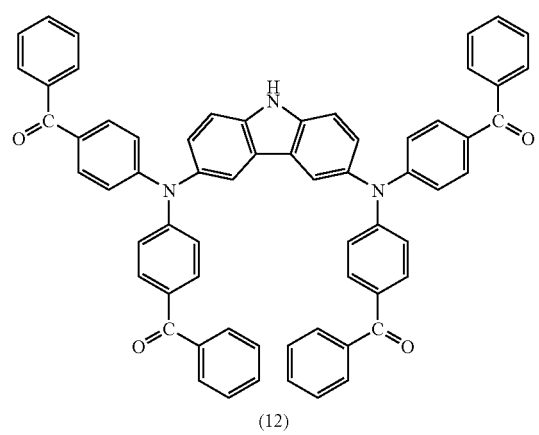
[Chemical Formula 12]
(12)
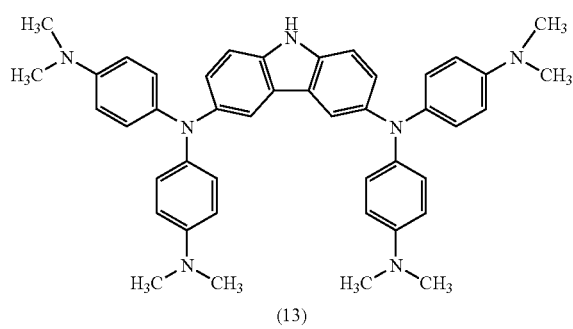
[Chemical Formula 13]
(13)
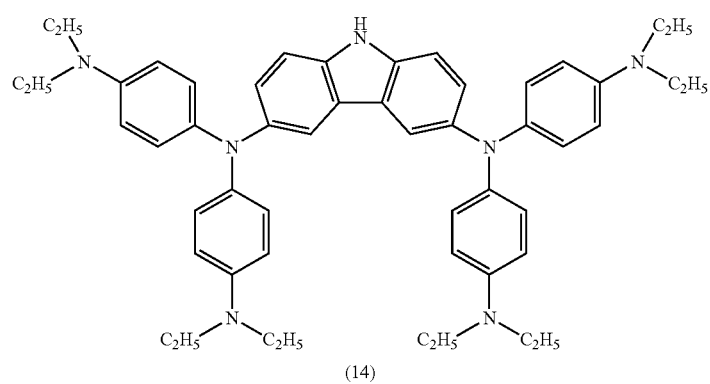
[Chemical Formula 14]
(14)

-continued
[Chemical Formula 15]
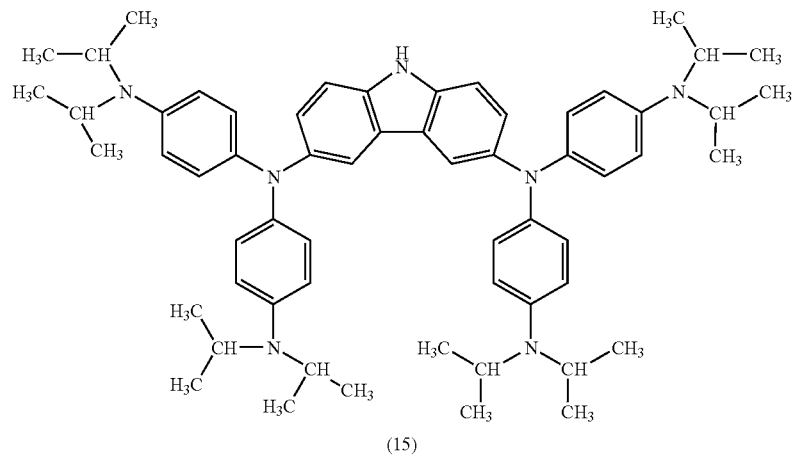
(15)
[Chemical Formula 16]
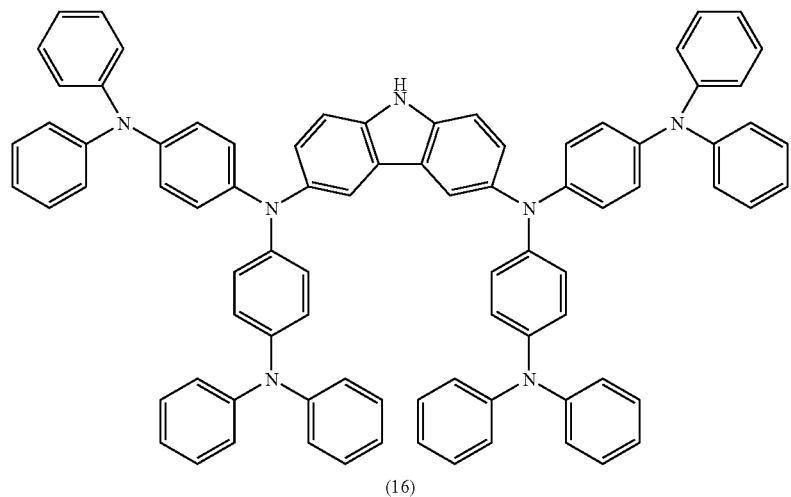
(16)
[Chemical Formula 17]
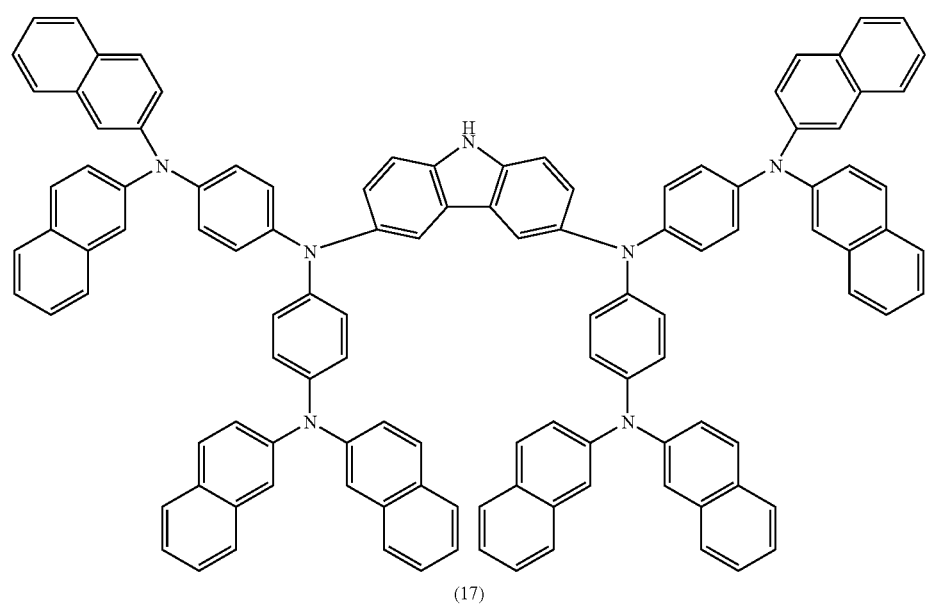
(17)

[Chemical Formula 18]
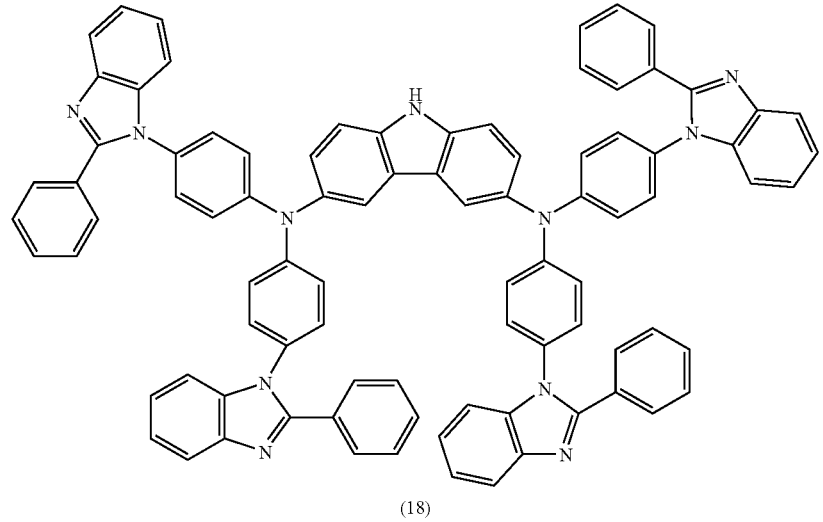
(18)
[Chemical Formula 19]
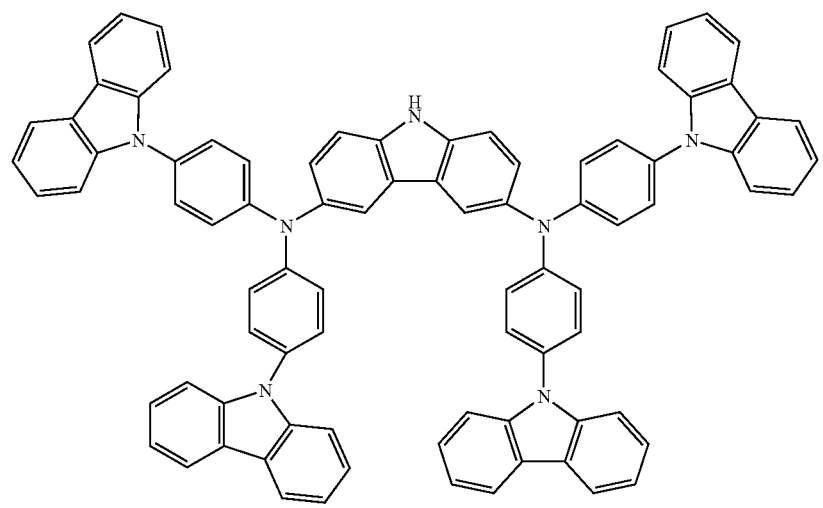
(19)
[Chemical Formula 20]
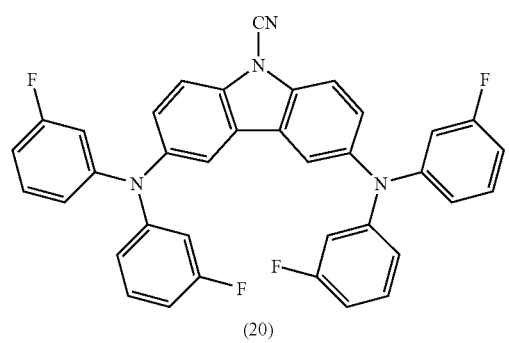
(20)
[Chemical Formula 21]
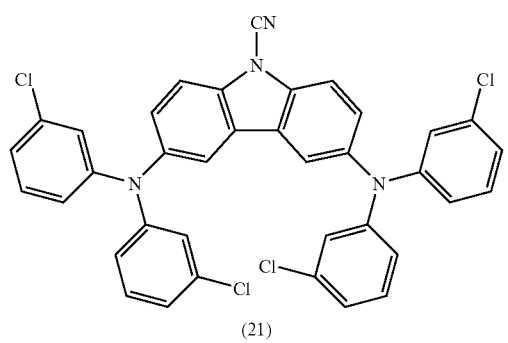
(21)

-continued
[Chemical Formula 22]
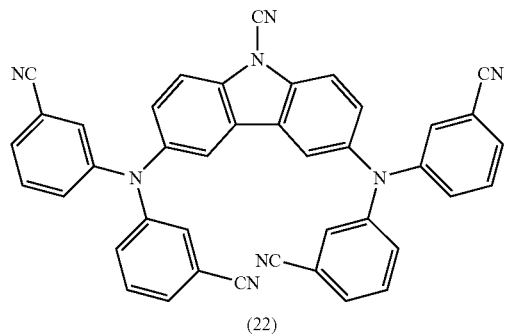
(22)
[Chemical Formula 23]
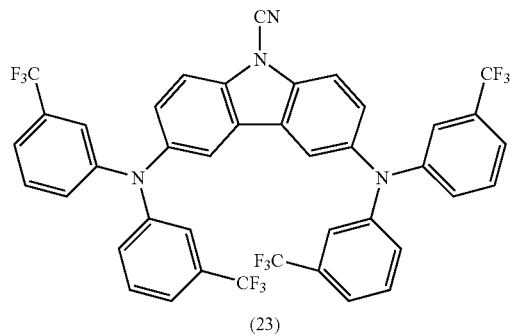
(23)
[Chemical Formula 24]
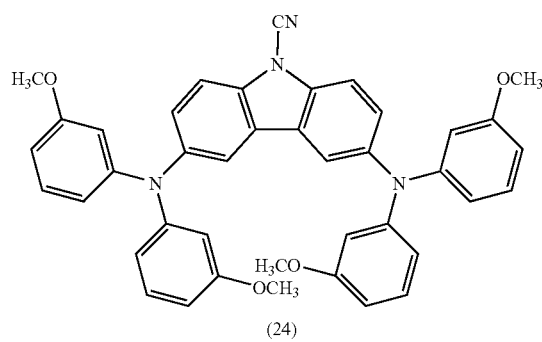
(24)
[Chemical Formula 25]
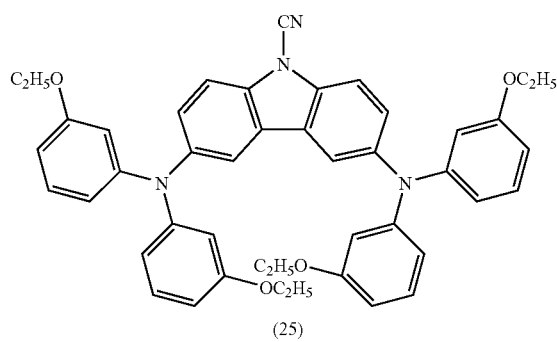
(25)
[Chemical Formula 26]
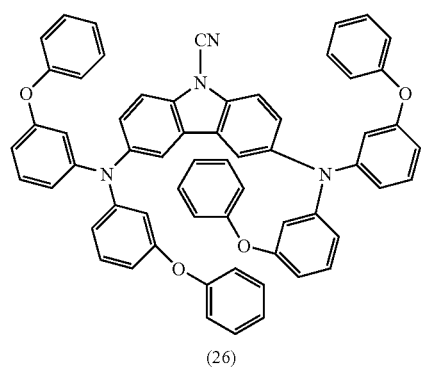
(26)
[Chemical Formula 27]
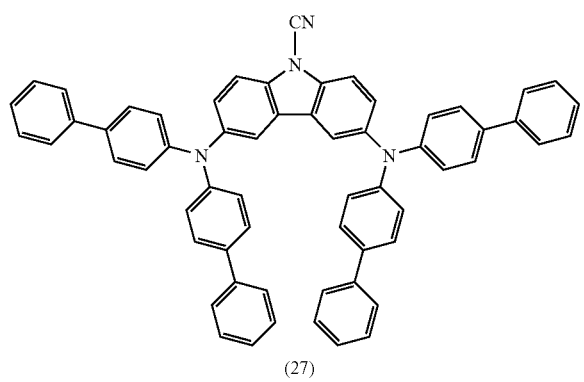
(27)
[Chemical Formula 28]
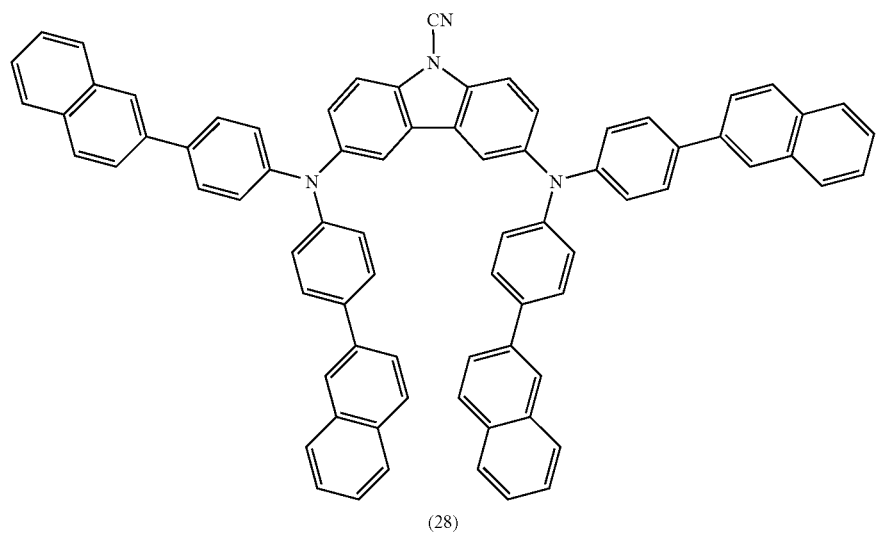
(28)

-continued
[Chemical Formula 29]
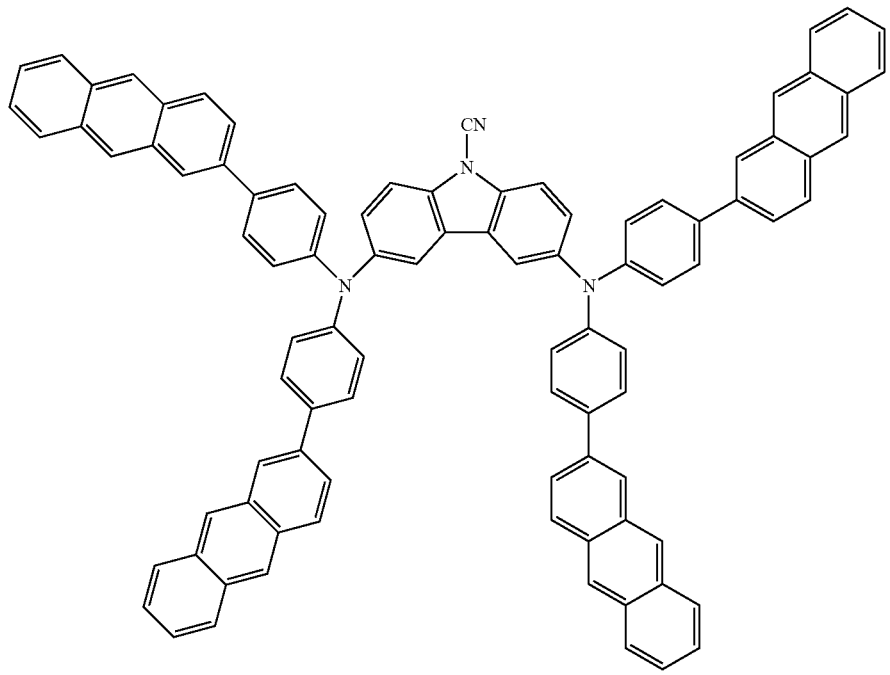
(29)
[Chemical Formula 30]
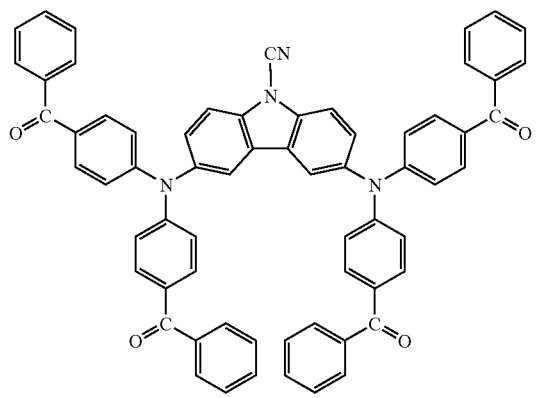
(30)
[Chemical Formula 31]
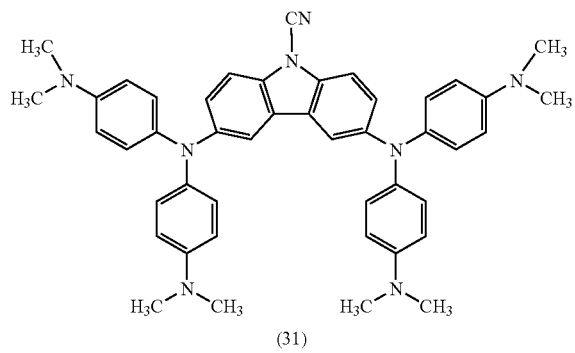
(31)
[Chemical Formula 32]
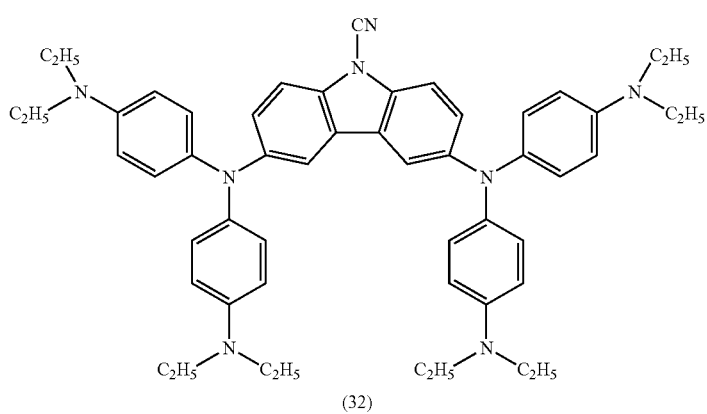
(32)

-continued
[Chemical Formula 33]
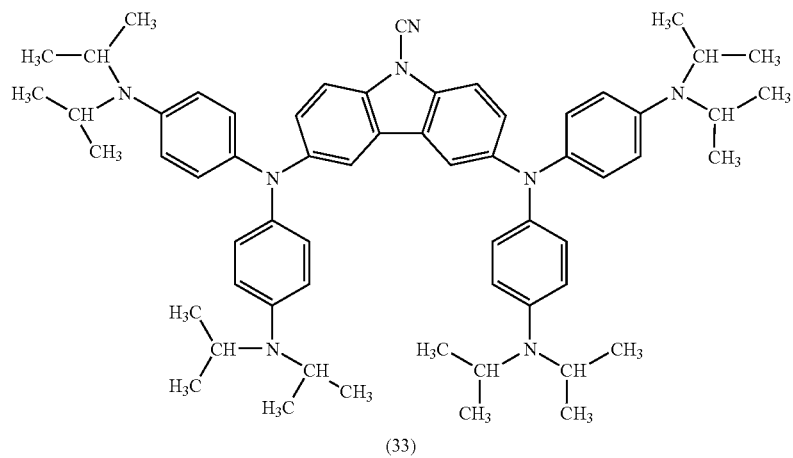
(33)
[Chemical Formula 34]
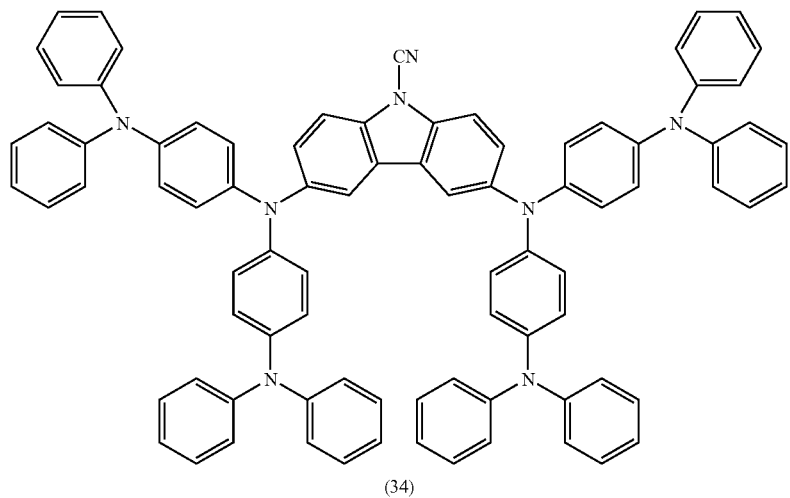
(34)
[Chemical Formula 35]
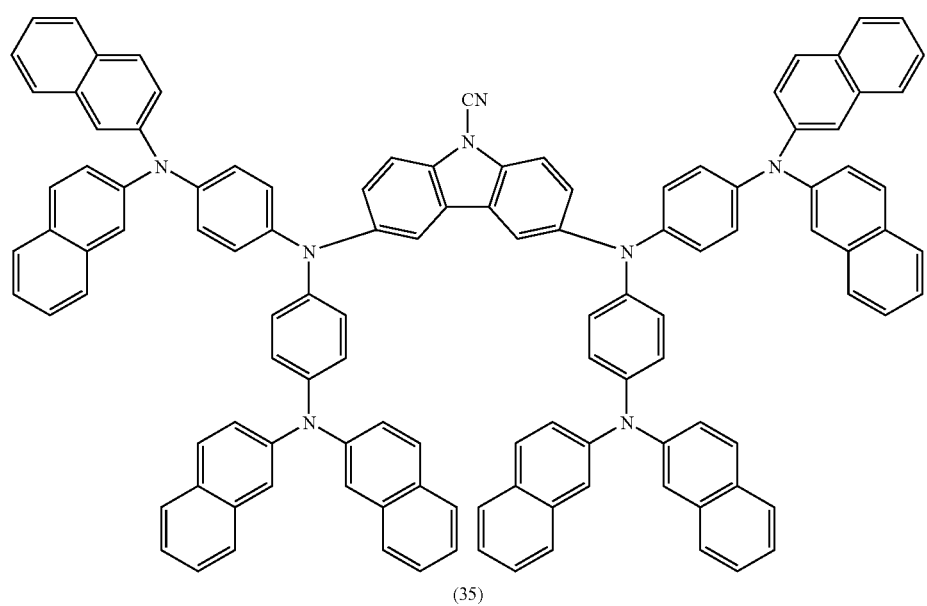
(35)

[Chemical Formula 36]
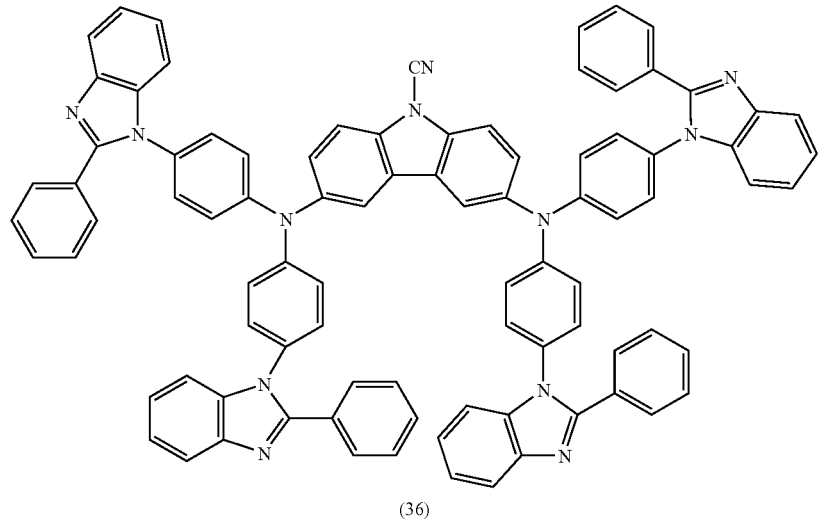
(36)
[Chemical Formula 37]
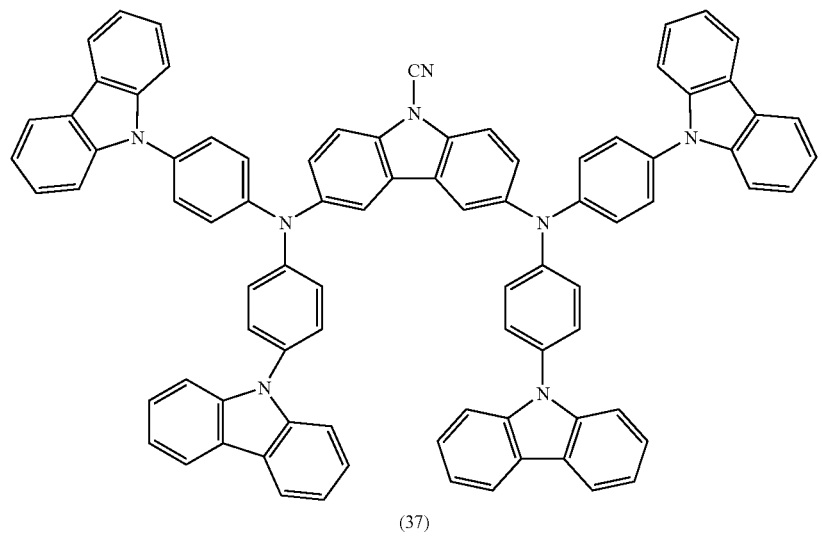
(37)
[Chemical Formula 38]
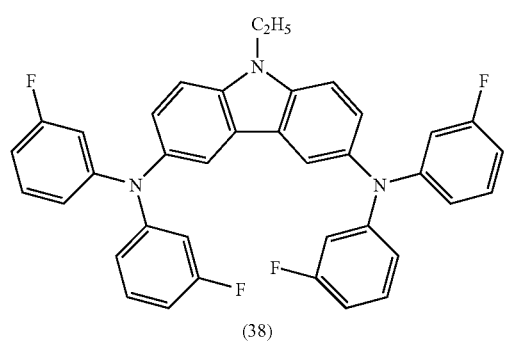
(38)
[Chemical Formula 39]
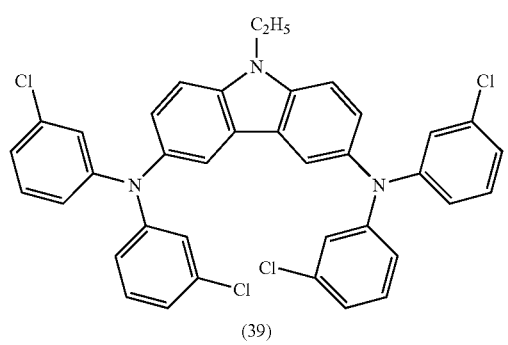
(39)

-continued
[Chemical Formula 40]
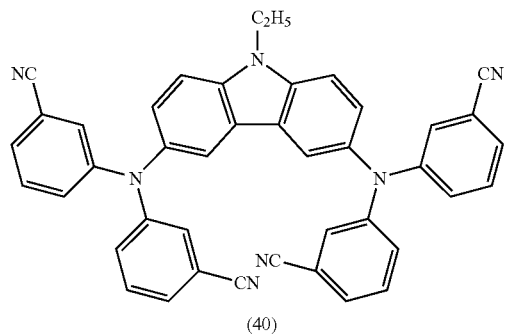
(40)
[Chemical Formula 41]
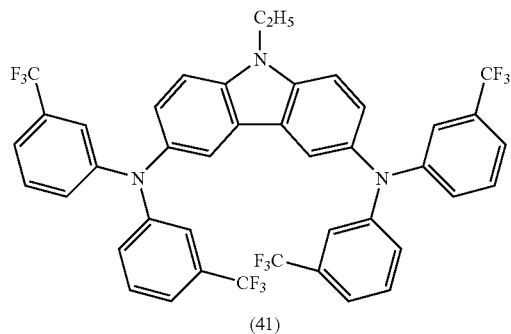
(41)
[Chemical Formula 42]
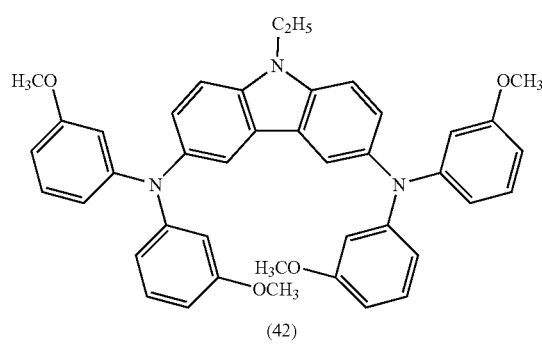
(42)
[Chemical Formula 43]
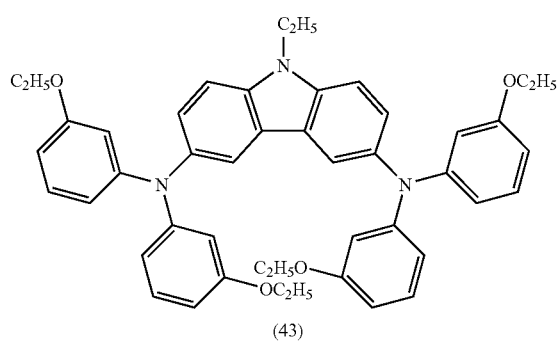
(43)
[Chemical Formula 44]
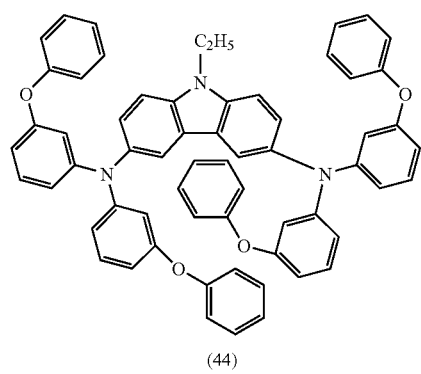
(44)
[Chemical Formula 45]
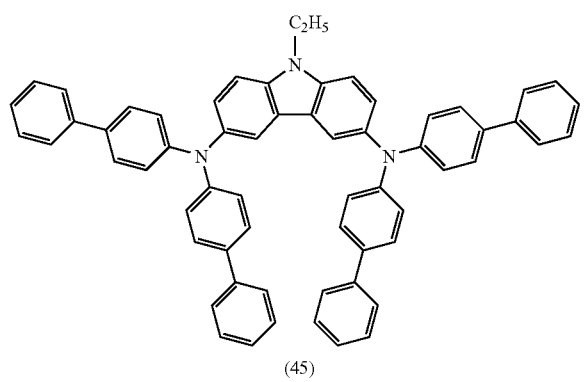
(45)
[Chemical Formula 46]
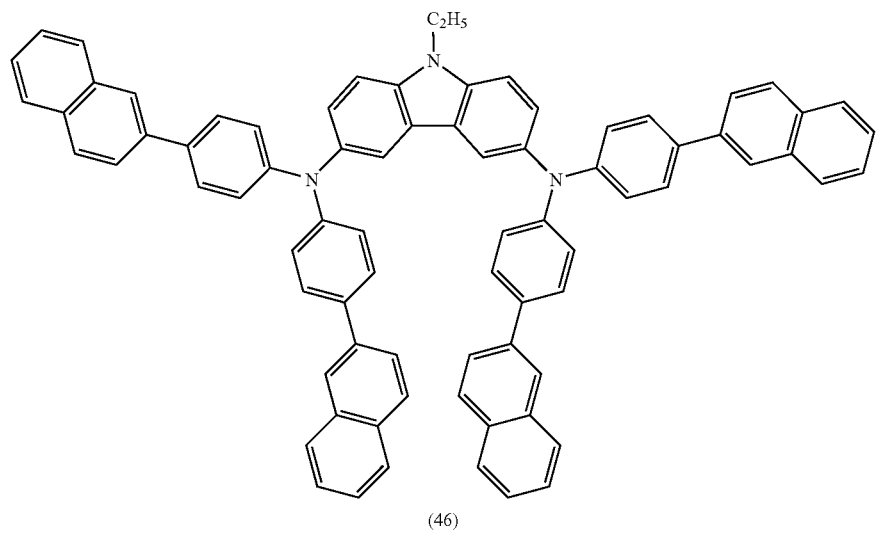
(46)

[Chemical Formula 47]
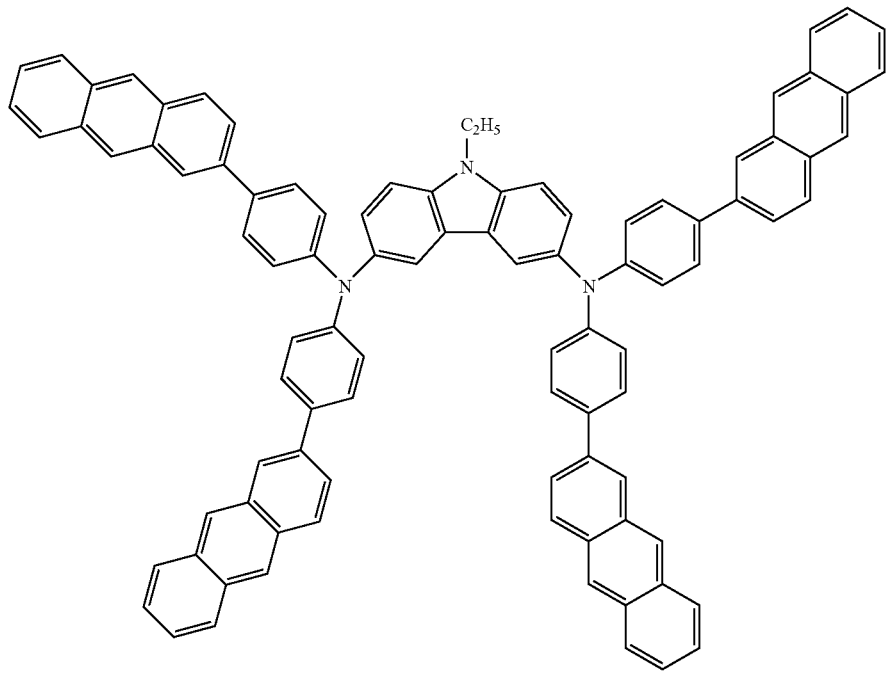
(47)
[Chemical Formula 48]
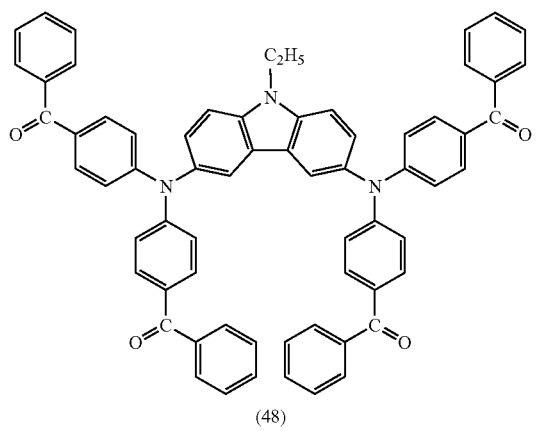
(48)
[Chemical Formula 49]
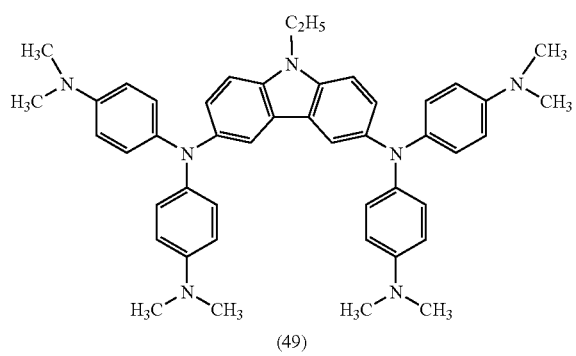
(49)
[Chemical Formula 50]
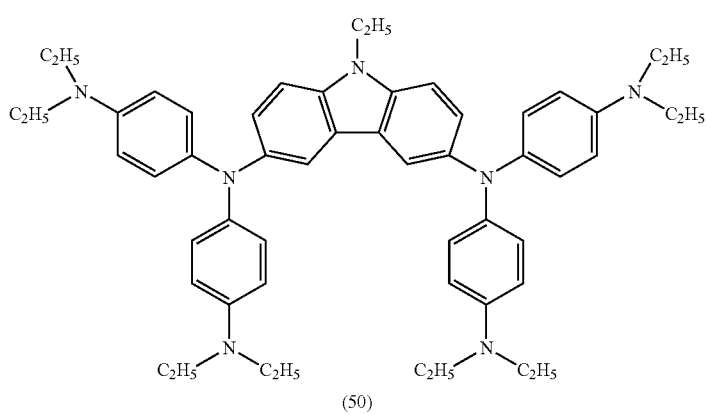
(50)

-continued
[Chemical Formula 51]
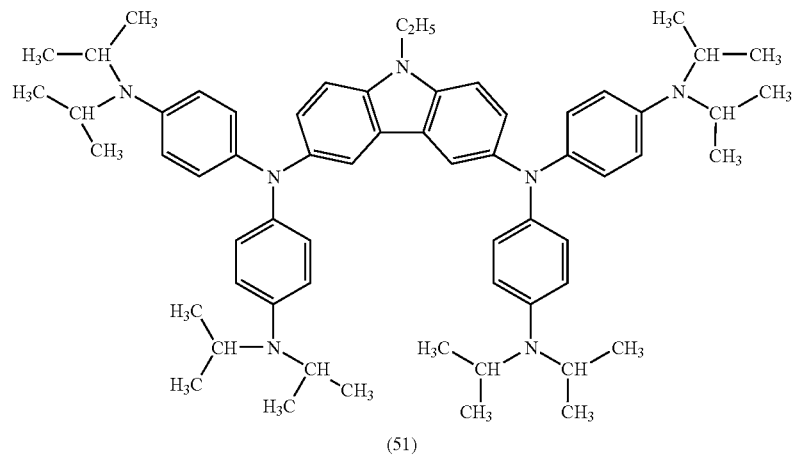
(51)
[Chemical Formula 52]
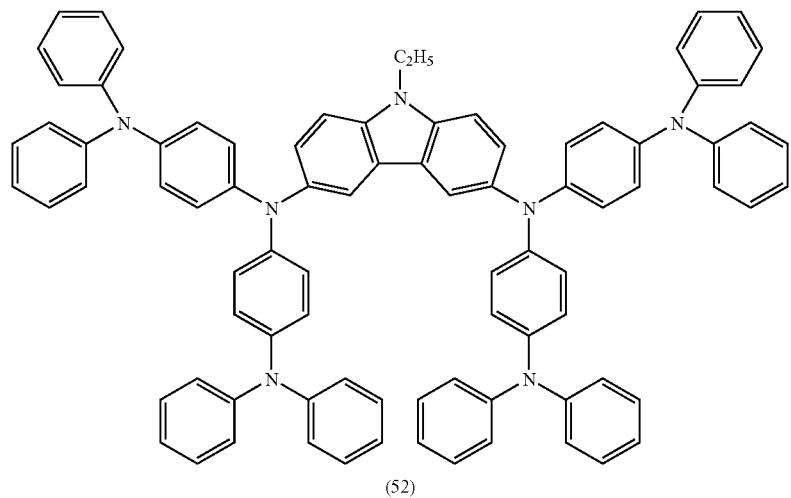
(52)
[Chemical Formula 53]
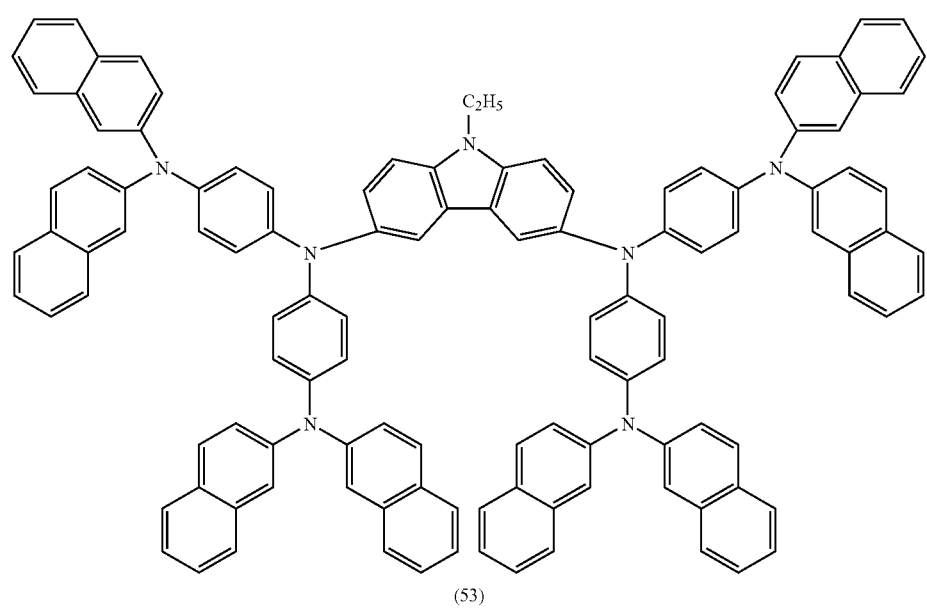
(53)

[Chemical Formula 54]
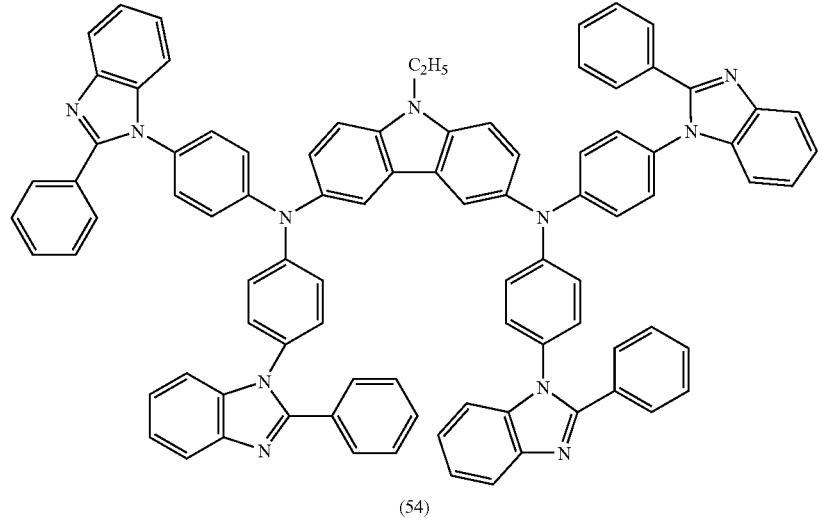
(54)
[Chemical Formula 55]
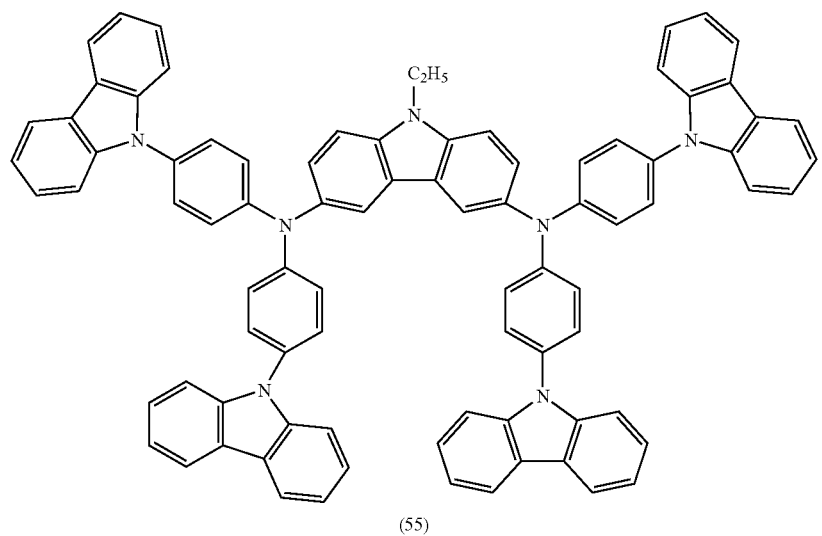
(55)
[Chemical Formula 56]
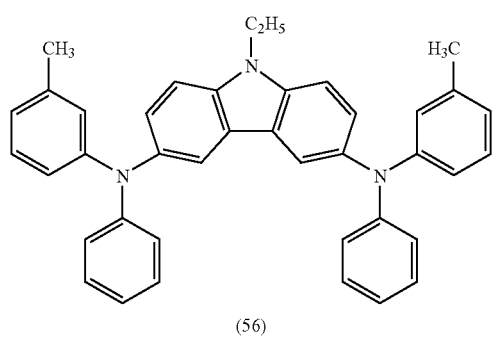
(56)

-continued
[Chemical Formula 57]
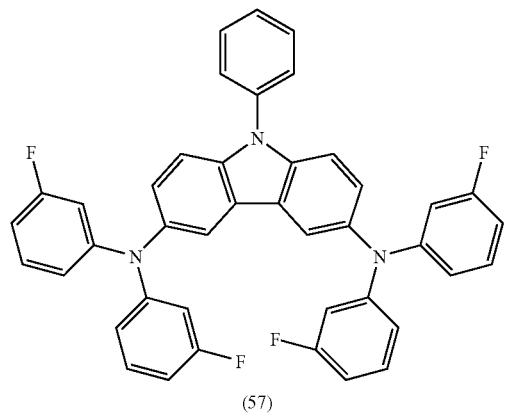
(57)
[Chemical Formula 58]
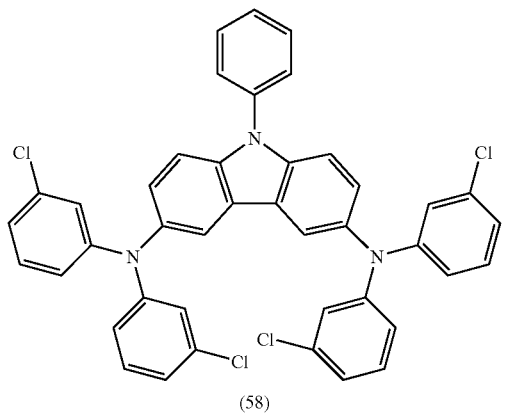
(58)
[Chemical Formula 59]
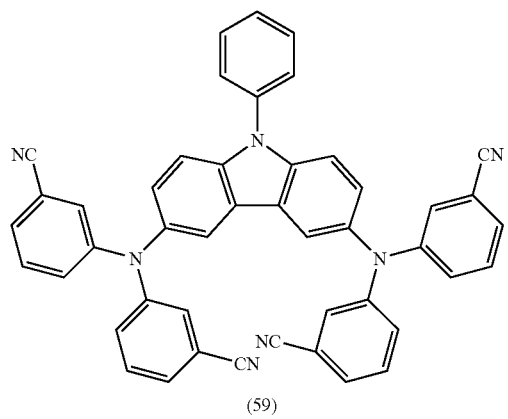
(59)
[Chemical Formula 60]
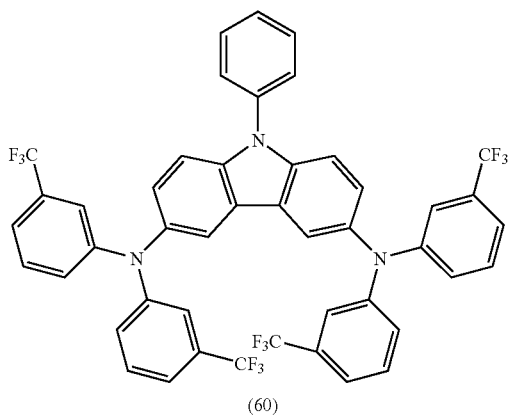
(60)
[Chemical Formula 61]
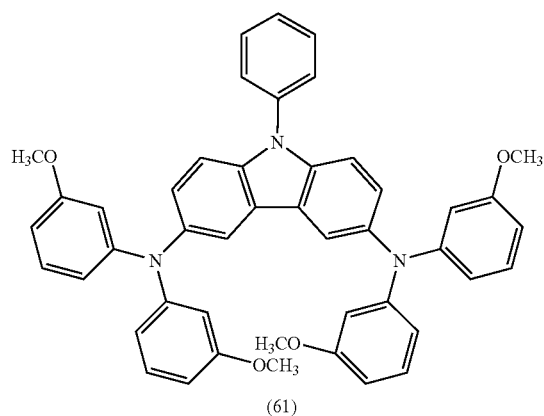
(61)
[Chemical Formula 62]
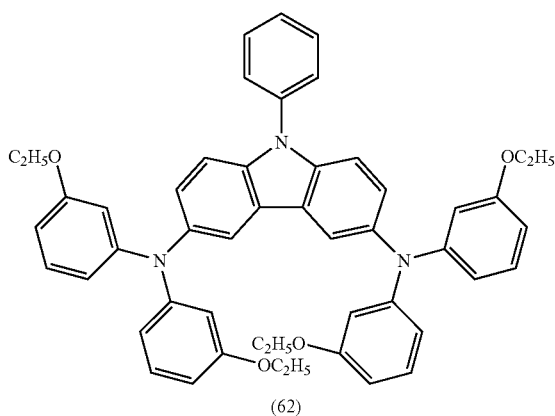
(62)

-continued
[Chemical Formula 63]
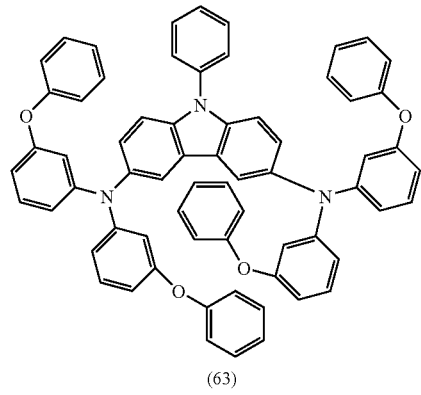
(63)
[Chemical Formula 64]
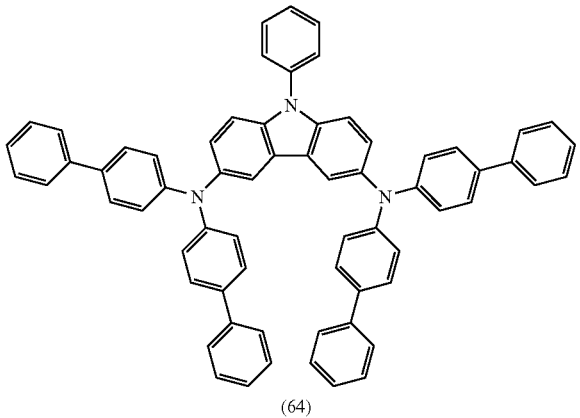
(64)
[Chemical Formula 65]
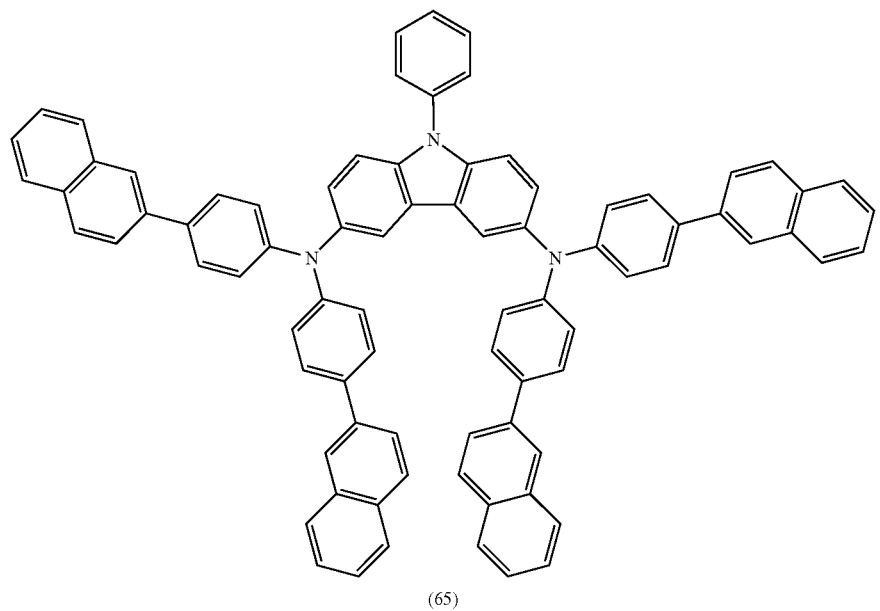
(65)

[Chemical Formula 66]
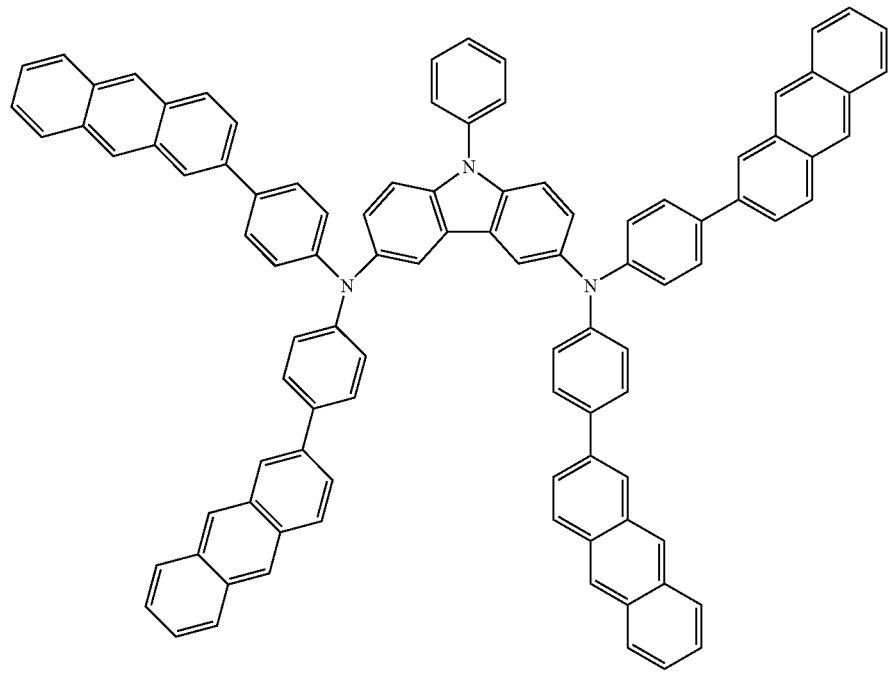
(66)
[Chemical Formula 67]
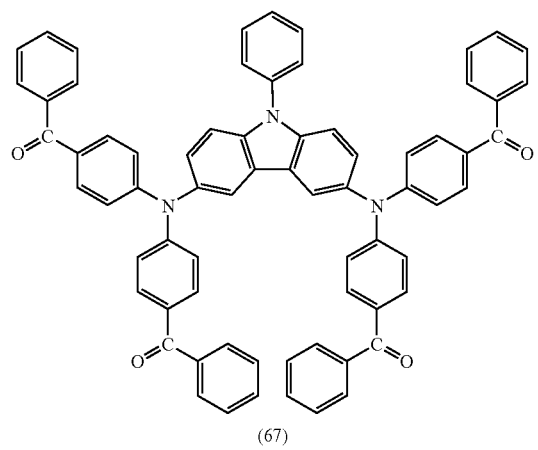
(67)
[Chemical Formula 68]
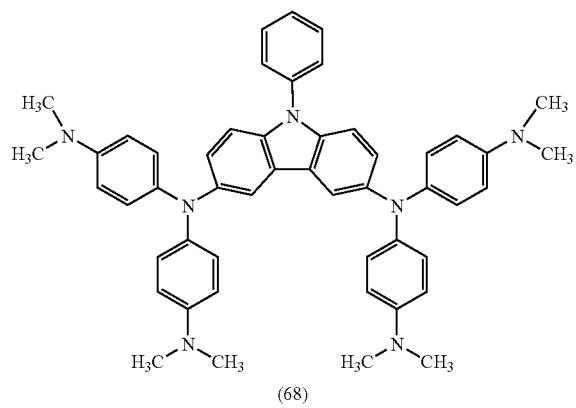
(68)
[Chemical Formula 69]
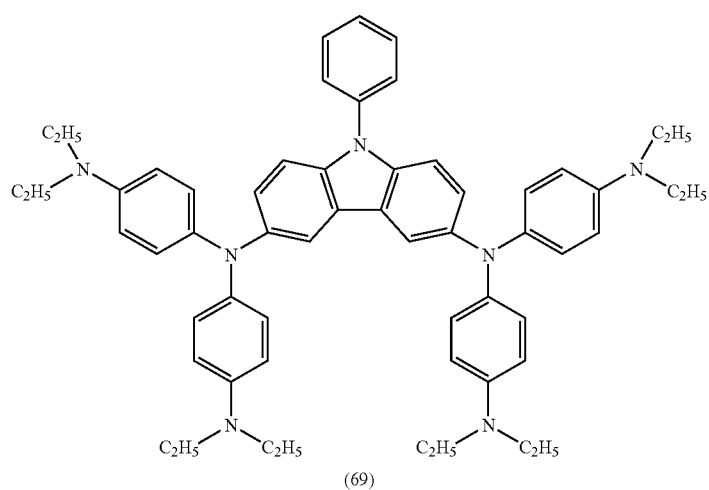
(69)

[Chemical Formula 70]
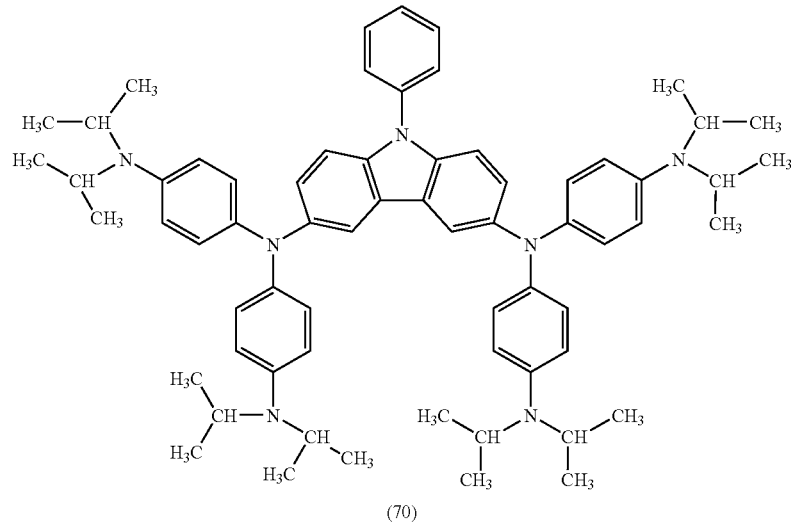
(70)
[Chemical Formula 71]
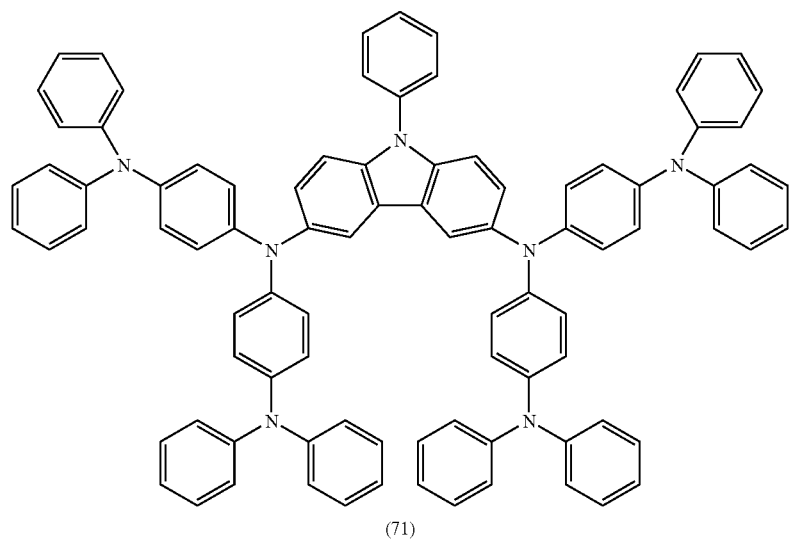
(71)

-continued
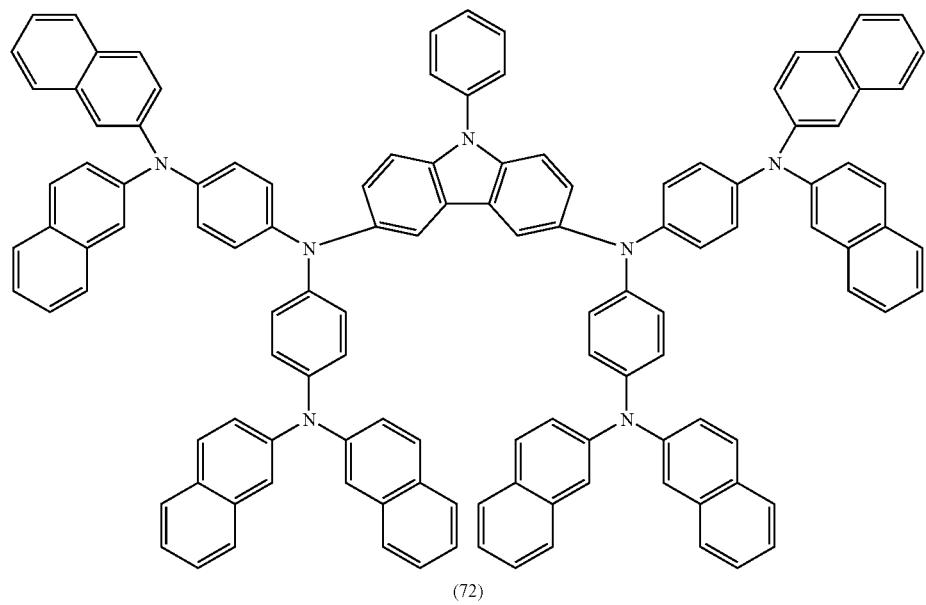
[Chemical Formula 72]
(72)
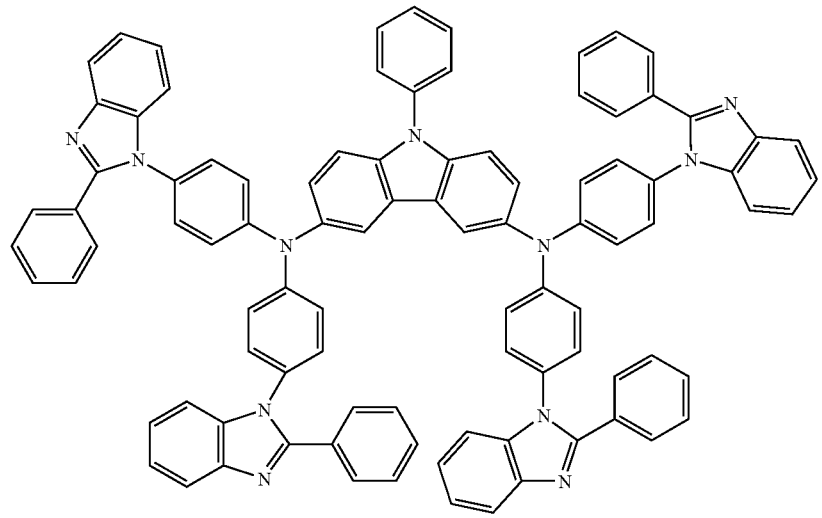
[Chemical Formula 73]
(73)

-continued

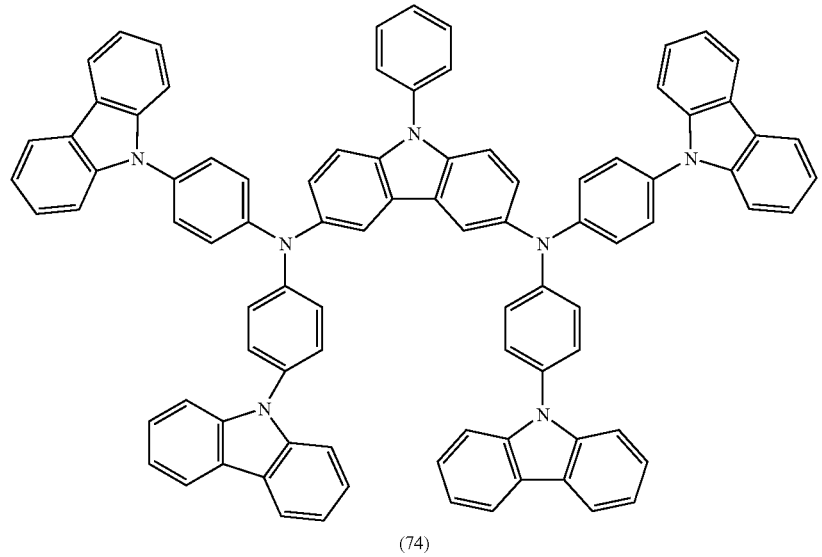

(74)

[Chemical Formula 74]

[Chemical Formula 75]

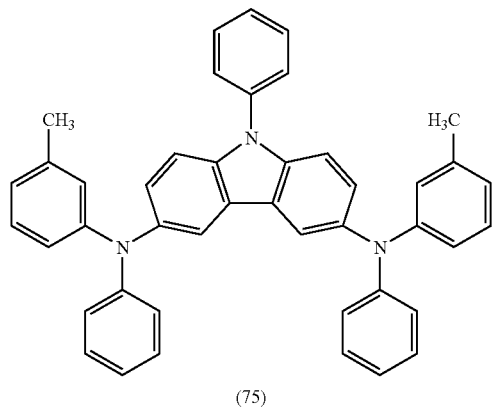

(75)

[Chemical Formula 76]

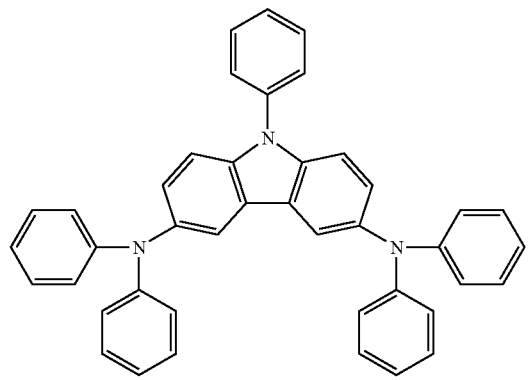

(76)

Embodiment 2

In Embodiment 1, a plurality of specific examples of the carbazole derivative used in the present invention is shown, and various reactions can be applied as a synthetic method of the carbazole derivative used in the present invention. In this embodiment, a specific example of a synthesis of the carbazole derivative represented by the above structural formula (56), which is one example of the carbazole derivative used in the present invention, will be described. The synthetic method of the carbazole derivative shown in the above structural formula (56) used in the present invention is not limited to the above example. Note that a synthetic scheme of the synthetic example of the carbazole derivative represented by the above structure (56) described in this embodiment is shown below.

[Chemical Formula 77]

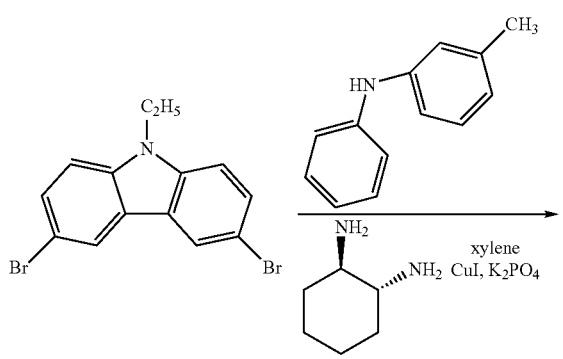

-continued

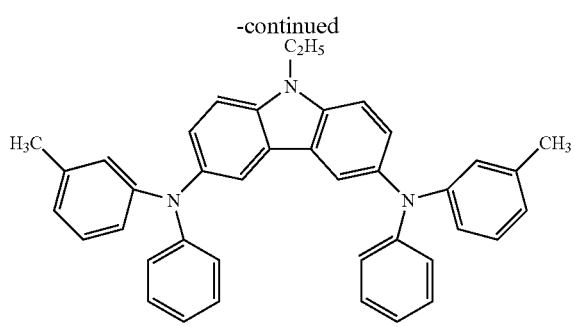

In an argon atmosphere, 16.59 g (30 mmol) of N-ethyl-3, 6-dibromocarbazole and 12.09 g (66 mmol) of N-(3-methylphenyl)-N-phenylamine are dissolved in 1.00 ml of dehydrated xylene. Then, 5.7 g (30 mmol) of copper iodide and 22.8 g (200 mmol) of trans-cyclohexanediamine are added to the xylene solution, and are stirred at 160° C. for 30 minutes. After the stirring, 27.6 g (130 mmol) of potassium phosphate is added, and the mixture is further stirred for 9 days. After the stirring and cooling to a room temperature, 300 ml of toluene is added, and a precipitate is filtered out. The obtained filtrate is condensed, diethyl ether is added to the filtrate, and a precipitate is filtered out. Then, when methanol is added to the obtained filtrate, a tarry object is precipitated on a wall surface of a beaker. The filtrate with the tarry object is left at rest overnight, and the liquid phase is removed by decantation to obtain the tarry object. This obtained tarry object is purified by silica gel column purification using hexane:chloroform (1:2) to obtain 3,6-bis[N-(3-methylphenyl)-N-phenylamino]-9-ethylcarbazole (the above structural formula (56); hereinafter, referred to as EtCzmP2) that is light brownish green powder. The obtained EtCzmP2 is purified by sublimation at a higher temperature of 300° C. and a lower temperature of 200° C. The yield after the sublimation purification is approximately 10%.

According to a thermogravimetry-differential thermal analysis (TG-DTA) measurement, it is found that the decomposition temperature of the obtained EtCzmP2 is 310° C. When vacuum evaporation is used to deposit the EtCzmP2, it is possible to form an uniform film.

Figure 15:
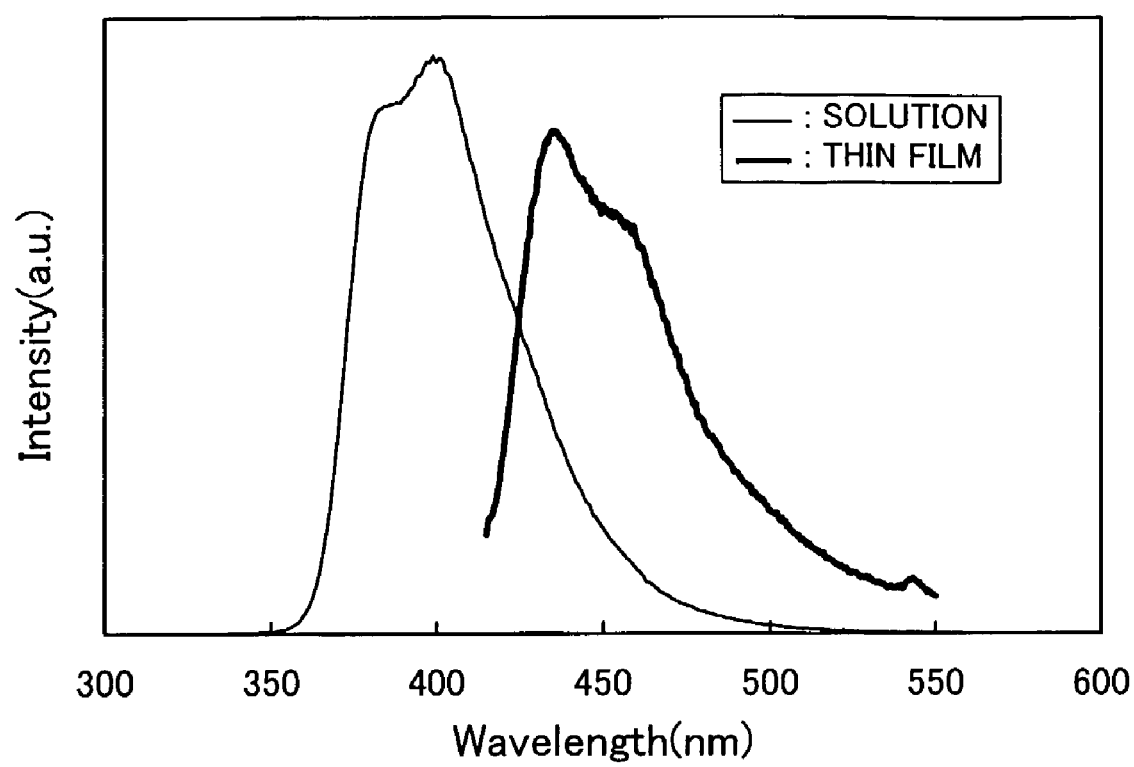
FIG. 15 shows fluorescence spectra of a carbazole derivative used in the present invention.
Figure 16:
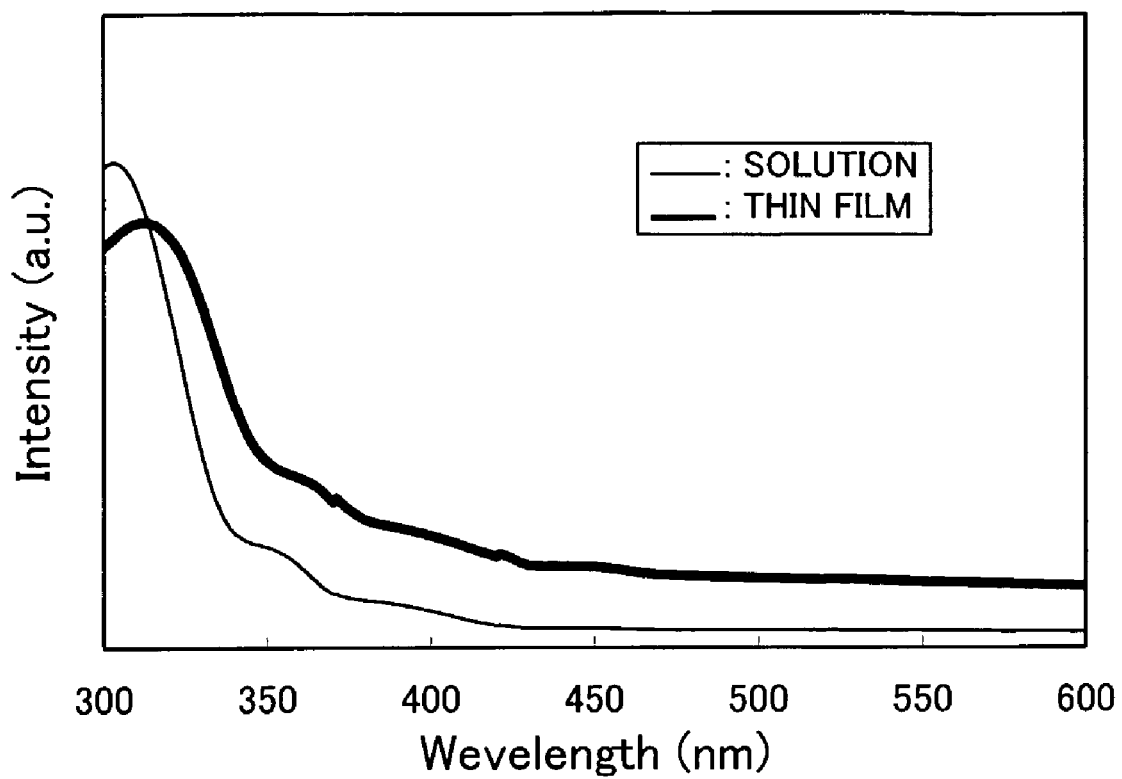
FIG. 16 shows UV-Vis absorption spectra of a carbazole derivative used in the present invention.

When fluorescence spectra of a thin film and a solution (solvent: methanol) of the obtained EtCzmP2 are measured, the obtained fluorescence spectra respectively have a maximum peak at 435 nm with respect to an excitation wavelength (312 nm) in the case of the thin film and a maximum peak at 400 nm with respect to an excitation wavelength (290 nm) in the case of the solution (FIG. 15). In addition, when UV-Vis absorption spectra of the thin film and solution (solvent: methanol) of the obtained EtCzmP2 are measured, a maximum absorption wavelength of 312 nm is obtained in the case of the thin film and a maximum absorption wavelength of 303 nm is obtained in the case of the solution (FIG. 16).

Further, the value of a HOMO level that is measured by using Photoelectron Spectrometer AC-2 (manufactured by Riken Keiki Co., Ltd.) is −5.18 eV. In addition, the value of a LUMO level that is estimated by adding the value of an absorption edge of the absorption spectrum (FIG. 16), as an energy gap, to the value of the HOMO level is −1.71 eV.

Embodiment 3

In this embodiment, an example of synthesis of the carbazole derivative represented by the above-mentioned structural formula (75), which is one example of the carbazole derivative used in the invention, will be specifically described.

In the present embodiment, a raw material, 12.03 g (30 mmol) of N-phenyl-3,6-dibromocarbazole is used to obtain 3,6-bis[N-(3-methylphenyl)-N-phenylamino]-9-phenylcarbazole (hereinafter, referred to as PhCzmP2), that is the carbazole derivative represented by the above structural formula (75), in the same way as in Embodiment 2 described above. The obtained PhCzmP2 is purified by sublimation at a higher temperature of 290° C. and a lower temperature of 90° C. The yield after the sublimation purification is approximately 10%.

Figure 17:
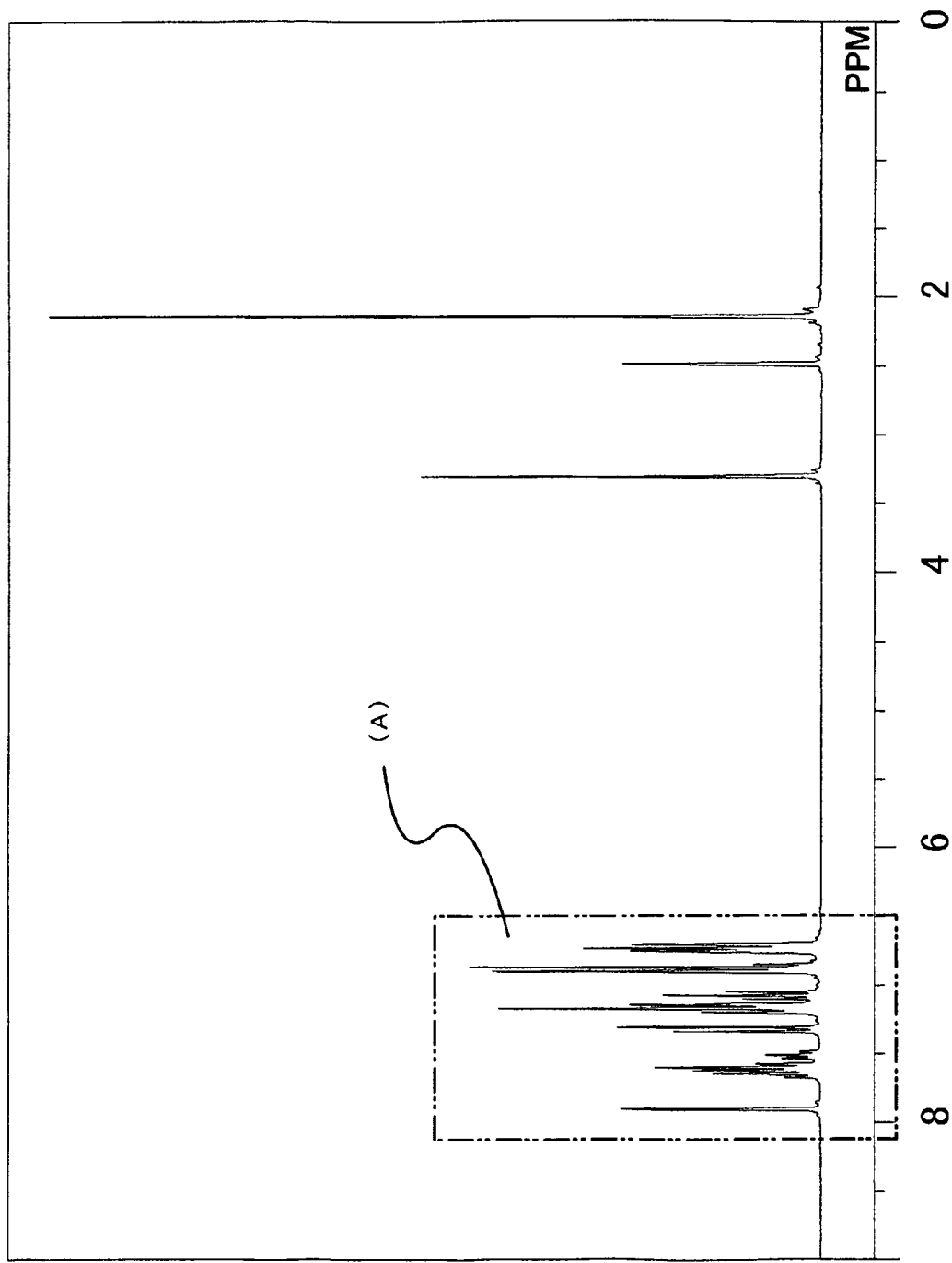
FIG. 17 shows a $^1$H NMR spectrum of a carbazole derivative used in the present invention.
Figure 18:
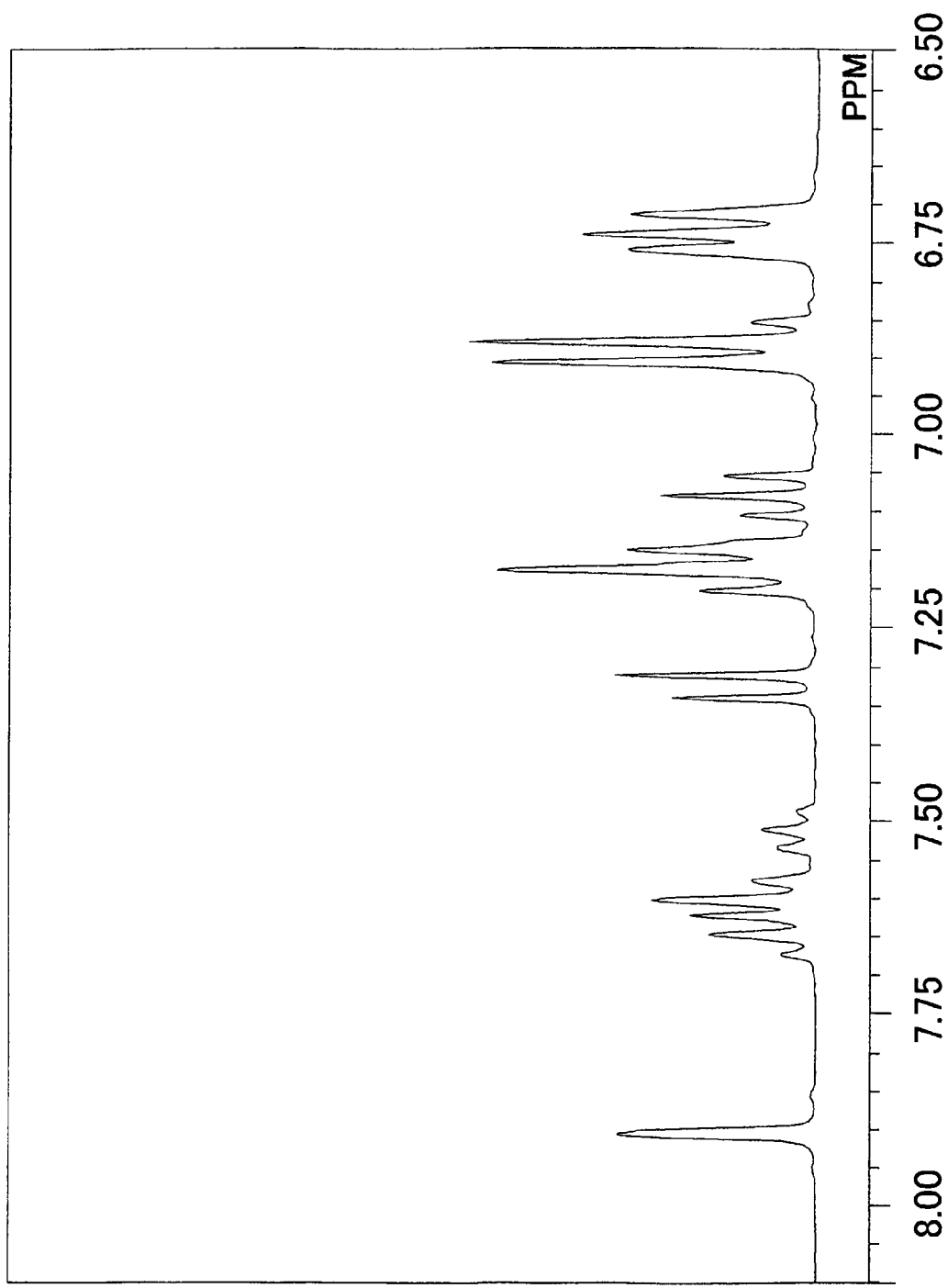
FIG. 18 is an enlarged view of an $^1$H NMR spectrum of a carbazole derivative used in the present invention.

FIG. 17 shows a $^1$H NMR spectrum of the obtained PhCzmP2, and FIG. 18 shows an enlarged view of a region (A) surrounded by a dashed line in FIG. 17. In FIGS. 17 and 18, a longitudinal axis indicates relative intensity of signals, and a lateral axis indicates the dimensionless value δ, which is the difference of resonant frequency between a sample and a reference sample divided by frequency of an oscillator.

Data of the $^1$H NMR of the obtained PhCzmP2 is as follows:

$^1$H NMR (300 MHz, DMSO-d) δ=3.31 (s, 6H), 6.74 (s, 2H), 6.75 (d, j=6.0, 4H), 6.85-6.91 (m, 6H), 7.08 (t, j=7.8, 2H), 7.15-7.20 (m, 6H), 7.33 (d, j=8.7, 2H), 7.51 (t, j=7.2, 1H), 7.58-7.68 (m, 4H), 7.91 (s, 2H).

It is found that the decomposition temperature of the obtained PhCzmP2 is 230° C. When vacuum evaporation is used to deposit the PhCzmP2, it is possible to form an uniform film.

Figure 19:
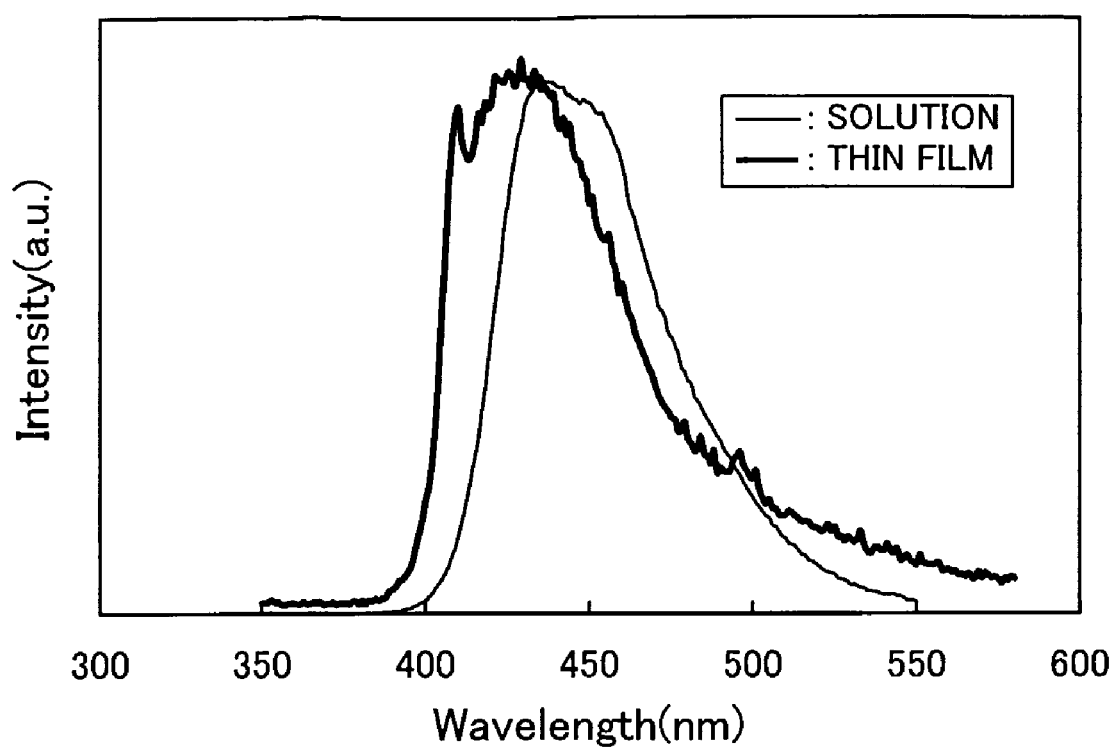
FIG. 19 shows fluorescence spectra of a carbazole derivative used in the present invention.
Figure 20:
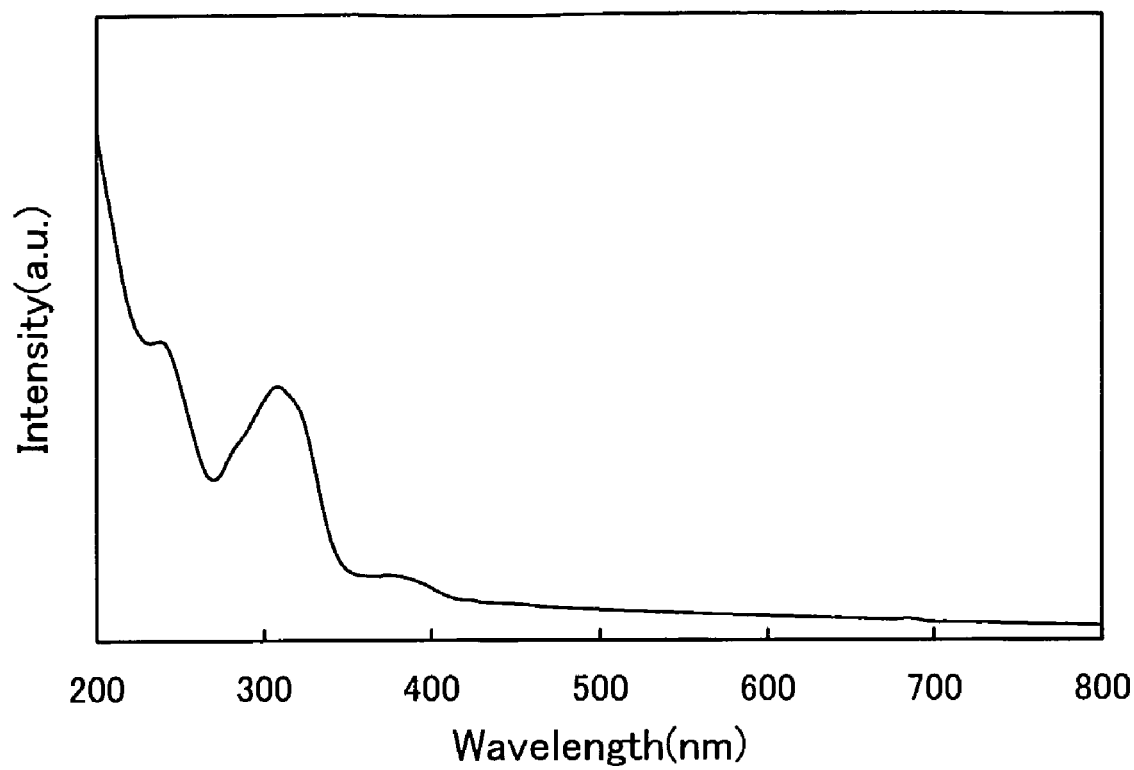
FIG. 20 shows an UV-Vis absorption spectrum of a carbazole derivative used in the present invention.

When fluorescence spectra of a thin film and solution (solvent: methanol) of the obtained PhCzmP2 are measured, the obtained fluorescence spectra have a maximum peak at 430 nm with respect to an excitation wavelength (308 nm) in the case of the thin film and a maximum peak at 439 nm with respect to an excitation wavelength (320 nm) in the case of the solution (FIG. 19). In addition, when an UV-Vis absorption spectrum of the thin film of the obtained PhCzmP2 is measured, a maximum absorption wavelength of 308 nm is obtained (FIG. 20).

Further, the values of a HOMO level and a LUMO level that are measured in the same way as in Embodiment 2 described above are −5.40 eV and −2.39 eV, respectively.

Embodiment 4

In this embodiment, an example of synthesis of the carbazole derivative represented by the above-mentioned structural formula (76), which is one example of the carbazole derivative used in the present invention, will be specifically described.

Figure 21:
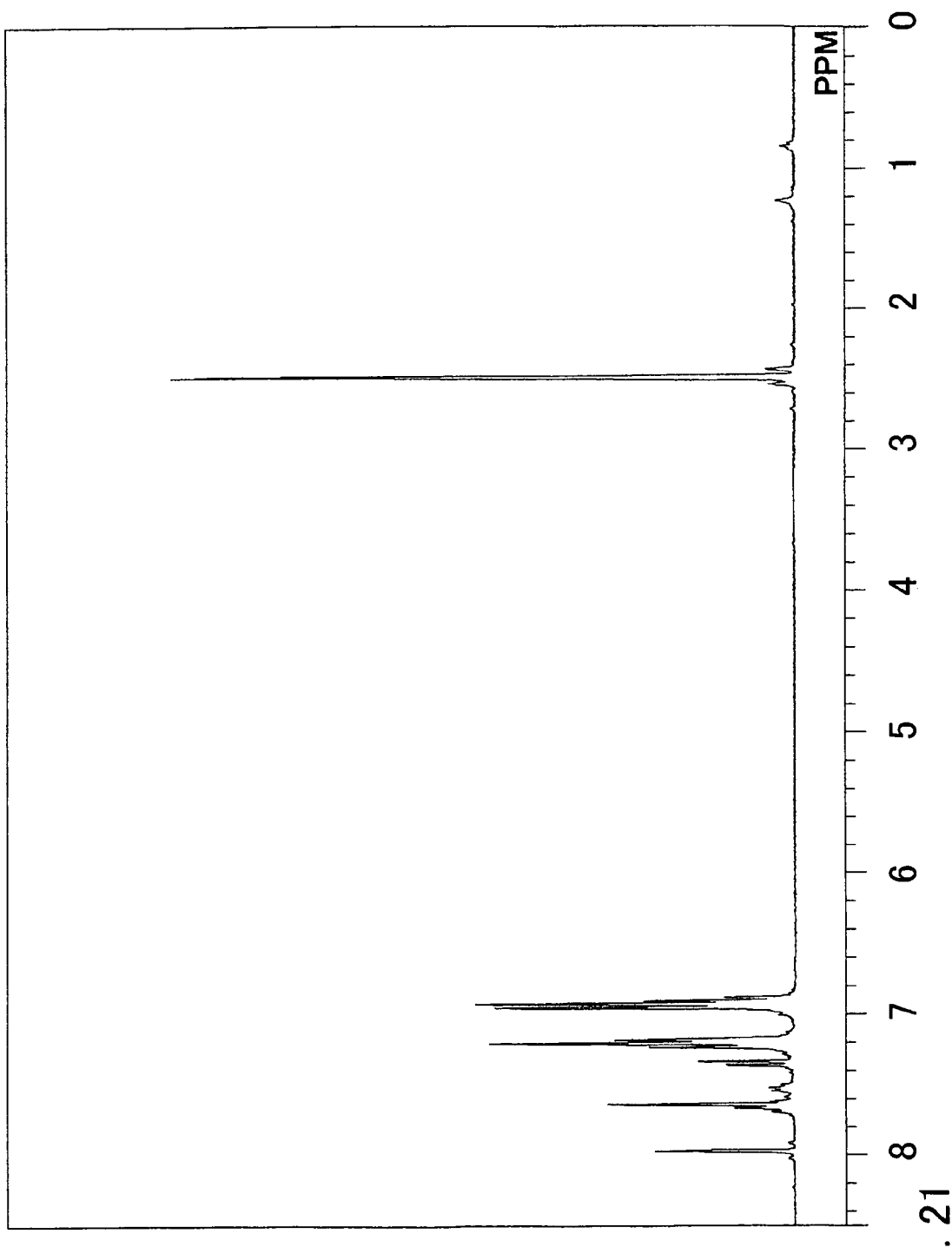
FIG. 21 shows a $^1$H NMR spectrum of a carbazole derivative used in the present invention.
Figure 22:
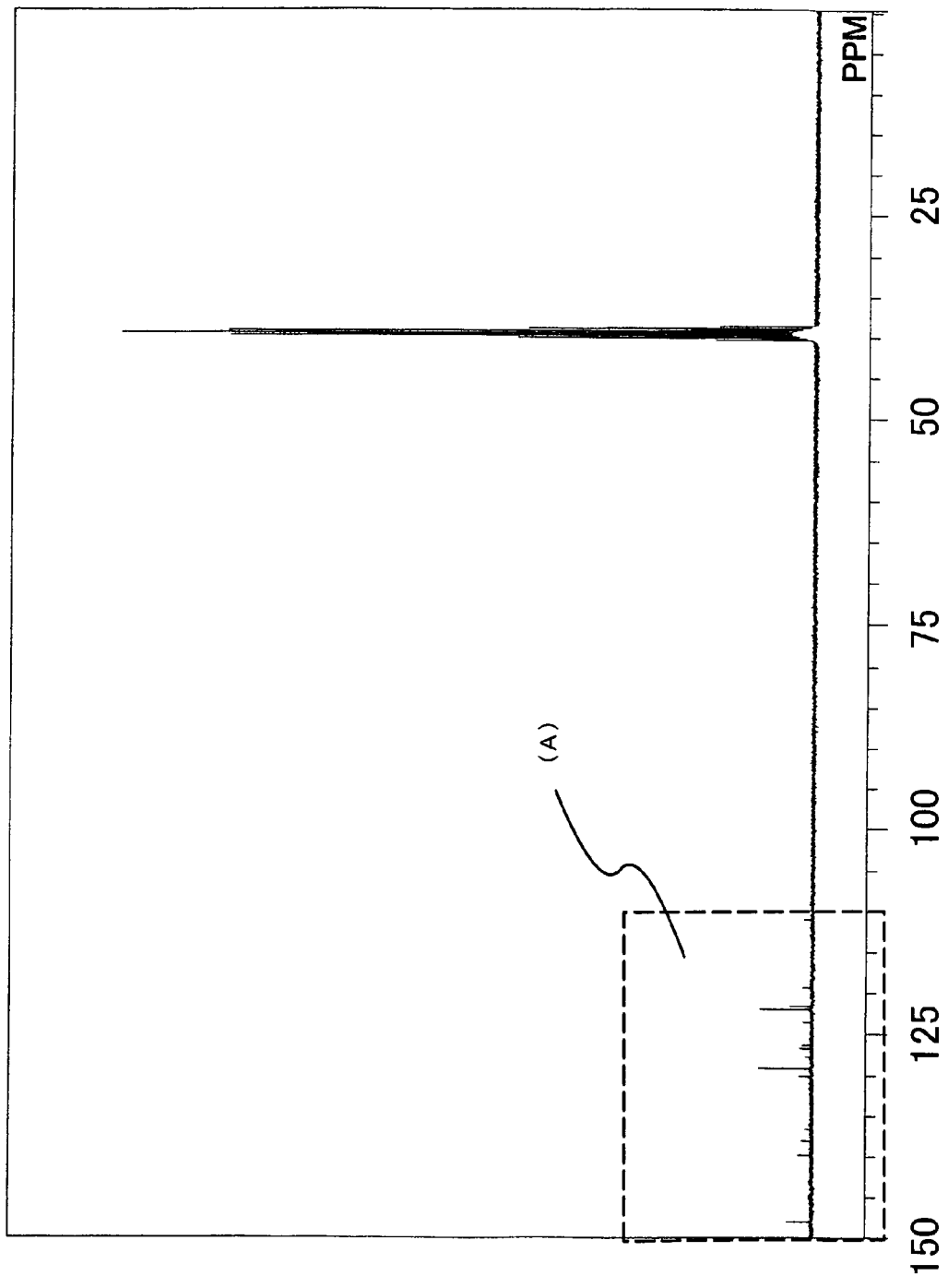
FIG. 22 shows a $^{13}$C NMR spectrum of a carbazole derivative used in the present invention.
Figure 23:
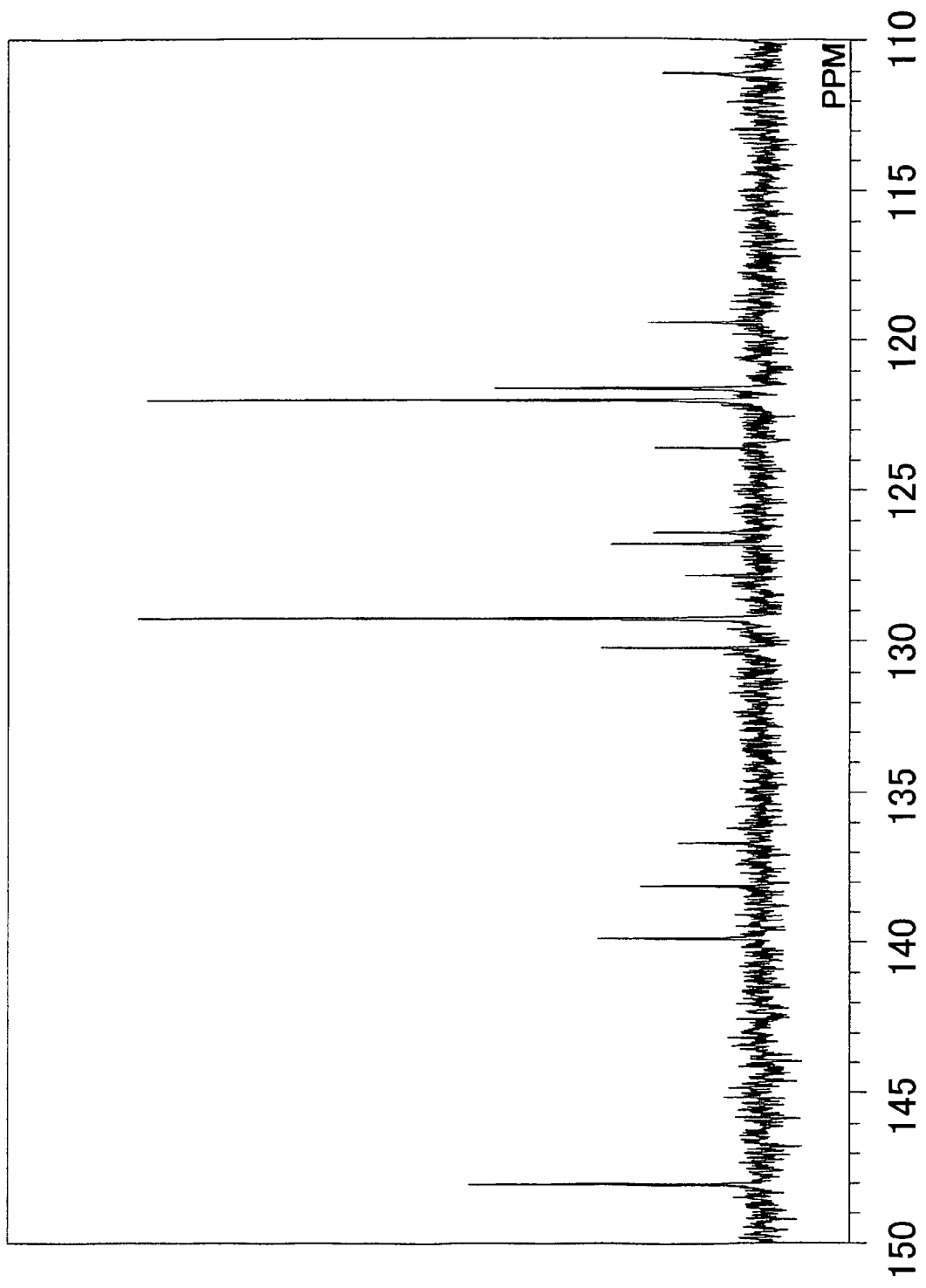
FIG. 23 is an enlarged view of a $^{13}$C NMR spectrum of a carbazole derivative used in the present invention.

In the present embodiment, raw materials, 12.03 g (30 mmol) of N-phenyl-3,6-dibromocarbazole and 12.18 g (72 mmol) of diphenylamine are used to obtain 3,6-bis(N,N-diphenylamino)-9-phenylcarbazole (hereinafter, referred to as PhCzP2), that is the carbazole derivative represented by the above structural formula (76), in the same way as in Embodiment 2 described above. The obtained PhCzP2 is purified by sublimation at a higher temperature of 270° C. and a lower temperature of 175° C. The yield after the sublimation purification is approximately 50%. FIG. 21 shows a $^1$H NMR spectrum of the obtained PhCzP2, FIG. 22 shows a $^{13}$C NMR spectrum of the obtained PhCzP2, and FIG. 23 shows an enlarged view of a region (A) surrounded by a dashed line in FIG. 22. In FIGS. 21 to 23, a longitudinal axis indicates relative intensity of signals, and a lateral axis indicates the dimensionless value δ which is the difference of resonant frequency between a sample and an authentic sample divided by frequency of an oscillator. Data of $^1$H NMR and $^{13}$C NMR of the obtained PhCzP2 is as follows:

$^1$H NMR (300 MHz, DMSO-d) δ=6.88-6.95 (m, 12H), 7.17-7.23 (m, 10H), 7.35 (d, j=4.5, 6H), 7.56-7.69 (m, 5H), 7.97 (s, 2H)

$^{13}$C NMR (75 MHz, DMSO-d) δ=111.1, 119.4, 121.6, 122.0, 123.6, 126.4, 126.8, 127.8, 129.3, 130.2, 136.7, 138.2, 139.9, 148.0.

According to a TG-DTA measurement, it is found that the decomposition temperature of the obtained PhCzP2 is 365° C. When vacuum evaporation is used to deposit the PhCzP2, it is possible to form a uniform film.

Figure 24:
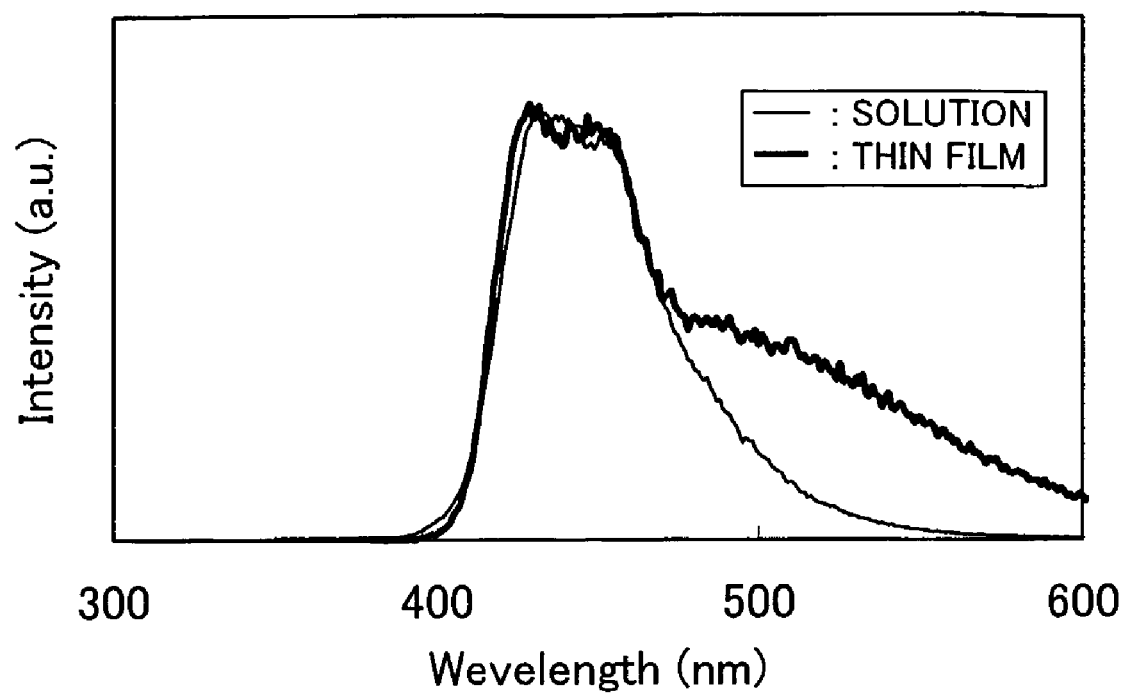
FIG. 24 shows fluorescence spectra of a carbazole derivative used in the present invention.
Figure 25:
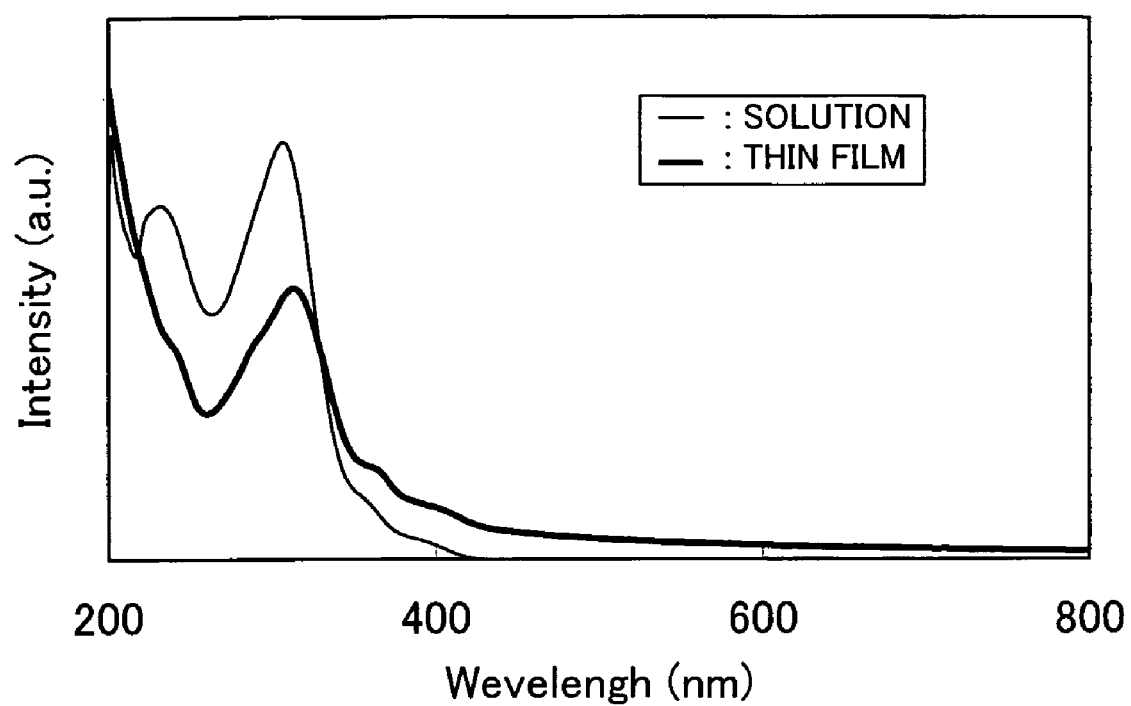
FIG. 25 shows UV-Vis absorption spectra of a carbazole derivative used in the present invention.

When fluorescence spectra of a thin film and a solution (solvent: dichloromethane) of the obtained PhCzP2 are measured, the obtained fluorescence spectra have a maximum peak at 429 nm with respect to an excitation wavelength (313 nm) in the case of the thin film and a maximum peak at 435 nm with respect to an excitation wavelength (315 nm) in the case of the solution (FIG. 24). In addition, when UV-Vis absorption spectra of the thin film and dichloromethane solution of the obtained PhCzP2 are measured, a maximum absorption wavelength of 313 nm is obtained in the case of the thin film and a maximum absorption wavelength of 305 nm is obtained in the case of the solution (FIG. 25).

Further, the values of a HOMO level and a LUMO level that are measured in the same way as in the above Embodiment 2 described above are −5.31 eV and −2.57 eV, respectively.

Embodiment 5

In this embodiment, an example of forming a layer containing 3,6-bis[N-(3-methylphenyl)-N-phenylamino]-9-phenylcarbazole (PhCzmP2) represented by the structural formula (75) which is synthesized in Embodiment 3 and molybdenum oxide which is a substance having an electron accepting property with respect to PhCzmP2 is described.

First, a glass substrate is fixed to a substrate holder in a vacuum evaporation apparatus. In addition, PhCzmP2 and molybdenum oxide (VI) are separately put into different resistance-heating evaporation sources, and a layer containing PhCzmP2 and molybdenum oxide is formed by co-evaporation in a vacuum state. At this time, the co-evaporation is performed so that a mass ratio of PhCzmP2 to molybdenum oxide is 4:1. Accordingly, a molar ratio of PhCzmP2 to molybdenum oxide is 1.0:1.1. In other words, a value of the molar ratio of molybdenum oxide to PhCzmP2, which is the carbazole derivative, is 1.1. Note that the film thickness is set to 100 nm.

Figure 26:
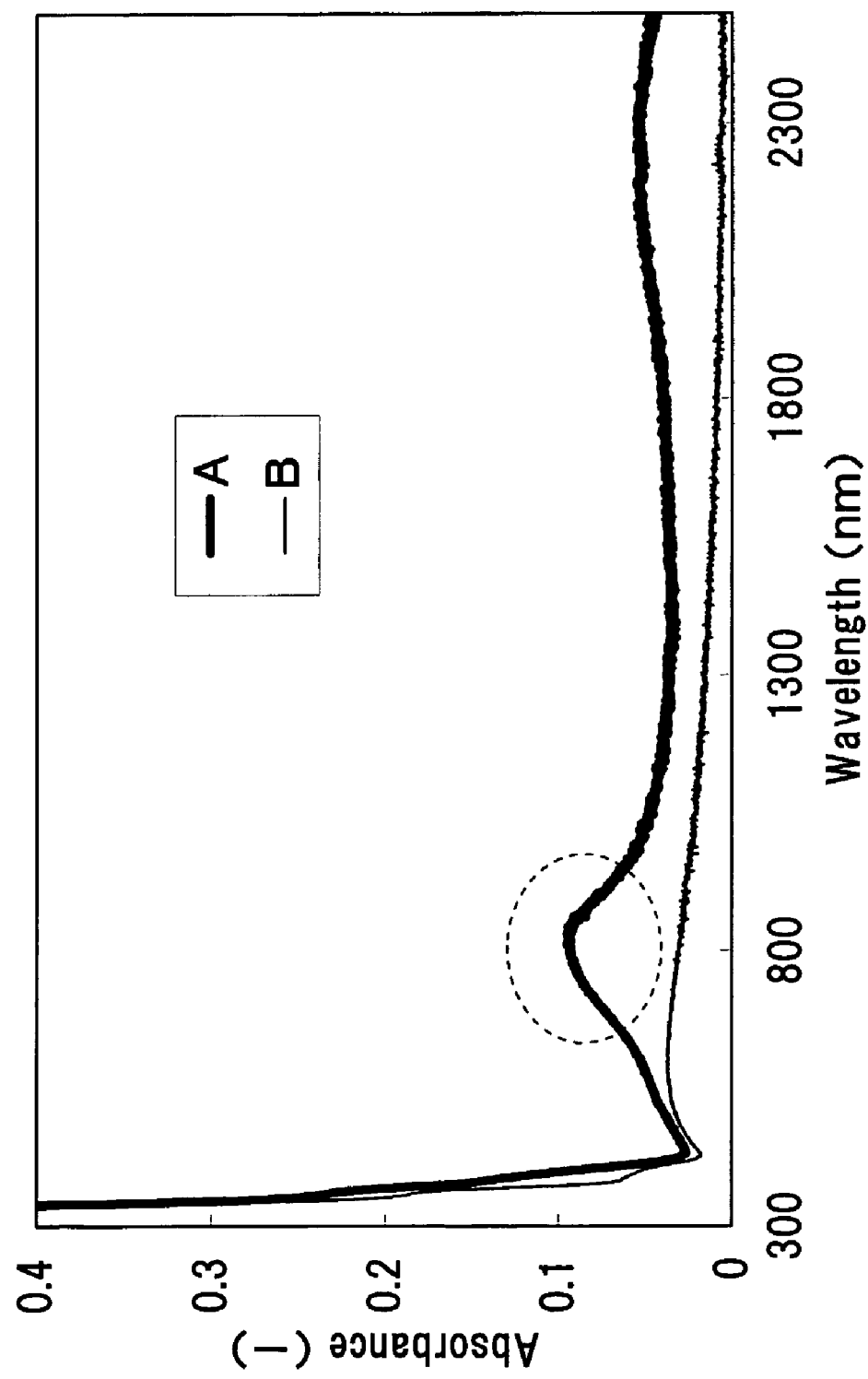
FIG. 26 compares an absorption spectrum of a mixed film of PhCzmP2 and molybdenum oxide with an absorption spectrum of a film containing only PhCzmP2.

Line A in FIG. 26 shows a measured absorption spectrum of a mixed film of PhCzmP2 and molybdenum oxide formed in such a manner. For comparison, an absorption spectrum of a film containing only PhCzmP2 (thickness of 90 nm) is shown by Line B in FIG. 26. Note that a longitudinal axis indicates absorbance, and a lateral axis indicates wavelength in FIG. 26.

As is seen from FIG. 26, new absorption, which could not seen in the case of the film of only PhCzmP2, can be observed in the case of the mixed film represented by the reference character A (a portion surrounded by a dashed line in FIG. 26). This is because electron transfer is performed between PhCzmP2 and molybdenum oxide, and it is supposed that electrons from PhCzmP2 are accepted by molybdenum oxide and holes are generated in PhCzmP2.

In the mixed film of PhCzmP2 and molybdenum oxide formed in this embodiment, carriers are generated intrinsically. Therefore, by employing the structure having the mixed film of PhCzmP2 and molybdenum oxide as a structure of a light emitting element, driving voltage of the light emitting element can be decreased.

Embodiment 6

In this embodiment, an example of forming a layer containing 3,6-bis(N,N-diphenylamino)-9-phenylcarbazole (Ph-CzP2) represented by the structural formula (76) which is synthesized in Embodiment 4 and molybdenum oxide which is a substance having an electron accepting property with respect to PhCzP2 is described.

First, a glass substrate is fixed to a substrate holder in a vacuum evaporation apparatus. In addition, PhCzP2 and molybdenum oxide (VI) are separately put into different resistance-heating evaporation sources, and a layer containing PhCzP2 and molybdenum oxide (a mixed film of PhCzP2 and molybdenum oxide) is formed by co-evaporation in a vacuum state. At this time, the co-evaporation is performed so that a mass ratio of PhCzP2 to molybdenum oxide is 4:1. Accordingly, a molar ratio of PhCzP2 to molybdenum oxide is 1.0:1.0. In other words, a value of the molar ratio of molybdenum oxide to PhCzP2, which is a carbazole derivative, is 1.0. Note that the film thickness is set to 80 nm.

Figure 27:
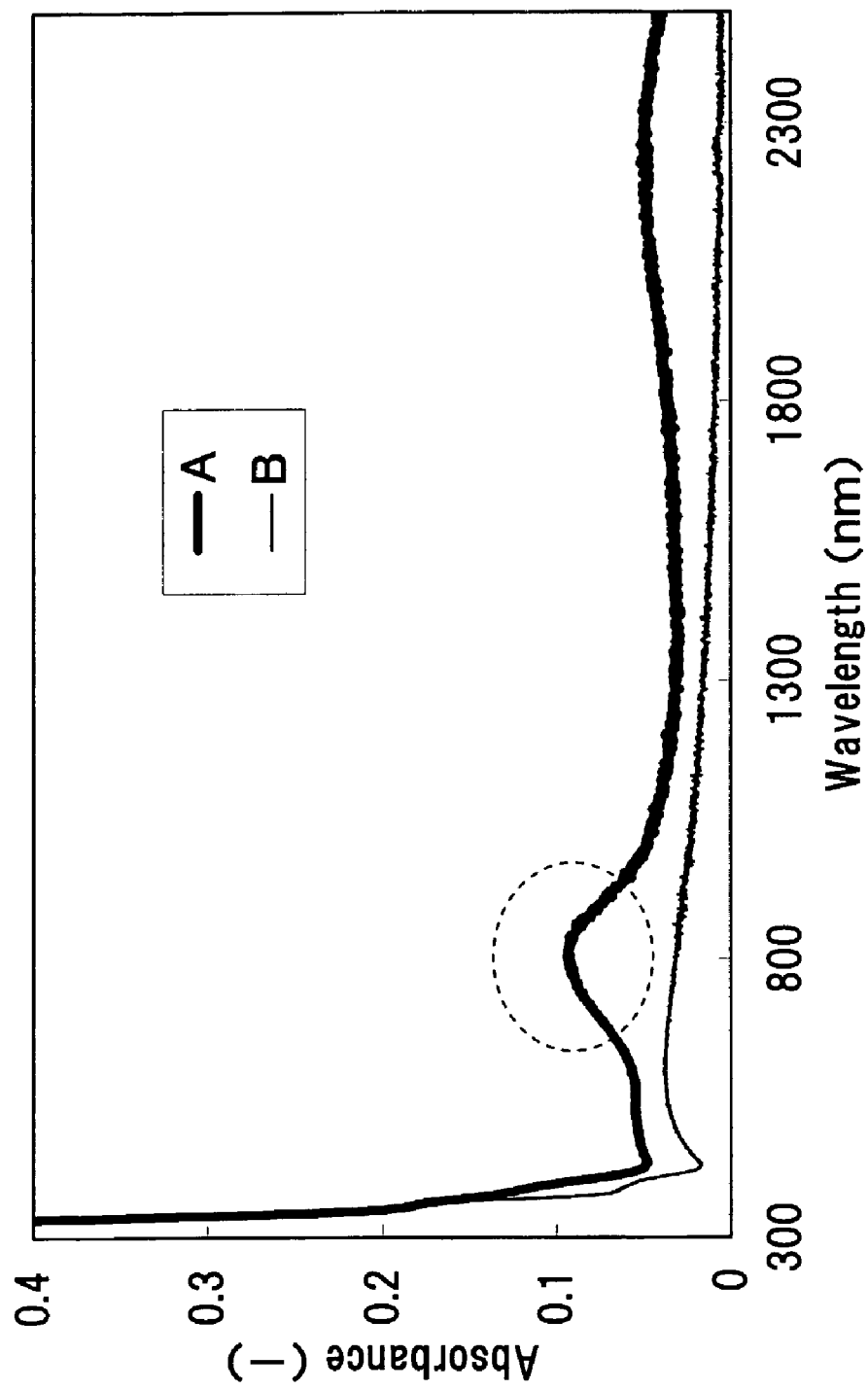
FIG. 27 compares an absorption spectrum of a mixed film of PhCzP2 and molybdenum oxide with an absorption spectrum of a film containing only PhCzP2.

Line A in FIG. 27 shows an measured absorption spectrum of a mixed film of PhCzP2 and molybdenum oxide formed in such a manner. For comparison, an absorption spectrum of a film containing only PhCzP2 (thickness of 90 nm) is shown by Line B in FIG. 27. Note that a longitudinal axis indicates absorbance, and a lateral axis indicates wavelength in FIG. 27.

As is seen from FIG. 27, new absorption, which could not seen in the case of the film of only PhCzP2, can be observed in the case of the mixed film represented by the Line A (a portion surrounded by a dashed line in FIG. 27). This is because electron transfer is performed between PhCzP2 and molybdenum oxide, and it is supposed that electrons from PhCzP2 are accepted by molybdenum oxide and holes are generated in PhCzP2.

In the mixed film of PhCzP2 and molybdenum oxide formed in this embodiment, carriers are generated intrinsically. Therefore, by employing the structure having the mixed film of PhCzP2 and molybdenum oxide as a structure of a light emitting element, driving voltage of the light emitting element can be decreased.

Embodiment 7

In this embodiment, an example of manufacturing a light emitting element using the layer, containing 3,6-bis[N-(3-methylphenyl)-N-phenylamino]-9-phenylcarbazole (PhCzmP2) represented by the structural formula (75) which is synthesized in Embodiment 3 and molybdenum oxide which is a substance having an electron accepting property with respect to PhCzmP2, as the first layer (hole generating layer) 111 in FIG. 1 is described.

First, indium tin oxide containing silicon oxide (ITSO) with a thickness of 110 nm is formed over a glass substrate as the first electrode 101. ITSO is formed by a sputtering method. A size of the first electrode 101 is 2 mm×2 mm. Next, as a pretreatment for forming a light emitting element over the first electrode 101 a surface of the substrate is washed with a porous resin (typically, made from PVA (polyvinyl alcohol), nylon, or the like), a heat treatment at a temperature of 200° C. is performed for one hour, and a UV ozone treatment is performed for 370 seconds.

Next, as the hole generating layer 111, the layer containing PhCzmP2 and molybdenum oxide (mixed film of PhCzmP2 and molybdenum oxide) is formed with a thickness of 40 nm. At this time, the layer containing PhCzmP2 and molybdenum oxide is formed by performing co-evaporation so that a mass ratio of PhCzmP2 to molybdenum oxide is 4:2. Therefore, a molar ratio of PhCzmP2 to molybdenum oxide is 1.0:2.1. In other words, a value of the molar ratio of molybdenum oxide to PhCzmP2, which is the carbazole derivative, is 2.1.

Subsequently, NPB with a thickness of 10 nm is formed as the hole transporting layer 112. Over these laminated films, a co-evaporated film of Alq$_3$ and coumarin 6 is formed with a thickness of 40 nm as the light emitting layer 113. At this time, the co-evaporated film of Alq$_3$ and coumarin 6 is formed by performing co-evaporation so that a mass ratio of Alq$_3$ to coumarin 6 is 1:0.01.

Further, as the electron transporting layer 114, Alq$_3$ is formed with a thickness of 10 nm. Then, a co-evaporated film of Alq$_3$ and Li with a thickness of 30 nm is formed as the electron generating layer 115. At this time, the co-evaporated film of Alq$_3$ and Li is formed by performing co-evaporation so that a mass ratio of Alq$_3$ to Li is 1:0.01. Lastly, Al with a thickness of 200 nm is formed as the second electrode 102 to complete the element. Note that the hole generating layer 111, the hole transporting layer 112, the light emitting layer 113, the electron transporting layer 114, the electron generating layer 115, and the second electrode 102 are all formed by a vacuum evaporation method using resistance heating.

Figure 28:
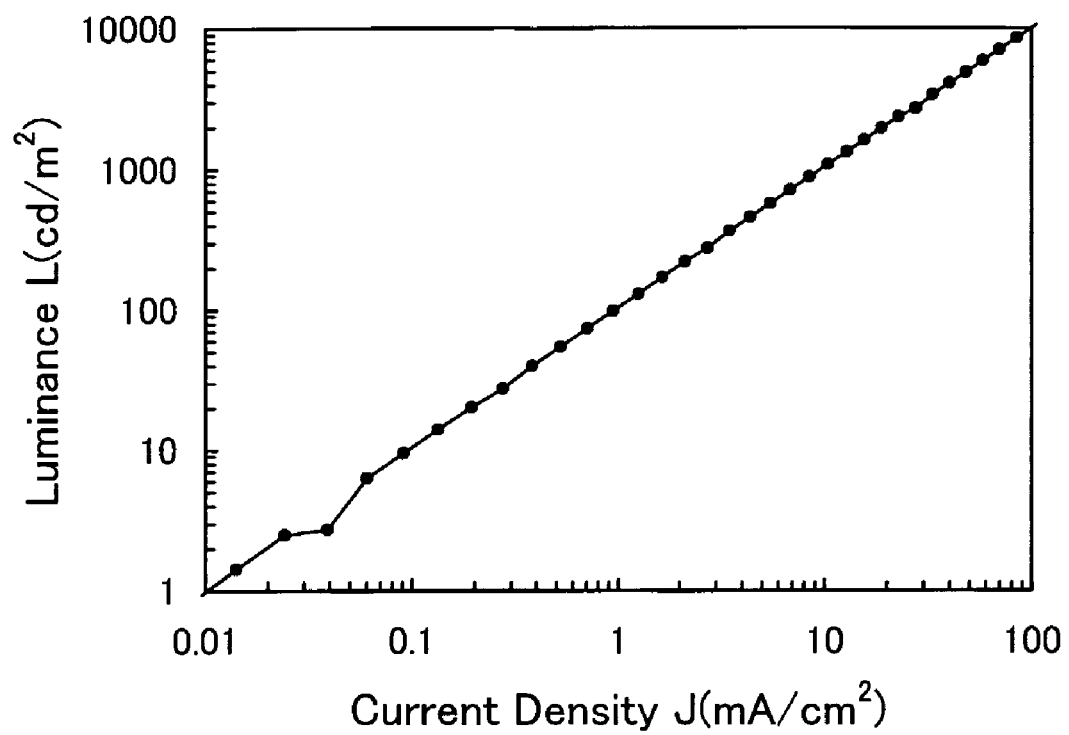
FIG. 28 shows the current density-luminance characteristics of an element described in Embodiment 7.
Figure 29:
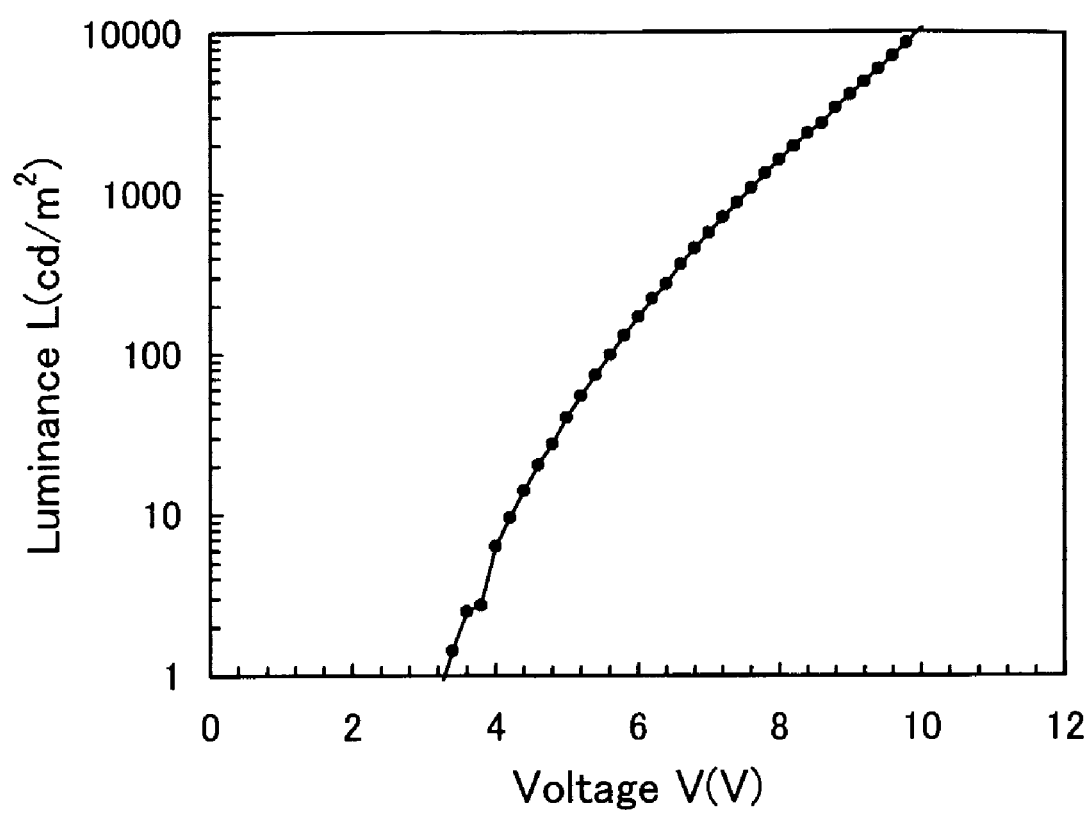
FIG. 29 shows the voltage-luminance characteristics of an element described in Embodiment 7.
Figure 30:
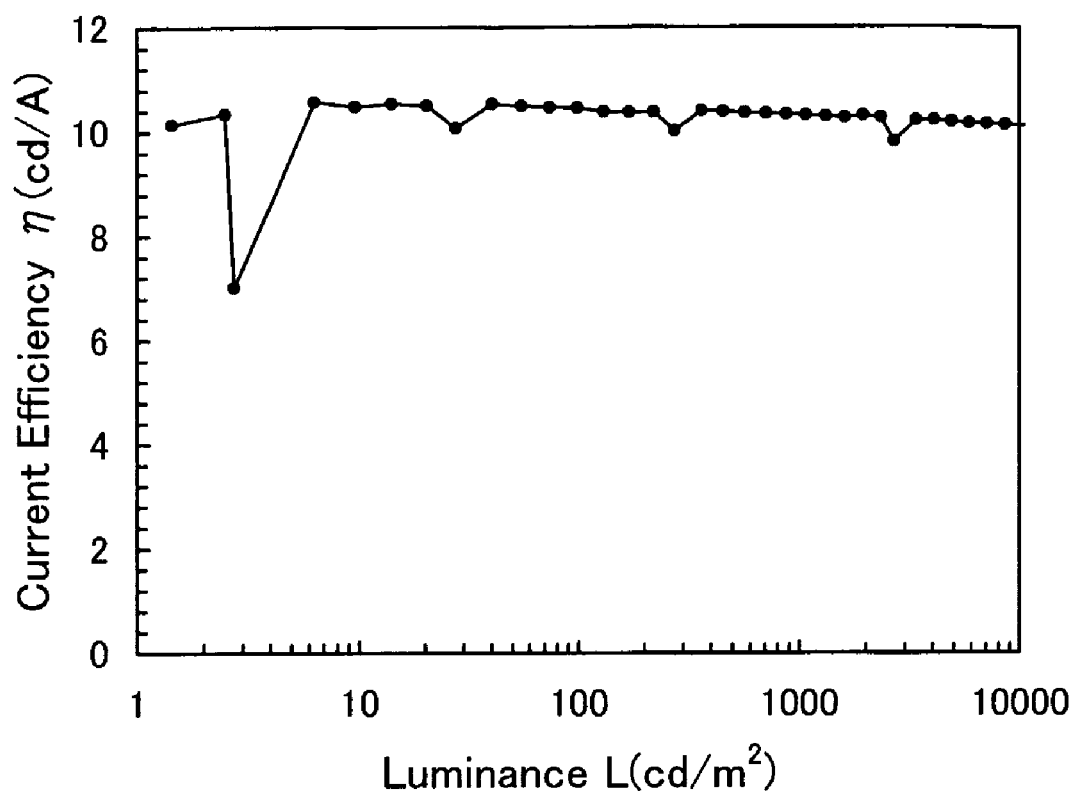
FIG. 30 shows the luminance-current efficiency characteristics of an element described in Embodiment 7.

When voltage of 7.6 V is applied between the first electrode 101 and the second electrode 102 of the light emitting element manufactured in the above manner, current flows with a current density of 10.5 mA/cm$^2$, and high luminance of 1100 cd/m$^2$ can be obtained. The light emission is green light emission derived from coumarin 6. In addition, FIG. 28 shows the current density-luminance characteristics, FIG. 29 shows the voltage-luminance characteristics, and FIG. 30 shows the luminance-current efficiency characteristics of the light emitting element of the embodiment. In FIG. 28, a longitudinal axis indicates luminance L, and a lateral axis indicates current density J. In FIG. 29, a longitudinal axis indicates luminance L, and a lateral axis indicates voltage V. In FIG. 30, a longitudinal axis indicates current efficiency η, and a lateral axis indicates luminance L. These outcomes show that the light emitting element of the present embodiment has favorable characteristics.

Embodiment 8

In this embodiment, an example of manufacturing a light emitting element using the layer, containing 3,6-bis[N-(3-methylphenyl)-N-phenylamino]-9-phenylcarbazole (PhCzmP2) represented by the structural formula (75) which is synthesized in Embodiment 3 and molybdenum oxide which is a substance having an electron accepting property with respect to PhCzmP2, as the third layer 211 and the hole generating layer 224 in FIG. 2 is described.

First, ITSO with a thickness of 110 nm is formed over a glass substrate as the first electrode 201. ITSO is formed by a sputtering method. A size of the first electrode 201 is 2 mm×2 mm. Next, as a pretreatment for forming a light emitting element over the first electrode 201, a surface of the substrate is washed with a porous resin (typically, made from PVA (polyvinyl alcohol), nylon, or the like), a heat treatment at a temperature of 200° C. is performed for one hour, and a UV ozone treatment is performed for 370 seconds.

Next, as the hole generating layer 224, the layer containing PhCzmP2 and molybdenum oxide (mixed film of PhCzmP2 and molybdenum oxide) is formed with a thickness of 40 nm. At this time, the layer containing PhCzmP2 and molybdenum oxide is formed by performing co-evaporation so that a mass ratio of PhCzmP2 to molybdenum oxide is 4:2. Therefore, a molar ratio of PhCzmP2 to molybdenum oxide is 1.0:2.1. In other words, a value of the molar ratio of molybdenum oxide to PhCzmP2, which is the carbazole derivative, is 2.1.

Subsequently, NPB with a thickness of 10 nm is formed as the hole transporting layer 223. Over these laminated films, a co-evaporated film of Alq$_3$ and coumarin 6 is formed with a thickness of 40 nm as the light emitting layer 222. At this time, the co-evaporated film of Alq$_3$ and coumarin 6 is formed by performing co-evaporation so that a mass ratio of Alq$_3$ to coumarin 6 is 1:0.01.

Further, as the electron transporting layer 221, Alq$_3$ is formed with a thickness of 10 nm. In this way, the first layer 213 including the hole generating layer 224, the hole transporting layer 223, the light emitting layer 222, and the electron transporting layer 221 is formed over the first electrode 201.

Then, a co-evaporated film of Alq$_3$ and Li with a thickness of 30 nm is formed over the electron transporting layer 221 as the second layer 212 generating electrons. At this time, the co-evaporated film of Alq$_3$ and Li is formed by performing co-evaporation so that a mass ratio of Alq$_3$ to Li is 1:0.01. Subsequently, as the third layer 211 generating holes, the layer containing PhCzmP2 and molybdenum oxide (mixed film of PhCzmP2 and molybdenum oxide) is formed with a thickness of 20 nm. At this time, the layer containing PhCzmP2 and molybdenum oxide is formed by performing co-evaporation so that a mass ratio of PhCzmP2 to molybdenum oxide is 4:2. Therefore, a molar ratio of PhCzmP2 to molybdenum oxide is 1.0:2.1. In other words, a value of the molar ratio of molybdenum oxide to PhCzmP2, which is the carbazole derivative, is 2.1.

Lastly, Al with a thickness of 200 nm is formed as the second electrode 202 to complete the element. Note that the hole generating layer 224, the hole transporting layer 223, the light emitting layer 222, the electron transporting layer 221, the second layer 212, the third layer 211, and the second electrode 102 are all formed by a vacuum evaporation method using resistance heating.

When voltage is applied between the first electrode 201 and the second electrode 202 of the light emitting element manufactured in the above manner, light emission of green color derived from coumarin 6 can be obtained, and it is confirmed that the light emitting element functioned favorably.

The invention claimed is:

1. A light emitting element comprising:
   a first electrode;
   a second electrode; and
   a plurality of layers located between the first electrode and the second electrode,
   wherein the plurality of layers comprises:
      a first layer comprising a light emitting substance; and
      a second layer for transporting a hole,
   wherein the second layer comprises:
      a carbazole derivative represented by General Formula (1); and
      a metal oxide, and

[Chemical Formula 1]

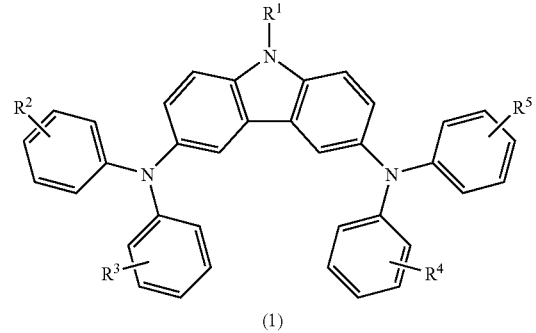

(1)

wherein in the formula, R$^1$ refers to hydrogen, halogen, a cyano group, an alkyl group having a carbon number of 1 to 20, a haloalkyl group having a carbon number of 1 to 20, an alkoxyl group having a carbon number of 1 to 20, a substituted or unsubstituted aryl group, or a substituted or unsubstituted heterocycle residue, and R$^2$ to R$^5$ is the same or different material and refer to hydrogen, halogen, a cyano group, an alkyl group having a carbon number of 1 to 20, an alkoxyl group having a carbon number of 1 to 20, an acyl group having a carbon number of 1 to 20, a haloalkyl group having a carbon number of 1 to 20, a dialkylamino group having a carbon number of 1 to 20, a diarylamino group having a carbon number of 1 to 20, a substituted or unsubstituted heterocycle residue, or a carbazolyl group.

2. A light emitting element comprising:
a first electrode;
a second electrode; and
a plurality of layers located between the first electrode and the second electrode,
wherein light emission is performed when voltage is applied so that a potential of the first electrode is higher than that of the second electrode,
wherein the plurality of layers comprises:
  a first layer comprising a light emitting substance; and
  a second layer which is in contact with the second electrode and is located between the second electrode and the first layer,
wherein the second layer comprises:
  a carbazole derivative represented by General Formula (1); and
  a metal oxide, and

[Chemical Formula 1]

wherein in the formula, $R^1$ refers to hydrogen, halogen, a cyano group, an alkyl group having a carbon number of 1 to 20, a haloalkyl group having a carbon number of 1 to 20, an alkoxyl group having a carbon number of 1 to 20, a substituted or unsubstituted aryl group, or a substituted or unsubstituted heterocycle residue, and $R^2$ to $R^5$ is the same or different material and refer to hydrogen, halogen, a cyano group, an alkyl group having a carbon number of 1 to 20, an alkoxyl group having a carbon number of 1 to 20, an acyl group having a carbon number of 1 to 20, a haloalkyl group having a carbon number of 1 to 20, a dialkylamino group having a carbon number of 1 to 20, a diarylamino group having a carbon number of 1 to 20, a substituted or unsubstituted heterocycle residue, or a carbazolyl group.

3. A light emitting element comprising:
a first electrode;
a second electrode; and
a plurality of layers located between the first electrode and the second electrode,
wherein light emission is performed when a potential of the first electrode is higher than that of the second electrode,
wherein the plurality of layers comprises:
  a first layer comprising a light emitting substance;
  a second layer located between the first electrode and the first layer, and
  a third layer which is in contact with the second electrode and is located between the second electrode and the first layer,
wherein both of the second layer and the third layer comprise:
  a carbazole derivative represented by General Formula (1); and
  a metal oxide, and

[Chemical Formula 1]

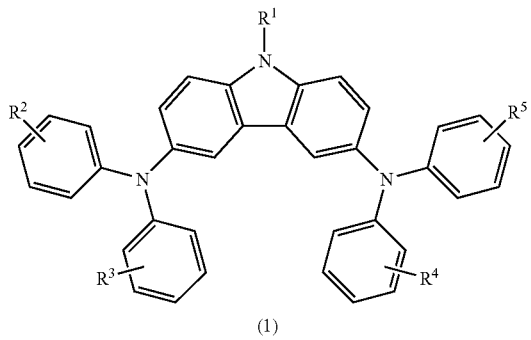

(1)

wherein in the formula, $R^1$ refers to hydrogen, halogen, a cyano group, an alkyl group having a carbon number of 1 to 20, a haloalkyl group having a carbon number of 1 to 20, an alkoxyl group having a carbon number of 1 to 20, a substituted or unsubstituted aryl group, or a substituted or unsubstituted heterocycle residue, and $R^2$ to $R^5$ is the same or different material and refer to hydrogen, halogen, a cyano group, an alkyl group having a carbon number of 1 to 20, an alkoxyl group having a carbon number of 1 to 20, an acyl group having a carbon number of 1 to 20, a haloalkyl group having a carbon number of 1 to 20, a dialkylamino group having a carbon number of 1 to 20, a diarylamino group having a carbon number of 1 to 20, a substituted or unsubstituted heterocycle residue, or a carbazolyl group.

4. A light emitting element comprising:
a first electrode;
a second electrode; and
a plurality of layers located between the first electrode and the second electrode,
wherein the plurality of layers comprises:
  a first layer comprising a light emitting substance; and
  a second layer for transporting a hole,
wherein the second layer comprises:
  a carbazole derivative represented by General Formula (1); and
  a substance for accepting an electron from the carbazole derivative, and

[Chemical Formula 1]

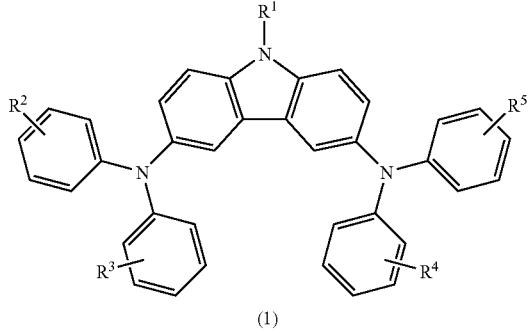

(1)

wherein in the formula, $R^1$ refers to hydrogen, halogen, a cyano group, an alkyl group having a carbon number of 1 to 20, a haloalkyl group having a carbon number of 1 to 20, an alkoxyl group having a carbon number of 1 to 20, a substituted or unsubstituted aryl group, or a substituted or unsubstituted heterocycle residue, and $R^2$ to $R^5$ is the same or different material and refer to hydrogen, halogen, a cyano group, an alkyl group having a carbon number of 1 to 20, an alkoxyl group having a carbon number of 1 to 20, an acyl group having a carbon number of 1 to 20, a haloalkyl group having a carbon number of 1 to 20, a dialkylamino group having a carbon number of 1 to 20, a diarylamino group having a carbon number of 1 to 20, a substituted or unsubstituted heterocycle residue, or a carbazolyl group.

5. A light emitting element comprising:
a first electrode;
a second electrode; and
a plurality of layers located between the first electrode and the second electrode,
wherein light emission is performed when voltage is applied so that a potential of the first electrode is higher than that of the second electrode,
wherein the plurality of layers comprises:
   a first layer comprising a light emitting substance; and
   a second layer which is in contact with the second electrode and is located between the second electrode and the first layer,
wherein the second layer comprises:
   a carbazole derivative represented by General Formula (1); and
   a substance for accepting an electron from the carbazole derivative, and

[Chemical Formula 1]

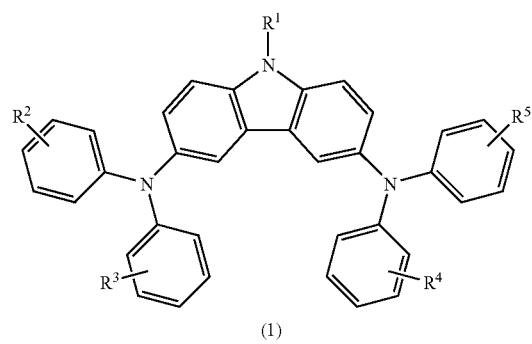

(1)

wherein in the formula, $R^1$ refers to hydrogen, halogen, a cyano group, an alkyl group having a carbon number of 1 to 20, a haloalkyl group having a carbon number of 1 to 20, an alkoxyl group having a carbon number of 1 to 20, a substituted or unsubstituted aryl group, or a substituted or unsubstituted heterocycle residue, and $R^2$ to $R^5$ is the same or different material and refer to hydrogen, halogen, a cyano group, an alkyl group having a carbon number of 1 to 20, an alkoxyl group having a carbon number of 1 to 20, an acyl group having a carbon number of 1 to 20, a haloalkyl group having a carbon number of 1 to 20, a dialkylamino group having a carbon number of 1 to 20, a diarylamino group having a carbon number of 1 to 20, a substituted or unsubstituted heterocycle residue, or a carbazolyl group.

6. A light emitting element comprising:
a first electrode;
a second electrode; and
a plurality of layers located between the first electrode and the second electrode,
wherein light emission is performed when a potential of the first electrode is higher than that of the second electrode,
wherein the plurality of layers comprises:
   a first layer comprising a light emitting substance;
   a second layer located between the first electrode and the first layer, and
   a third layer which is in contact with the second electrode and is located between the second electrode and the first layer,
wherein both of the second layer and the third layer comprise:
   a carbazole derivative represented by General Formula (1); and
   a substance for accepting an electron from the carbazole derivative, and

[Chemical Formula 1]

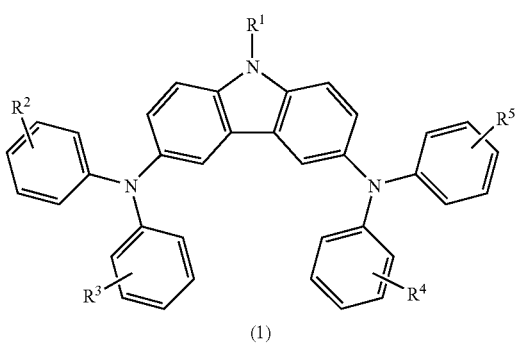

(1)

wherein in the formula, $R^1$ refers to hydrogen, halogen, a cyano group, an alkyl group having a carbon number of 1 to 20, a haloalkyl group having a carbon number of 1 to 20, an alkoxyl group having a carbon number of 1 to 20, a substituted or unsubstituted aryl group, or a substituted or unsubstituted heterocycle residue, and $R^2$ to $R^5$ is the same or different material and refer to hydrogen, halogen, a cyano group, an alkyl group having a carbon number of 1 to 20, an alkoxyl group having a carbon number of 1 to 20, an acyl group having a carbon number of 1 to 20, a haloalkyl group having a carbon number of 1 to 20, a dialkylamino group having a carbon number of 1 to 20, a diarylamino group having a carbon number of 1 to 20, a substituted or unsubstituted heterocycle residue, or a carbazolyl group.

7. The light emitting element according to any one of claims 1, 2, and 3, wherein the metal oxide is one or a plurality of oxides of any transition metal of Group 4 to Group 12 in the periodic table.

8. The light emitting element according to any one of claims 1, 2, and 3, wherein the metal oxide is one or a plurality of oxides of any transition metal of Group 4 to Group 8 in the periodic table.

9. The light emitting element according to any one of claims 1, 2, and 3, wherein the metal oxide is one or a plurality of oxides selected from the group consisting of molybdenum oxide ($MoO_x$), vanadium oxide ($VO_x$), ruthenium oxide ($RuO_x$), tungsten oxide ($WO_x$), rhenium oxide ($ReO_x$), titanium oxide ($TiO_x$), chromium oxide ($CrO_x$), zirconium oxide ($ZrO_x$), hafnium oxide ($HfO_x$), and tantalum oxide ($TaO_x$).

10. A light emitting device, comprising the light emitting element according to any one of claims 1, 2, 3, 4, 5, and 6 as a pixel or a light source.

11. An electronic device, comprising the light emitting device according to claim 10.

* * * * *